(12) United States Patent
Chen et al.

(10) Patent No.: US 11,164,839 B2
(45) Date of Patent: Nov. 2, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Wei-Chih Chen, Taipei (TW); Hung-Jui Kuo, Hsinchu (TW); Yu-Hsiang Hu, Hsinchu (TW); Sih-Hao Liao, New Taipei (TW); Po-Han Wang, Hsinchu (TW); Yung-Chi Chu, Kaohsiung (TW); Hung-Chun Cho, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 16/413,591

(22) Filed: May 15, 2019

(65) Prior Publication Data

US 2020/0083189 A1 Mar. 12, 2020

Related U.S. Application Data

(60) Provisional application No. 62/729,428, filed on Sep. 11, 2018.

(51) Int. Cl.
*H01L 23/00* (2006.01)
*H01L 23/31* (2006.01)
*H01L 23/498* (2006.01)
*H01L 23/538* (2006.01)
*H01L 21/48* (2006.01)
(Continued)

(52) U.S. Cl.
CPC ............ *H01L 24/24* (2013.01); *C09J 165/00* (2013.01); *H01L 21/486* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/49816* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 25/0655* (2013.01); *H01L 25/50* (2013.01); *H01L 2221/68345* (2013.01); *H01L 2221/68359* (2013.01); *H01L 2224/215* (2013.01);
(Continued)

(58) Field of Classification Search
None
See application file for complete search history.

(56) References Cited

U.S. PATENT DOCUMENTS 8,987,922 B2 3/2015 Yu et al.
9,000,584 B2 4/2015 Lin et al.
(Continued)

*Primary Examiner* — Nicholas J Tobergte
*Assistant Examiner* — Kien C Ly
(74) *Attorney, Agent, or Firm* — JCIPRNET

(57) ABSTRACT

A package structure includes a semiconductor die and a redistribution circuit structure. The redistribution circuit structure is disposed on and electrically connected to the semiconductor die and includes a patterned conductive layer, a dielectric layer, and an inter-layer film. The dielectric layer is disposed on the patterned conductive layer. The inter-layer film is sandwiched between the dielectric layer and the patterned conductive layer, and the patterned conductive layer is separated from the dielectric layer through the inter-layer film.

20 Claims, 50 Drawing Sheets

(51) Int. Cl.
*H01L 21/56* (2006.01)
*H01L 25/00* (2006.01)
*H01L 25/065* (2006.01)
*H01L 21/683* (2006.01)
*C09J 165/00* (2006.01)

(52) U.S. Cl.
CPC ............... *H01L 2224/24137* (2013.01); *H01L 2924/0538* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,103,107 B1 * | 10/2018 | Lu ........................... H01L 24/03 |
| 2016/0276235 A1 * | 9/2016 | Chen ....................... H01L 24/13 |
| 2017/0148778 A1 * | 5/2017 | Hou .................. H01L 21/76802 |

\* cited by examiner

PACKAGE STRUCTURE AND METHOD OF MANUFACTURING THE SAME

CROSS-REFERENCE TO RELATED APPLICATION

This application claims the priority benefit of U.S. provisional application Ser. No. 62/729,428, filed on Sep. 11, 2018. The entirety of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging (e.g. formation of redistribution circuit structure/layer). In addition, such packages may further be integrated to a semiconductor substrate or carrier after dicing.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
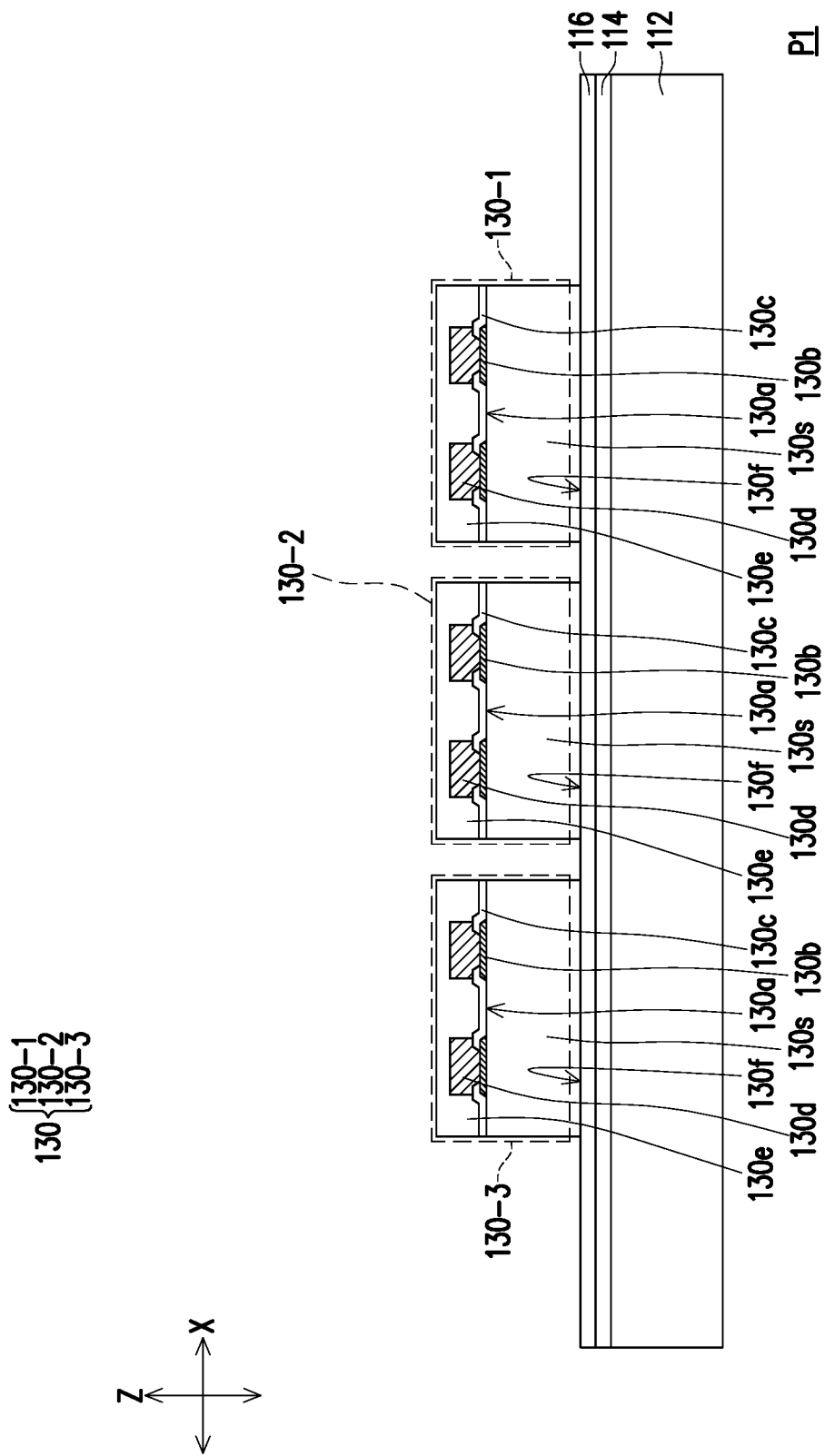
FIG. 1 to FIG. 15 are schematic cross sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 16:
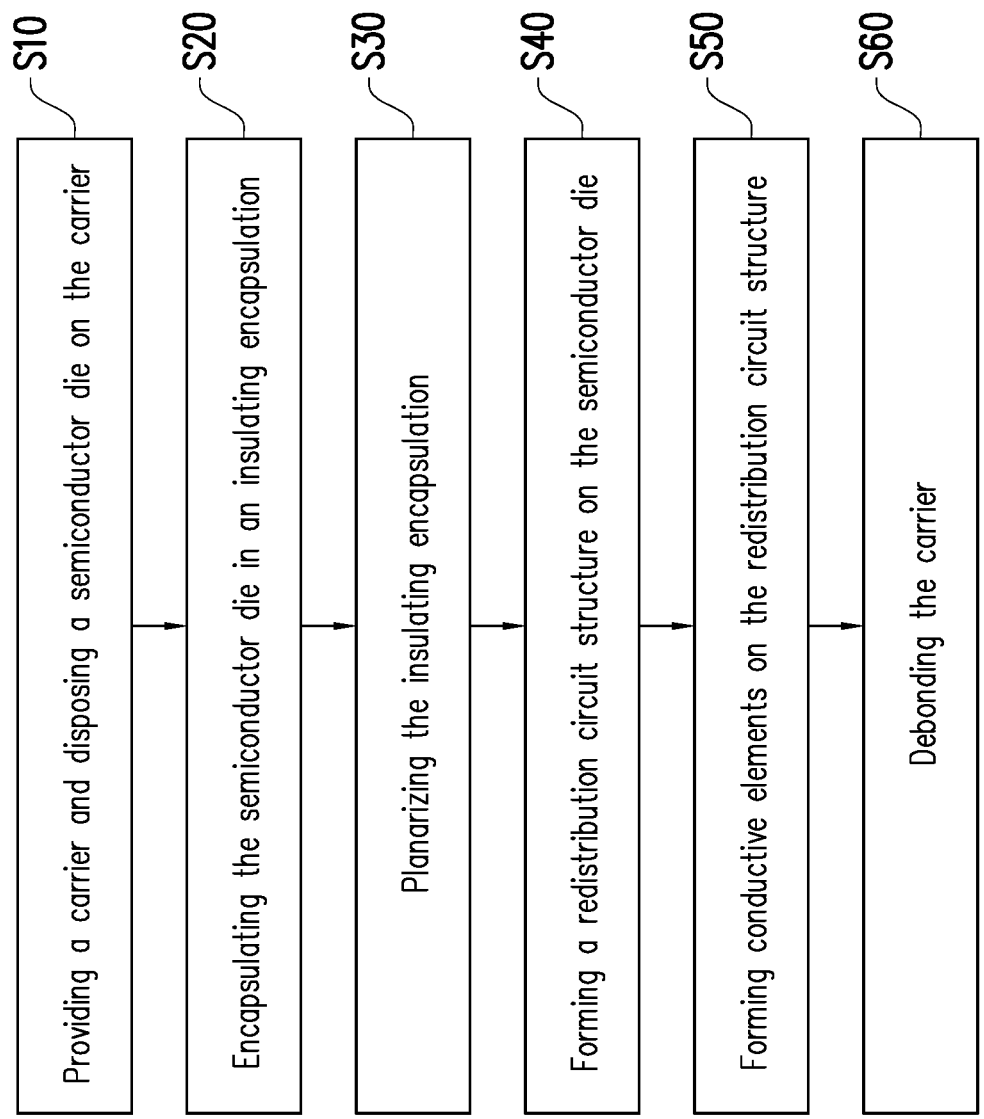
FIG. 16 is a flow chart illustrating a method of manufacturing a package structure in accordance with some embodiments of the disclosure.
Figure 17:
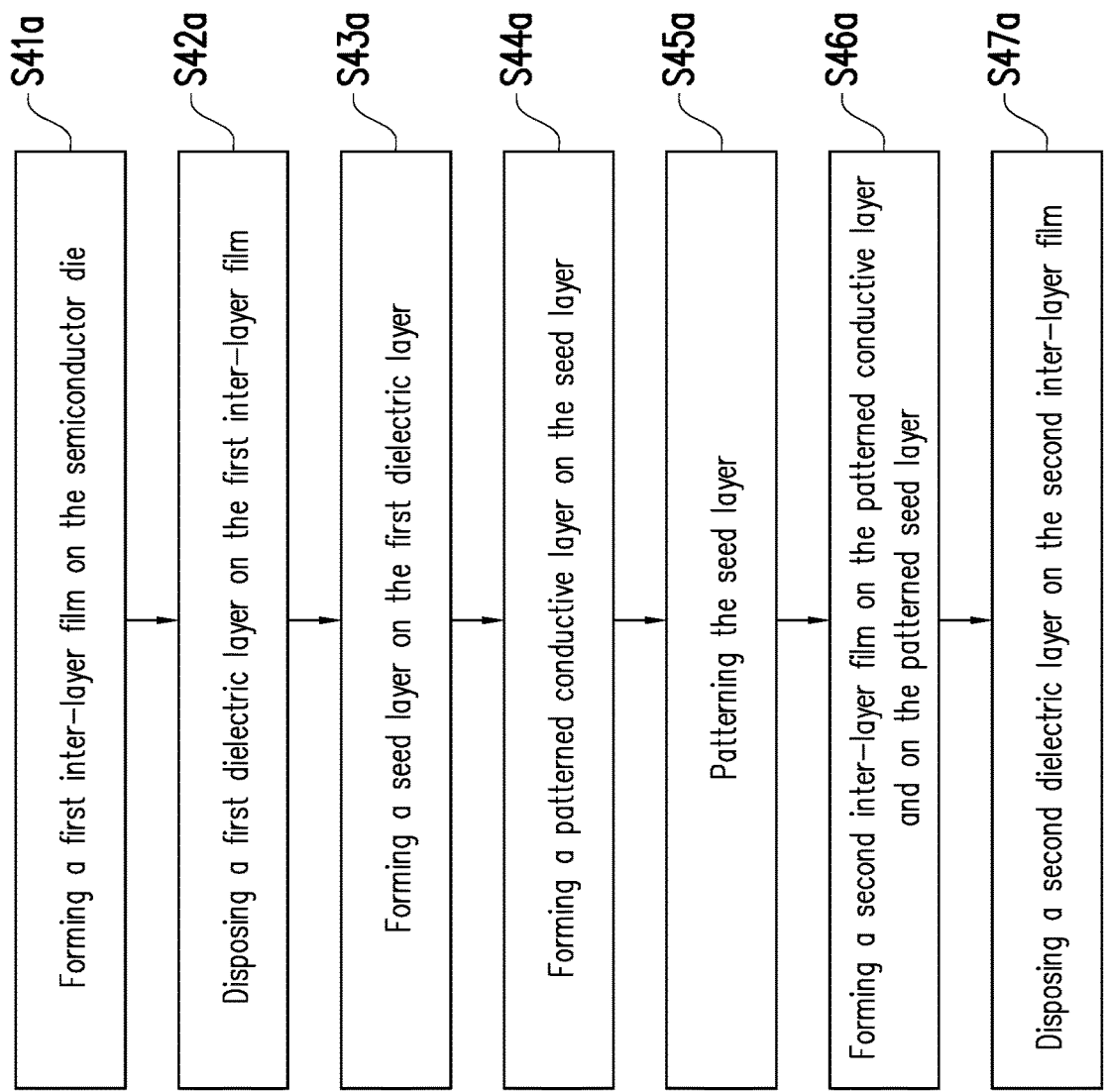
FIG. 17 and FIG. 18 are flow charts illustrating a method of manufacturing a redistribution circuit structure/layer of a package structure in accordance with some embodiments of the disclosure.
Figure 18:
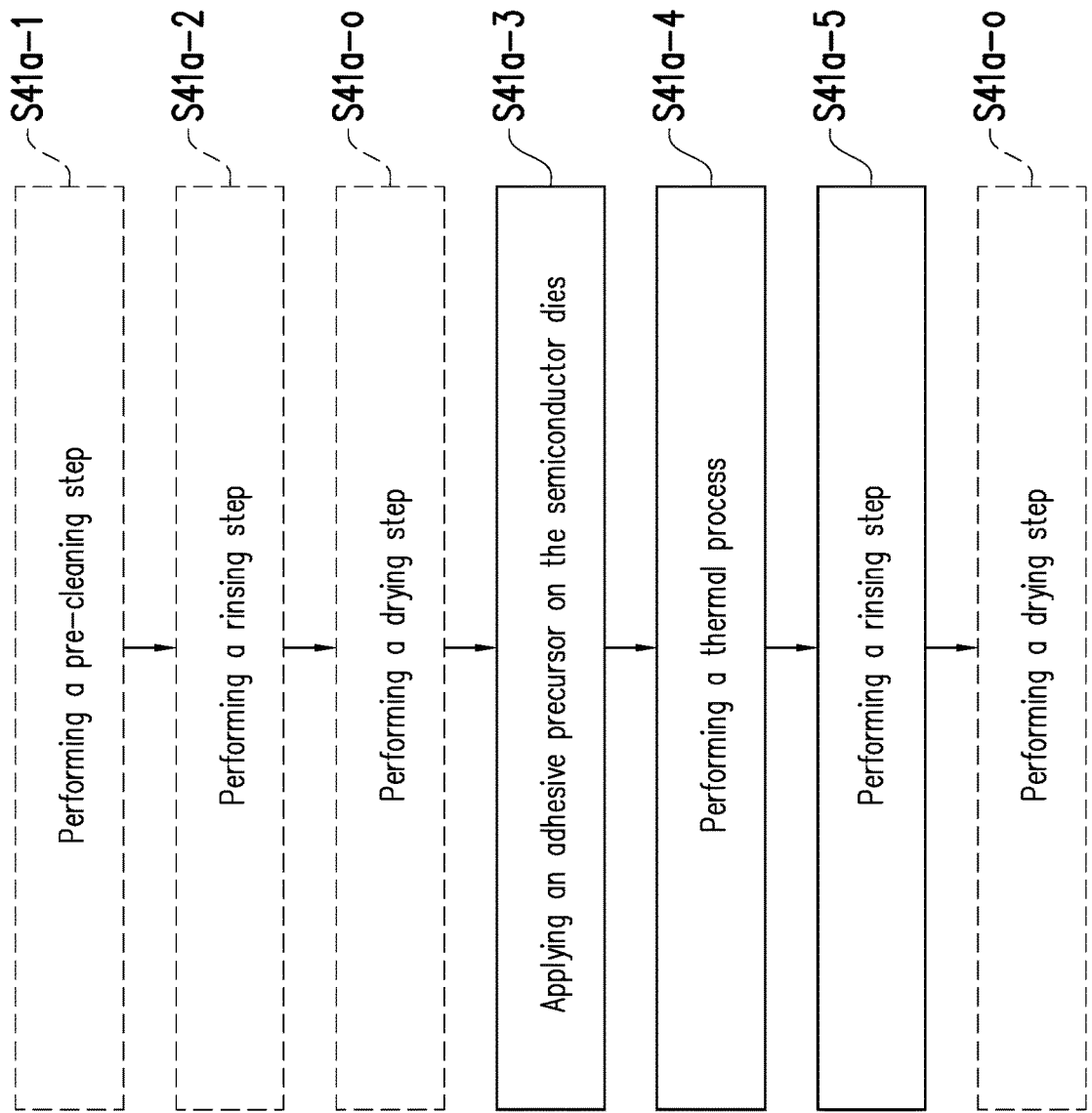

FIG. 1 to FIG. 15 are schematic cross sectional views of various stages in a manufacturing method of a package structure in accordance with some embodiments of the disclosure. FIG. 16 is a flow chart illustrating a method of manufacturing a package structure in accordance with some embodiments of the disclosure. FIG. 17 and FIG. 18 are flow charts illustrating a method of manufacturing a redistribution circuit structure/layer of a package structure in accordance with some embodiments of the disclosure, where the methods of FIG. 17 and FIG. 18 may be, but not limited to, implemented in the method of FIG. 16. In some embodiments, the manufacturing method is part of a packaging process. In FIG. 1 to FIG. 15, one (semiconductor) chip or die is shown to represent plural (semiconductor) chips or dies of the wafer, and one (semiconductor) package structure are shown to represent plural (semiconductor) package structures obtained following the (semiconductor) manufacturing method, the disclosure is not limited thereto.

In some embodiments, a carrier is provided, in accordance with step S10 of FIG. 16. Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g. the buffer layer 116) or any wafer(s) disposed thereon (e.g. the carrier 112). In some embodiments, the debond layer 114 may include a release layer (such as a light-to-heat conversion ("LTHC") layer) or an adhesive layer (such as an ultra-violet curable adhesive or a heat curable adhesive layer).

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto buildup film (ABF), solder resist film (SR), or the like. The top surface of the buffer layer 116 may be levelled and may have a high degree of coplanarity.

For example, the debond layer 114 and the buffer layer 116 may be formed by a suitable fabrication technique such as spin-coating, lamination, deposition, or the like. The disclosure is not specifically limited thereto.

In some embodiments, a semiconductor die is disposed on the carrier 112, in accordance with step S10 of FIG. 16. In some embodiments, at least one semiconductor die 130 is provided. As shown in FIG. 1, for example, the at least one semiconductor die 130 includes a plurality of semiconductor dies, such as a semiconductor die 130-1, a semiconductor die 130-2, and a semiconductor die 130-3. In some embodiments, the semiconductor die 130-1, the semiconductor die 130-2, and the semiconductor die 130-3 are picked and placed over the carrier 112 and disposed on the buffer layer 116. For example, as shown in FIG. 1, the semiconductor dies 130-1, 130-2, 130-3 are arranged aside to each other along a direction X, and the direction X is perpendicular to a stacking direction Z of the carrier 112, the debond layer 114, the buffer layer 116, the semiconductor die 130-1, the semiconductor die 130-2, and the semiconductor die 130-3. As shown in FIG. 1, only three semiconductor dies 130 (e.g., the semiconductor die 130-1, the semiconductor die 130-2, and the semiconductor die 130-3) are presented for illustrative purposes, however, it should be noted that the number of the semiconductor die 130 may be one or more than one, the disclosure is not limited thereto.

In some embodiments, the semiconductor die 130-1, the semiconductor die 130-2, and the semiconductor die 130-3 each include a semiconductor substrate 130s having an active surface 130a and a backside surface 130f opposite to the active surface 130a, a plurality of pads 130b distributed on the active surface 130a, a passivation layer 130c covering the active surface 130a and a portion of the pads 130b, a plurality of conductive vias 130d connecting to the pads 130b exposing by the passivation layer 130c, and a protection layer 130e disposed on the conductive vias 130d. The pads 130b, the passivation layer 130c, the conductive vias 130d, and the protection layer 130e are formed on the semiconductor substrate 130s. The pads 130b are partially exposed by the passivation layer 130c, the conductive vias 130d are respectively disposed on and electrically connected to the pads 130b, and the protection layer 130e covers the passivation layer 130c exposed by the conductive vias 130d and the conductive vias 130d.

However, the disclosure may not be limited thereto. For example, the conductive vias 130d and the protection layer 130e may be omitted. In an alternative embodiment, the semiconductor die 130-1, the semiconductor die 130-2, and the semiconductor die 130-3 each may include the semiconductor substrate 130s having the active surface 130a and the backside surface 130f opposite to the active surface 130a, the plurality of pads 130b distributed on the active surface 130a, and the passivation layer 130c covering the active surface 130a and a portion of the pads 130b.

The material of the semiconductor substrate 130s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 130s may further include an interconnection structure (not shown) disposed on the active surface 130a. In certain embodiments, the interconnection structure may include one or more inter-dielectric layers and one or more patterned conductive layers stacked alternately for providing routing function to the active components and the passive components embedded in the semiconductor substrate 130s, where the pads 130b may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 130b are aluminum pads or other suitable metal pads, for example. The conductive vias 130d are copper pillars, copper alloy pillar or other suitable metal pillars containing copper metal, for example. In some embodiments, the passivation layer 130c and the protection layer 130e may be a polybenzoxazole (PBO) layer, a polyimide (PI) layer or other suitable polymers. In some alternative embodiments, the passivation layer 130c and the protection layer 130e may be made of inorganic materials, such as silicon oxide, silicon nitride, silicon oxynitride, or any suitable dielectric material. The material of the passivation layer 130c can be the same or different from the material of the protection layer 130e, for example.

It is noted that, at least one semiconductor die 130 (e.g. the semiconductor die 130-1, the semiconductor die 130-2, and the semiconductor die 130-3) described herein may be referred as a semiconductor chip or an integrated circuit (IC). In an alternative embodiment, the semiconductor die 130-1, the semiconductor die 130-2, and the semiconductor die 130-3 described herein may be semiconductor devices. In certain embodiments, the semiconductor die 130-1, the semiconductor die 130-2, and the semiconductor die 130-3 may include one or more digital chips, analog chips or mixed signal chips, such as application-specific integrated circuit ("ASIC") chips, sensor chips, wireless and radio frequency (RF) chips, memory chips, logic chips or voltage regulator chips.

In certain embodiments, at least one semiconductor die described herein, except for the semiconductor die 130-1, the semiconductor die 130-2, and the semiconductor die 130-3, may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto.

In the disclosure, it should be appreciated that the illustration of the semiconductor die 130-1, the semiconductor die 130-2, and the semiconductor die 130-3 and other components throughout all figures is schematic and is not in scale. In one embodiment, the semiconductor die 130-1, the semiconductor die 130-2, and the semiconductor die 130-3 may be the same. In an alternative embodiment, the semiconductor die 130-1, the semiconductor die 130-2, and the semiconductor die 130-3 may be different from each other.

Continued on FIG. 1, in some embodiments, the semiconductor dies 130 (e.g. the semiconductor die 130-1, the semiconductor die 130-2, and the semiconductor die 130-3) are directly disposed on the buffer layer 116, where the backside surface 130f of each of the semiconductor die 130-1, the semiconductor die 130-2, and the semiconductor die 130-3 are in physical contact with the buffer layer. However, the disclosure is not limited thereto.

In alternative embodiments, the buffer layer 116 may be optionally omitted from the debond layer 114, where each of the semiconductor dies 130 (e.g. the semiconductor die 130-1, the semiconductor die 130-2, and the semiconductor die 130-3) is then disposed on the debond layer 114 through a connecting film (not shown). In some embodiments, a first connecting film is located between the semiconductor die 130-1 and the debond layer 114, and two opposite sides of the first connecting film physically contacts the backside surface 130f of the semiconductor die 130-1 and the debond layer 114. In some embodiments, a second connecting film is located between the semiconductor die 130-2 and the debond layer 114, and two opposite sides of the second connecting film physically contacts the backside surface 130f of the semiconductor die 130-2 and the debond layer 114. In some embodiments, a third connecting film is located between the semiconductor die 130-3 and the debond layer 114, and two opposite sides of the third connecting film physically contacts the backside surface 130f of the semiconductor die 130-3 and the debond layer 114. In some embodiments, due to the above connecting films, the semiconductor die 130-1, the semiconductor die 130-2, and the semiconductor die 130-3 are stably adhered to the debond layer 114. In some embodiments, the above connecting films may be, but not limited to, a die attach film or a layer made of adhesives, epoxy-based resin, acrylic polymer, other suitable insulating material, or the like, and which may be with or without fillers filled therein (such as silica, alumina, or the like). The disclosure is not limited thereto.

Figure 2:
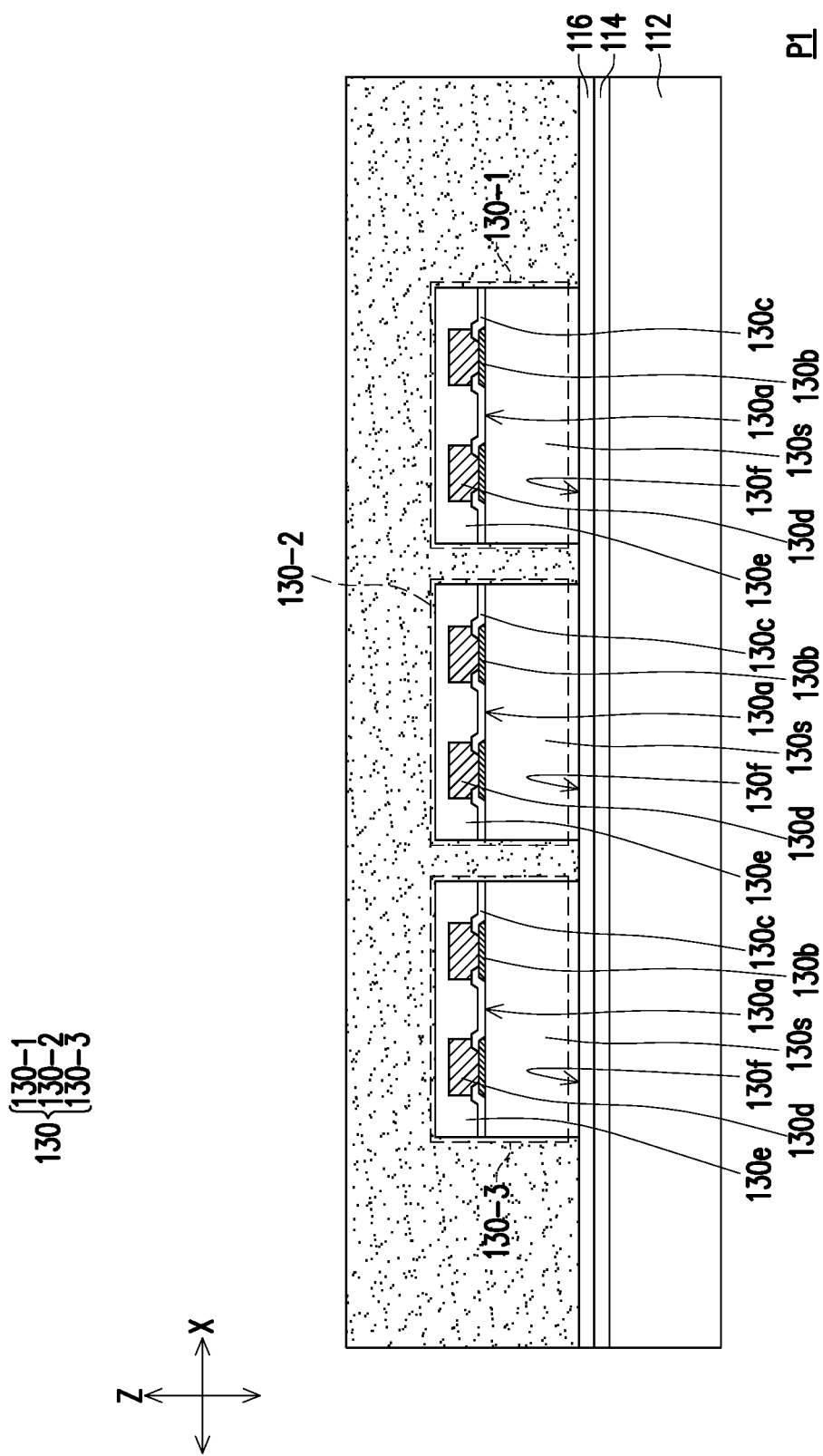

Referring to FIG. 2, in some embodiments, the semiconductor dies 130 are encapsulated in an insulating encapsulation 140, in accordance with step S20 of FIG. 16. In some embodiments, the insulating encapsulation 140 is formed on the buffer layer 116 and over the carrier 112. As shown in FIG. 2, the insulating encapsulation 140 at least fills up the gaps between the semiconductor dies 130 (e.g. the semiconductor die 130-1, the semiconductor die 130-2, and the semiconductor die 130-3), for example. In some embodiments, the insulating encapsulation 140 covers the semiconductor dies 130. In other words, for example, the semiconductor dies 130 are not accessibly revealed by and embedded in the insulating encapsulation 140.

In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 3:
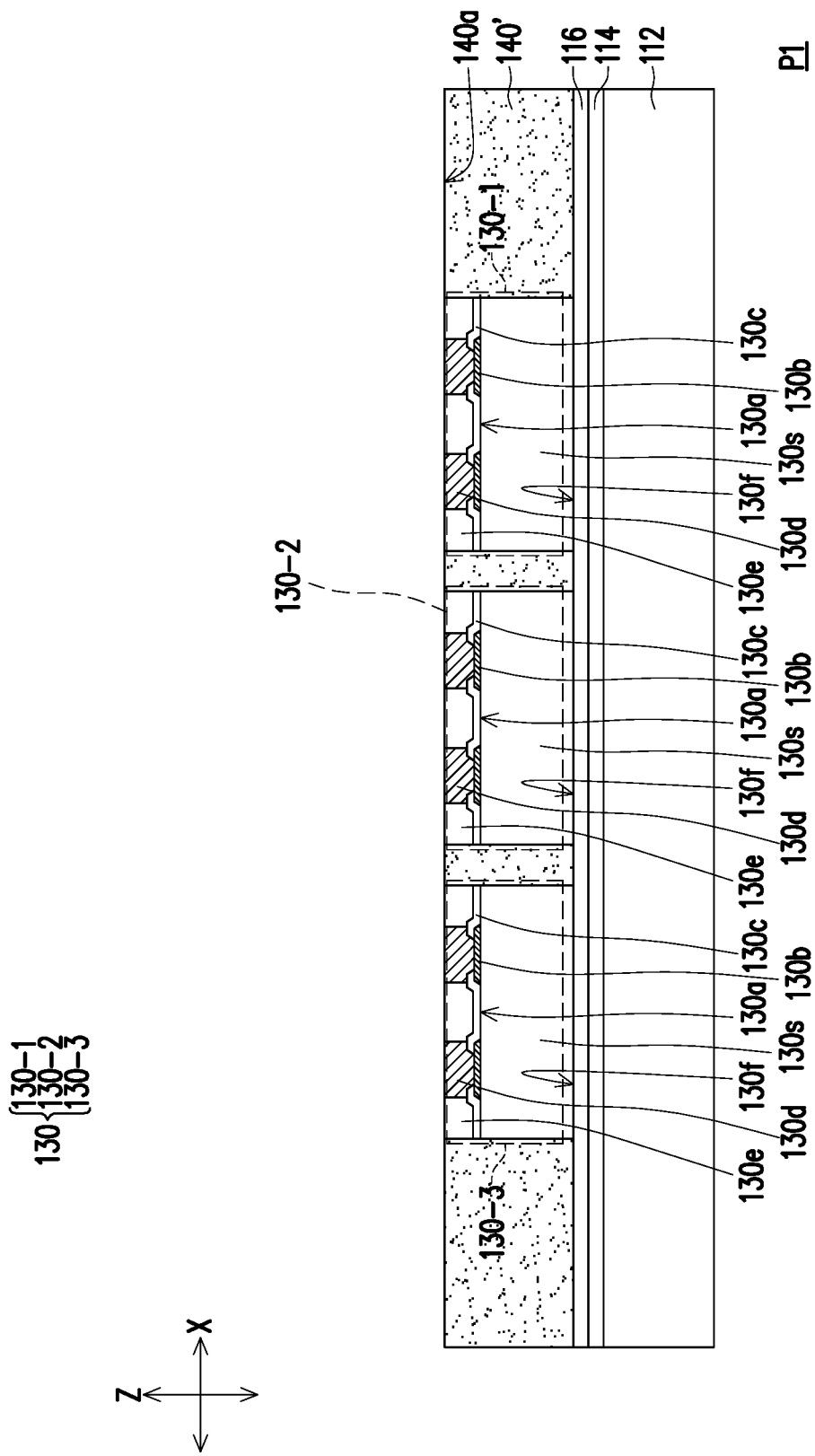

Referring to FIG. 3, in some embodiments, the insulating encapsulation 140 is planarized to form an insulating encapsulation 140' exposing the semiconductor dies 130, in accordance with step S30 of FIG. 16. In certain embodiments, as shown in FIG. 3, after the planarization, top surfaces of the semiconductor dies 130 (e.g. top surfaces of the conductive vias 130d and the protection layer 130e of each of the semiconductor die 130-1, the semiconductor die 130-2, and the semiconductor die 130-3) are exposed by a top surface 140a of the insulating encapsulation 140'. That is, for example, the top surfaces of the semiconductor dies 130 become substantially leveled with the top surface 140a of the insulating encapsulation 140'. In other words, the top surfaces of the semiconductor dies 130 and the top surface 140a of the insulating encapsulation 140' are substantially coplanar to each other. In some embodiments, as shown in FIG. 3, the semiconductor dies 130 are accessibly revealed by the insulating encapsulation 140'. That is, for example, the conductive vias 130d of the semiconductor dies 130 are accessibly revealed by the insulating encapsulation 140'.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive vias 130d and the protection layer 130e of the semiconductor die 130-1, the semiconductor die 130-2, and/or the semiconductor die 130-3 may also be planarized. In certain embodiments, the planarizing step may be, for example, performed on the over-molded insulating encapsulation 140 to level the top surface 140a of the insulating encapsulation 140' and the top surfaces of the conductive vias 130d and the protection layer 130e of each of the semiconductor die 130-1, the semiconductor die 130-2, and the semiconductor die 130-3.

In some embodiments, a redistribution circuit structure 150 is formed on the semiconductor dies 130 and the insulating encapsulation 140', in accordance with step S40 of FIG. 16 (for example, involving steps S41a to S47a of FIG. 17 and steps S41a-1 to S41a-5 and steps S41a-o of FIG. 18). In some embodiments, as shown in FIG. 4 to FIG. 12, the redistribution circuit structure 150 includes an inter-layer film 151, a dielectric layer 152 (e.g. a dielectric layer 152-1, a dielectric layer 152-2, and a dielectric layer 152-3), a seed layer 153 (e.g. a seed layer 153-1, a seed layer 153-2, and a seed layer 153-3), a patterned conductive layer 154 (e.g. a patterned conductive layer 154-1, a patterned conductive layer 154-2, and a patterned conductive layer 154-3), an inter-layer film 155 (e.g. an inter-layer film 155-1, an inter-layer film 155-2, and an inter-layer film 155-3), and a dielectric layer 156. However, in the disclosure, the numbers of layers of the dielectric layer 152, the seed layer 153, the patterned conductive layer 154, and the inter-layer film 155 are not limited to what is depicted in FIG. 4 to FIG. 12, where the numbers of the layers of the dielectric layer 152, the seed layer 153, the patterned conductive layer 154, and the inter-layer film 155 may be one or more than one. In some embodiments, the dielectric layer 152, the seed layer 153, the patterned conductive layer 154 and the inter-layer film 155 are sandwiched between the inter-layer film 151 and the dielectric layer 156 and are sequentially stacked.

Figure 4:
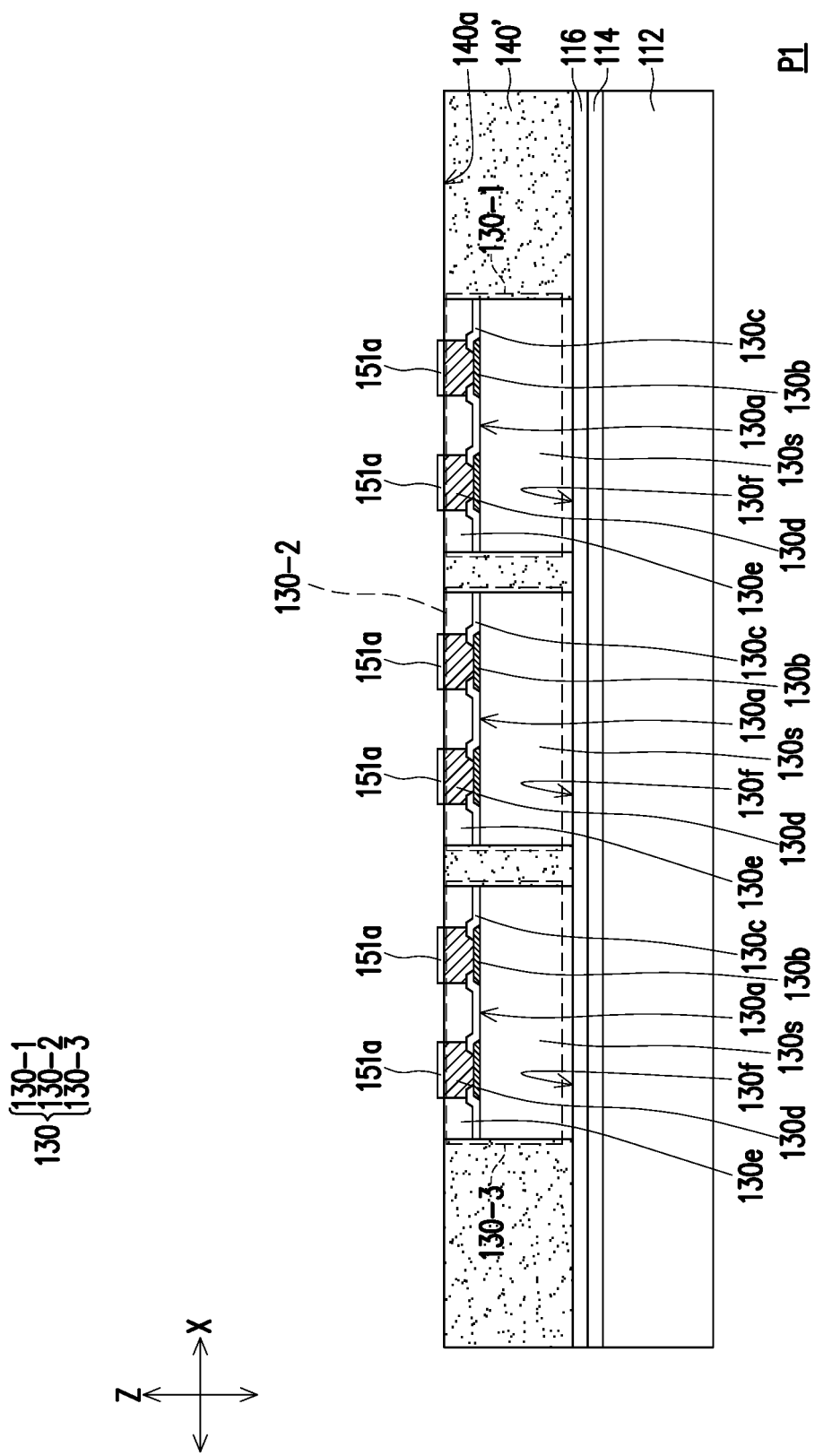

Referring to FIG. 4, in some embodiments, an inter-layer film 151a is formed on the conductive vias 130d of each of the semiconductor die 130-1, the semiconductor die 130-2 and the semiconductor die 130-3 exposed by the protection layers 130e and the insulating encapsulation 140', in accordance with step S41a of FIG. 17. In some embodiments, the formation of the inter-layer film 151a may include, but not limited to, applying an adhesive precursor on the semiconductor dies 130 (step S41a-3 of FIG. 18), performing a thermal process at a workable temperature of about 30° C. to about 80° C. for 1 to 5 minutes for subjecting the adhesive precursor and the conductive vias 130d of the semiconductor dies 130 to form bonding therebetween (step S41a-4 of FIG. 18), and removing the adhesive precursor which is un-bonding to the conductive vias 130d of the semiconductor dies 130 by rinsing (step S41a-5 of FIG. 18); and thereby forming the inter-layer film 151a on the conductive vias 130d. In some embodiments, before applying the adhesive precursor on the semiconductor dies 130, a pre-cleaning step may be performed to remove any undesired substance or particles remained on the conductive vias 130d of the semiconductor dies 130 (step S41a-1 of FIG. 18). For example, the pre-cleaning step include a process using a chemical cleaner such as CX-100 (e.g. citric acid) or other suitable chemicals (e.g., HCl or $H_2SO_4$). In some embodiments, after the pre-cleaning step, a rinsing step (with DI water) may be performed to remove the chemicals used in the pre-cleaning process (step S41a-2 of FIG. 18). In addition, after each of the rinsing steps such as step S41a-2 and/or step S41a-5, a drying step may be optionally performed, for example, by using nitrogen gas at a workable temperature of about 30° C. to about 80° C. for 1 minute (step(s) S41a-o of FIG. 18).

In some embodiments, the adhesive precursor includes a compound represented by the following chemical formula,

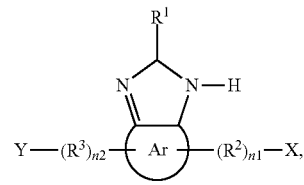

where the nitrogen (N) atoms in the above chemical formula are respectively bonded to a copper (Cu) atom included in and/or provided by the conductive vias 130d of the semiconductor dies 130 to form a three-dimensional network structure including a —(Cu—N)-bond during the thermal process in Step S41a-4. Through the cross-linkage among the N atoms of the adhesive precursor and the Cu atoms of the conductive vias 130d of the semiconductor dies 130, the inter-layer film 151a is formed on the top surfaces of the conductive vias 130d of the semiconductor dies 130. In some embodiments, a thickness of the inter-layer film 151a is greater than or substantially equal to 50 nm and is less than or substantially equal to 350 nm, as measured along the direction Z.

In the above chemical formula, Ar is an aromatic ring selected from the group consisting of aromatic rings represented by chemical formula (1) to chemical formula (35) as follows,

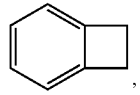

chemical formula (1)

chemical formula (2)

chemical formula (3)

-continued chemical formula (4)

chemical formula (5)

chemical formula (6)

chemical formula (7)

chemical formula (8)

chemical formula (9)

chemical formula (10)
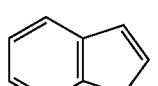

chemical formula (11)
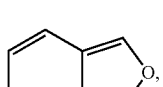

chemical formula (12)
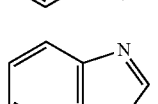

chemical formula (13)
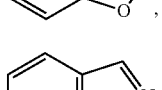

chemical formula (14)
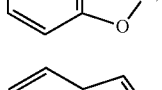

chemical formula (15)
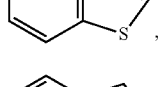

chemical formula (16)
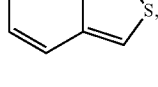

chemical formula (17)
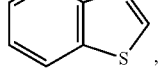

chemical formula (18)
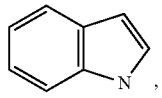

chemical formula (19)
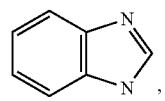

chemical formula (20)
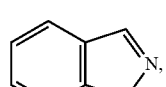

chemical formula (21)
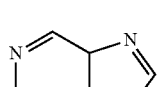

chemical formula (22)
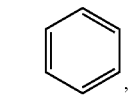

chemical formula (23)
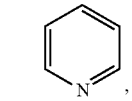

chemical formula (24)
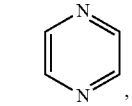

chemical formula (25)
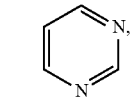

chemical formula (26)
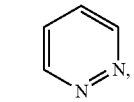

chemical formula (27)
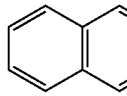

chemical formula (28)
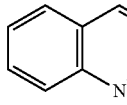

chemical formula (29)
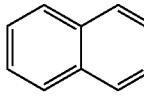

chemical formula (30)
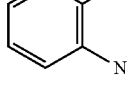

chemical formula (31)
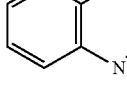

chemical formula (32)
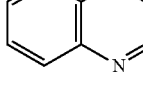

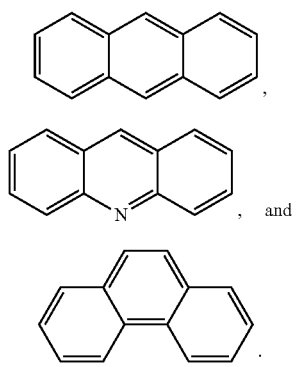

chemical formula (33)

chemical formula (34)

, and chemical formula (35)

In above chemical formula, $R^1$ represents a hydrogen atom, a substituted or unsubstituted alkyl chain having a linear-like structure, a branch-like structure, a comb-like structure or a star-like structure, or an aromatic ring. In the disclosure, one of the two N atoms presented in the ring where R' directly bonded thereto as shown above are bonded to a hydrogen atom to form a group, —NH.

In above chemical formula, $R^2$ to $R^3$ are each independently a substituted or unsubstituted alkylene group, where n1 and n2 are each independently an integer ranging from 1 to 30. In one embodiment, $R^2$ to $R^3$ are the same as or different from each other. In one embodiment, n1 and n2 are the same as or different from each other.

In above chemical formula, X and Y are each independently —H, —OH, —SH, —F, —Cl, —Br, —I, a carboxyl group, a ester group, an amine group, a quaternary ammonium cation, a trimethylsilyl group, a triethylsilyl group, a sulfo group, a carbonyl group, a carbonate ester group, an amide group, or an epoxy group. In one embodiment, X and Y are the same as or different from each other.

Figure 50:
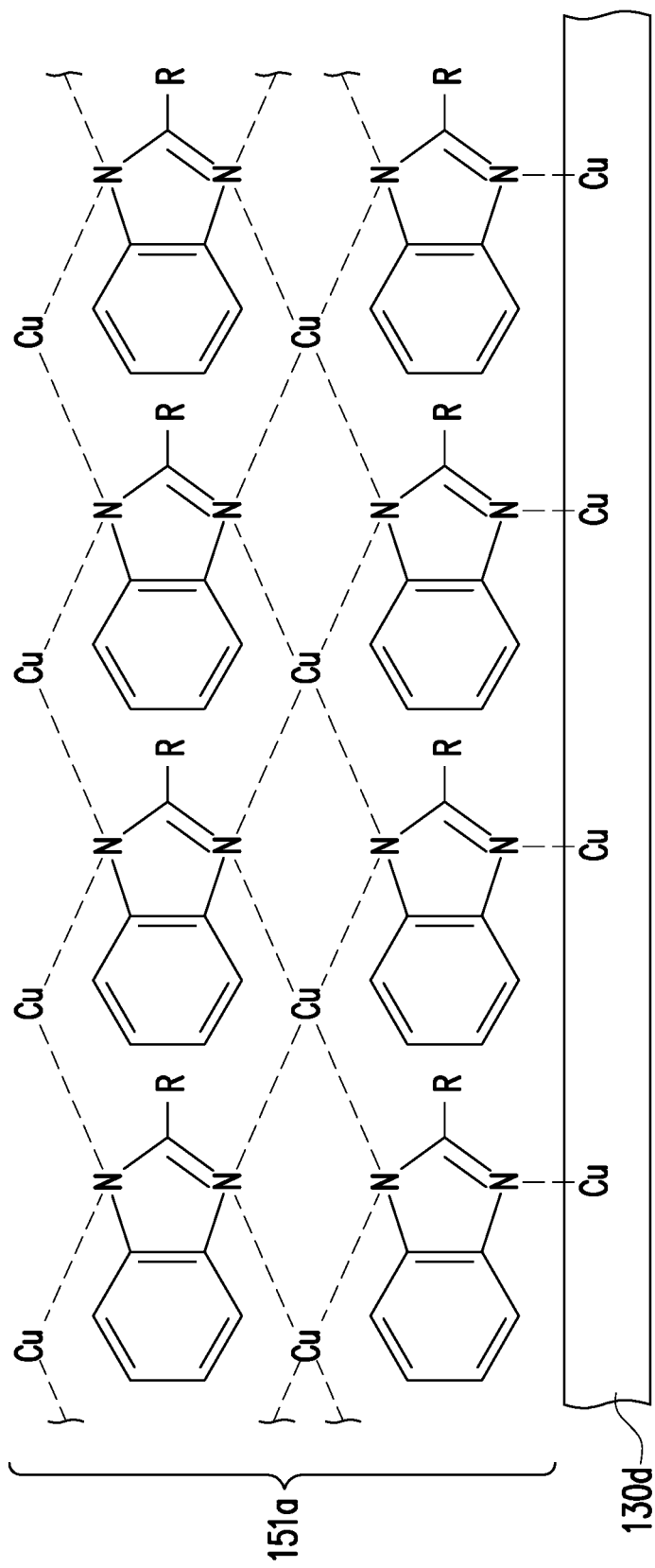
FIG. 50 is a schematic cross-sectional view illustrating an example of an inter-layer film in accordance with some embodiments of the present disclosure.

For example, a bonding relationship between the inter-layer film 151a and the conductive vias 130d of the semiconductor dies 130 is partially and schematically shown in FIG. 50, where R is a hydrogen atom, an alkyl chain, or an aromatic ring. However, the disclosure is not limited thereto. In addition, a top layer of the Cu atoms (depicted in FIG. 50) may further be bonded to the compound included in the adhesive precursor. As shown below, in the disclosure, for example, the inter-layer film 151a is formed in a layer with copper complex of an imidazole derivative.

In some embodiments, applying the adhesive precursor on the semiconductor dies 130 may include coating an adhesive precursor mixture on the semiconductor dies 130, where the adhesive precursor mixture includes 0.01 wt % to 100 wt % of the adhesive precursor. In other words, based on a total amount of the adhesive precursor mixture, an amount of the adhesive precursor is about 0.01 wt % to about 100 wt % and an amount of the solvent is about 0 wt % to about 99.99 wt %. For example, the aforesaid solvent refers to a solvent capable of allowing the adhesive precursor evenly dispensing therein, but does not react therewith. In some embodiments, the solvent may be deionized water with a pH value greater than 7.

Figure 5:
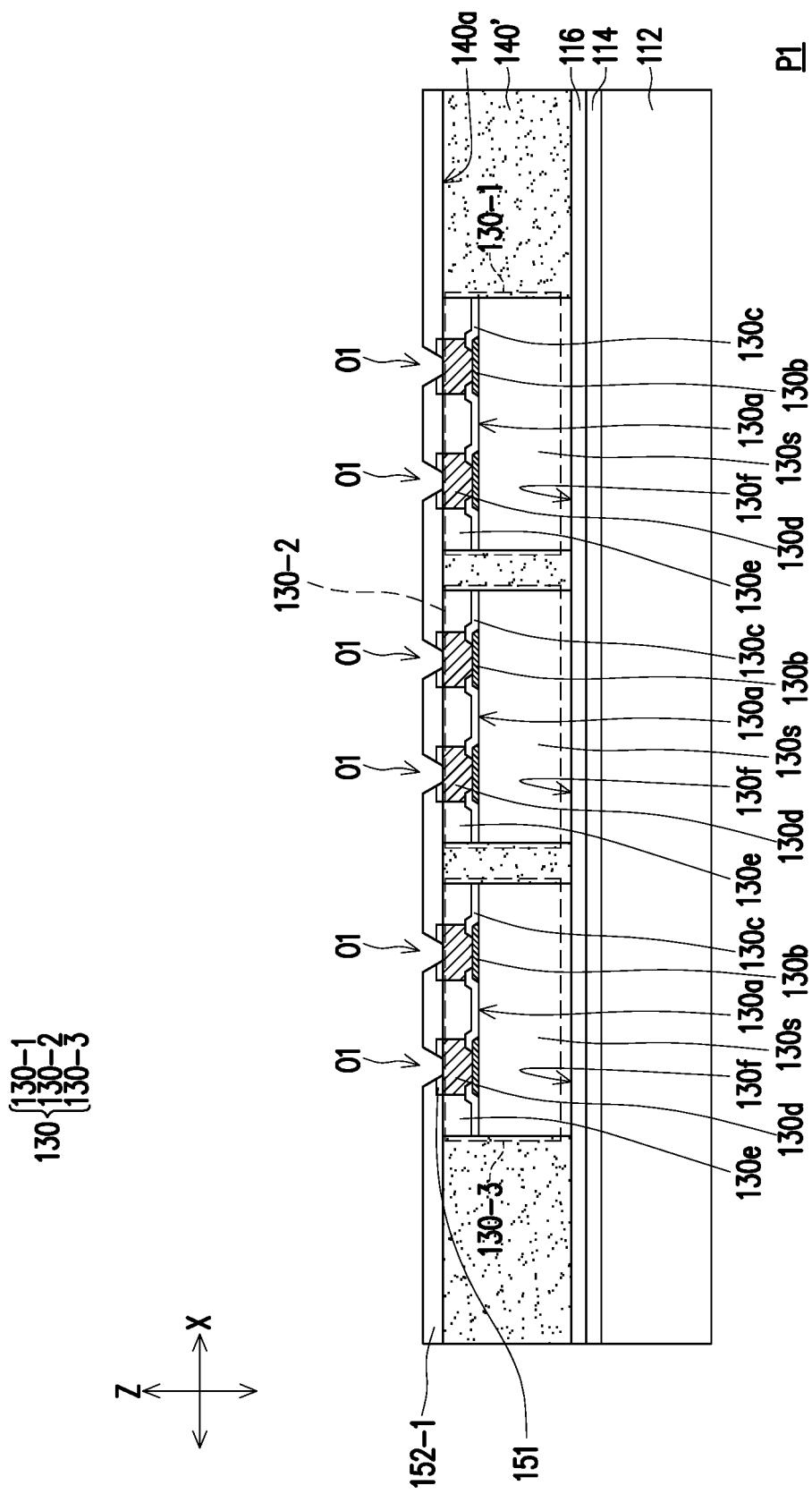

Referring to FIG. 5, in some embodiments, a dielectric layer 152-1 is formed on the inter-layer film 151a, in accordance with step S42a of FIG. 17. In some embodiments, the dielectric layer 152-1 is formed by, but not limited to, forming a blanket layer of dielectric material over the structure depicted in FIG. 4 to completely cover the inter-layer film 151a and patterning the dielectric material blanket layer to form the dielectric layer 152-1. In some embodiments, during patterning the dielectric material blanket layer to form the dielectric layer 152-1, the inter-layer film 151a is also patterned, where openings O1 are formed in the inter-layer film 151a and the dielectric material blanket layer to respectively form an inter-layer film 151 and the dielectric layer 152-1. In other words, the conductive vias 130d of the semiconductor dies 130 are accessibly revealed by the inter-layer film 151 and the dielectric layer 152-1 through the openings O1.

In some embodiments, the material of the dielectric layers 152-1 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layer 152-1 may be formed by suitable fabrication techniques such as spin-on coating, chemical vapor deposition (CVD), (e.g. plasma-enhanced chemical vapor deposition (PECVD)), or the like.

Figure 6:
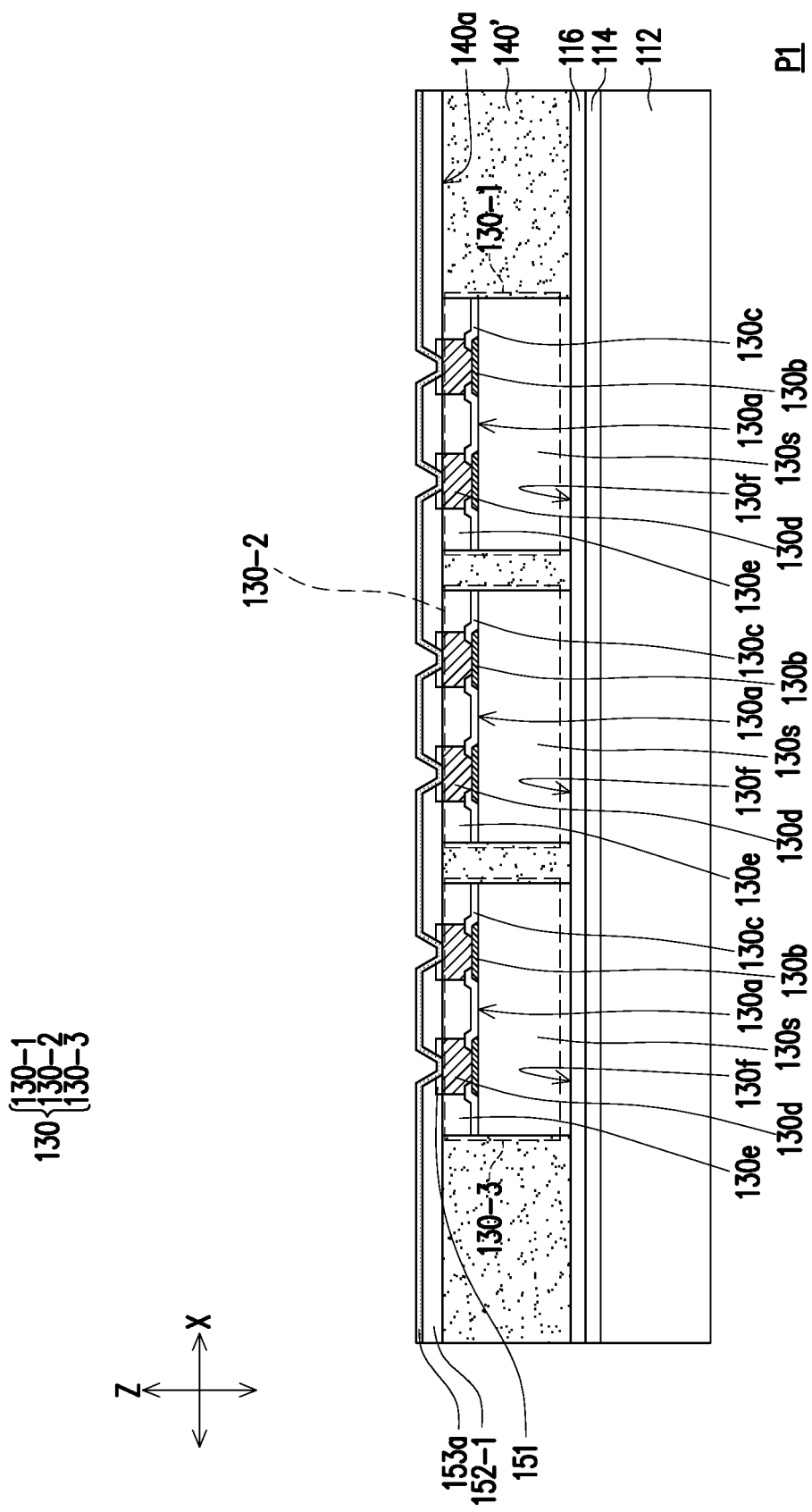

Referring to FIG. 6, in some embodiments, a seed layer 153a is formed over the dielectric layers 152-1, in accordance with step S43a of FIG. 17. In some embodiments, the seed layer 153a is formed on the dielectric layers 152-1 and extends into the openings O1 formed in the dielectric layer 152-1 and the inter-layer film 151 to physically contact the conductive vias 130d of the semiconductor dies 130 exposed by the openings O1, portions of the dielectric layer 152-1 and portions of the inter-layer film 151 (exposed by the openings O1). In other words, the seed layer 153a penetrates through the dielectric layer 152-1 and the inter-layer film 151, and sidewalls of the openings O1 are completely covered by the seed layer 153a.

In some embodiments, the seed layer 153a is formed over the carrier 112 in a manner of a blanket layer made of metal or metal alloy materials, the disclosure is not limited thereto. In some embodiments, the seed layer 153a are referred to as a metal layer, which may be a single layer or a composite layer comprising a plurality of sub-layers formed of different materials. In some embodiments, the seed layer 153a include titanium, copper, molybdenum, tungsten, titanium nitride, titanium tungsten, combinations thereof, or the like. For example, the seed layer 153a may include a titanium layer and a copper layer over the titanium layer. The seed layer 153a may be formed using, for example, sputtering, physical vapor deposition (PVD). or the like. In some embodiments, the seed layer 153a may be conformally formed on the dielectric layer 152-1 by sputtering, and in contact with the dielectric layer 152-1, the inter-layer film 151, and the conductive vias 130d exposed by the openings O1.

Figure 7:
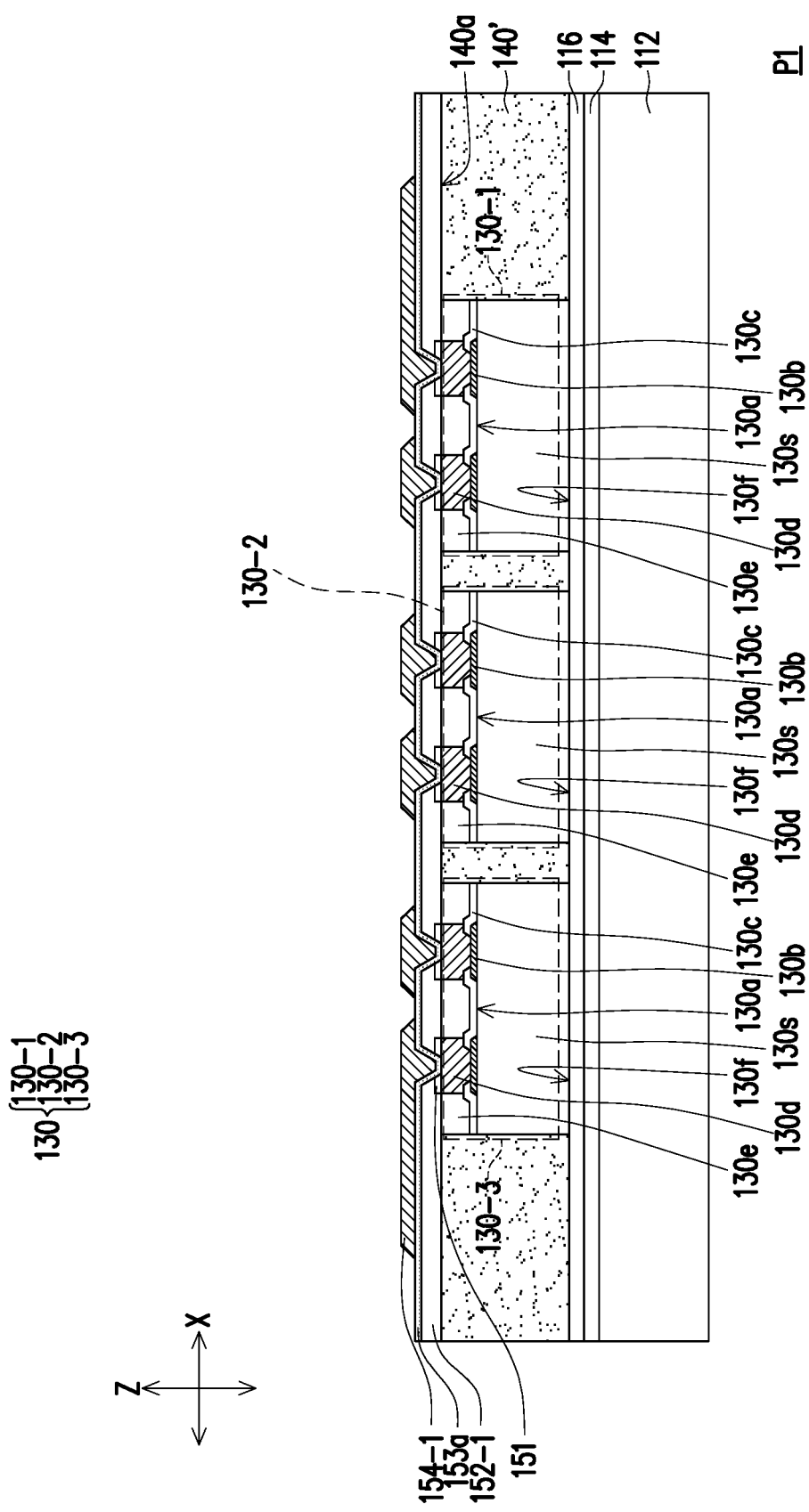

Referring to FIG. 7, in some embodiments, the patterned conductive layer 154-1 is formed and on the seed layer 153a, in accordance with step S44a of FIG. 17. In some embodiments, the patterned conductive layer 154-1 may be formed by, but not limited to, forming a blanket layer of conductive material over the structure depicted in FIG. 6 to completely cover the seed layer 153a and patterning the conductive material blanket layer to form the patterned conductive layer 154-1.

In one embodiment, the patterned conductive layer 154-1 may be made of conductive materials formed by electro-plating or deposition, such as copper, copper alloy, aluminum, aluminum alloy, or combinations thereof, which may be patterned using a photolithography and etching process. In some embodiments, the patterned conductive layer 154-1 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 8:
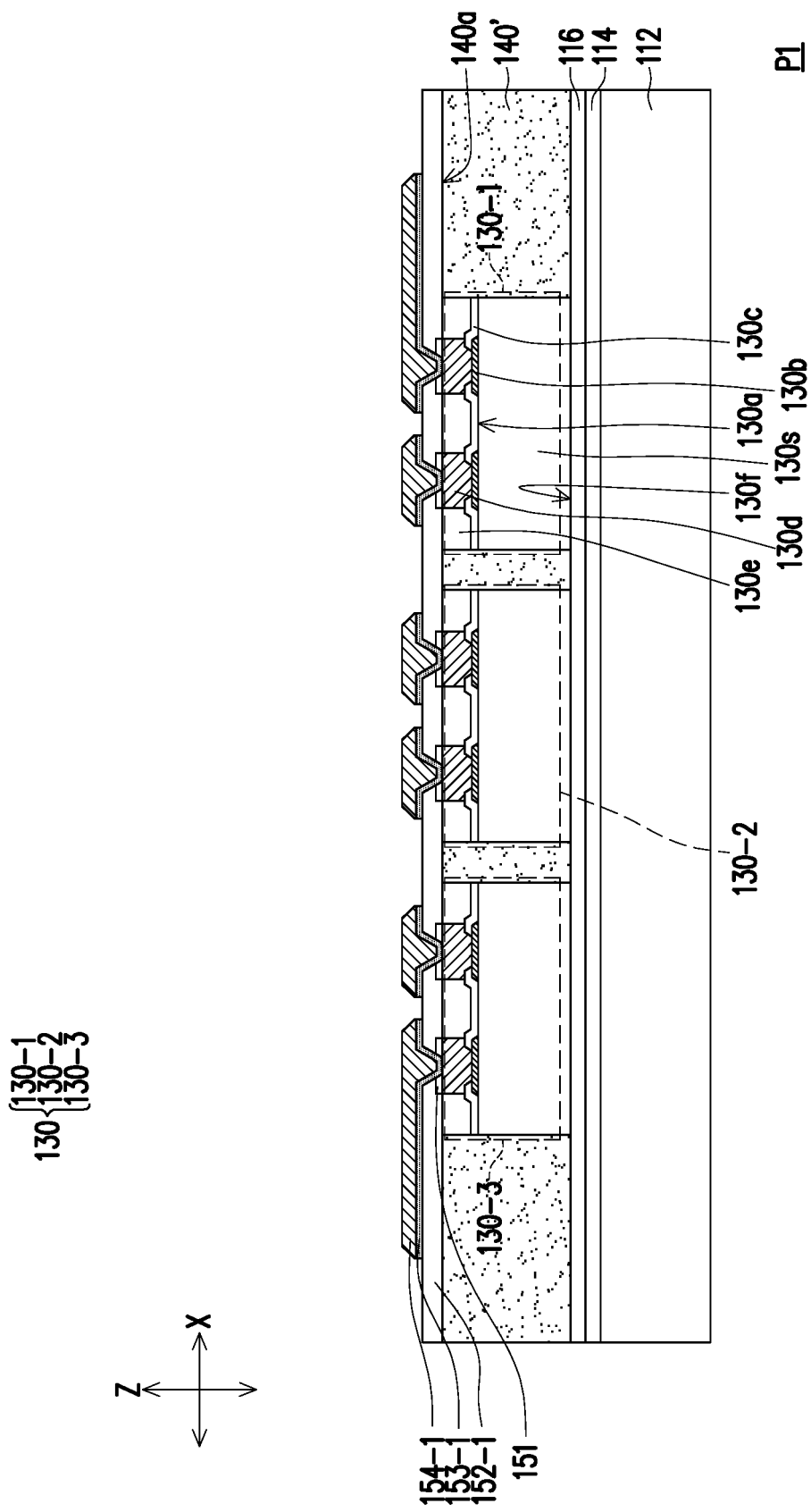

Referring to FIG. 8, in some embodiments, the seed layer 153*a* is patterned to form a seed layer 153-1, in accordance with step S45*a* of FIG. 17. In some embodiments, the seed layer 153*a* is patterned by using the patterned conductive layer 154-1 as an etching mask to form the seed layer 153-1. For example, the etching process may be a dry etching process, a wet etching process, or a combination thereof; the disclosure is not limited thereto. In other words, for example, in a vertical projection on the insulating encapsulation 140' (e.g. a vertical projection along the direction Z), the patterned conductive layer 154-1 is completely overlapped with the seed layer 153-1. In some embodiments, as shown in FIG. 8, the patterned conductive layer 154-1 is electrically connected to the semiconductor dies 130 through physically connecting the seed layer 153-1 and the conductive vias 130*d*.

Figure 9:
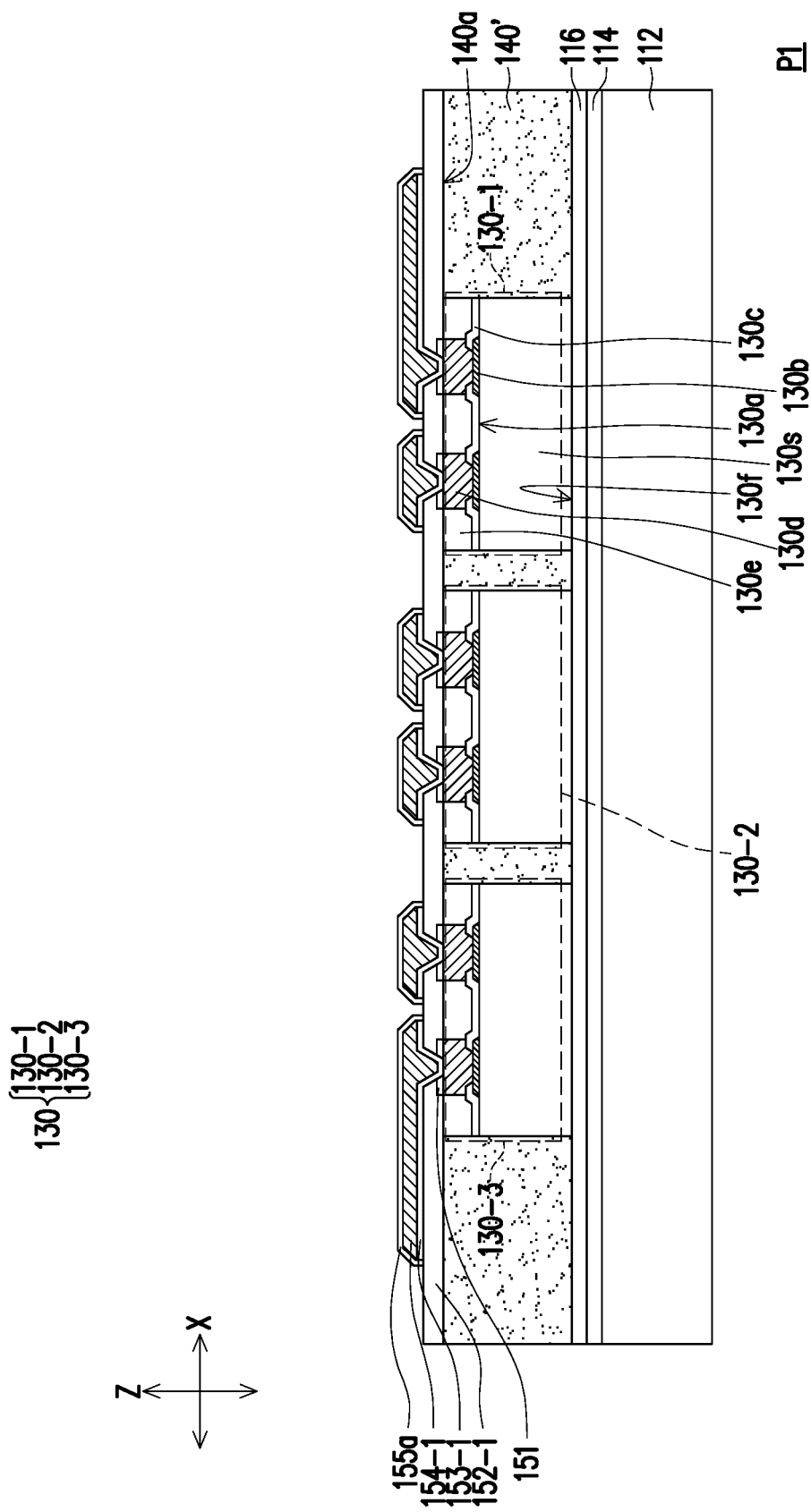

Referring to FIG. 9, in some embodiments, an inter-layer film 155*a* is formed on the patterned conductive layer 154-1 and the seed layer 153-1, in accordance with step S46*a* of FIG. 17. The formation of the inter-layer film 155*a* is the same or similar to the formation of the inter-layer film 151*a* described in FIG. 4 with the use of the adhesive precursor as described in the method of FIG. 18, and thus is not repeated herein for simplicity. As shown in FIG. 9, for example, the patterned conductive layer 154-1 is completely wrapped by the inter-layer film 155*a* and the seed layer 153-1, where the inter-layer film 155*a* physically contacts the seed layer 153-1 and the patterned conductive layer 154-1, simultaneously.

Figure 10:
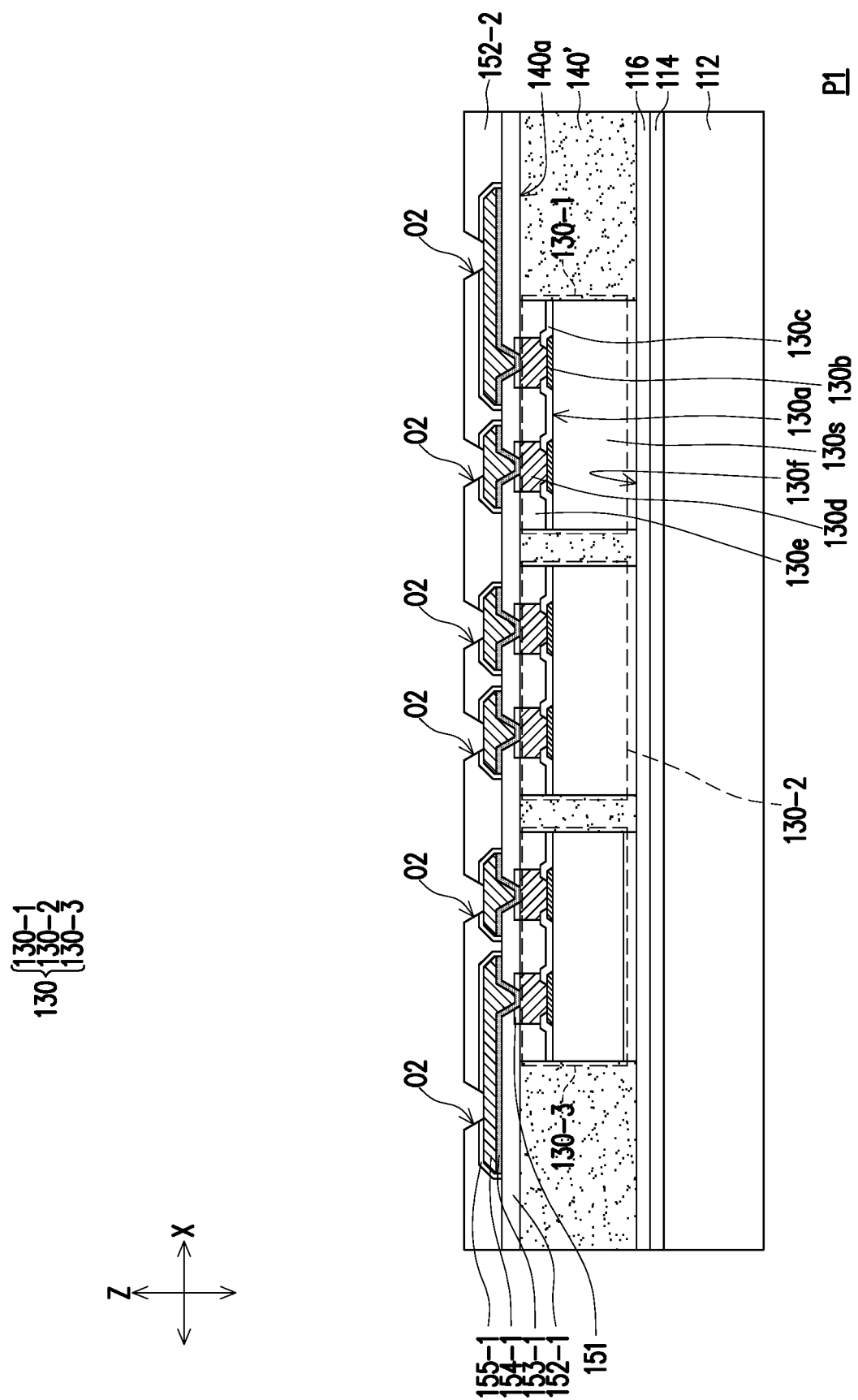

Referring to FIG. 10, in some embodiments, the dielectric layer 152-2 is formed, in accordance with step S47*a* of FIG. 17. In some embodiments, the dielectric layer 152-2 is formed by, but not limited to, forming a blanket layer of dielectric material over the structure depicted in FIG. 9 to completely cover the inter-layer film 155*a* and patterning the dielectric material blanket layer to form the dielectric layer 152-2. In some embodiments, during patterning the dielectric material blanket layer to form the dielectric layer 152-2, the inter-layer film 155*a* is also patterned, where openings O2 are formed in the inter-layer film 155*a* and the dielectric material blanket layer to respectively form an inter-layer film 155-1 and the dielectric layer 152-2. In other words, the openings O2 penetrate through the inter-layer film 155-1 and the dielectric layer 152-2, and thus portions of the patterned conductive layer 154-1 are accessibly revealed by the inter-layer film 155-1 and the dielectric layer 152-2 through the openings O2.

As shown in FIG. 10, the inter-layer film 151 is sandwiched between the conductive vias 130*d* and the dielectric layer 152-1, where the inter-layer 151 serves as a copper diffusion barrier between a conductive layer and a dielectric layer (e.g. the conductive vias 130*d* and the dielectric layer 152-1), and the phenomenon of copper diffusion is greatly suppressed due to the copper atom diffusing rate from the conductive layer (e.g. a copper layer) to the dielectric layer is reduced by the inter-layer film 151. And thus, the voids generated between the conductive layer and the dielectric layer, which are caused by the diffusion of copper atoms (e.g. copper atom diffusing from the conductive layer to the dielectric layer), are significantly decreased. Therefore, owing to the presence of the inter-layer film 151, the adhesive strength between the conductive vias 130*d* and the dielectric layer 152-1 is enhanced, and the delamination between the conductive vias 130*d* and the dielectric layer 152-1 is suppressed.

In some embodiments, as shown in FIG. 10, the inter-layer film 155-1 is sandwiched between the patterned conductive layer 154-1 and the dielectric layer 152-2. Due to the inter-layer film 155-1, the adhesive strength between the patterned conductive layer 154-1 and the dielectric layer 152-2 and between the seed layer 153-1 and the dielectric layer 152-2 is enhanced, and the delamination between the patterned conductive layer 154-1 and the dielectric layer 152-2 and between the seed layer 153-1 and the dielectric layer 152-2 is suppressed.

In one embodiment, the material of the dielectric layer 152-2 may be the same as the material of the dielectric layer 152-1. In an alternative embodiment, the material of the dielectric layer 152-2 may be different from the material of the dielectric layer 152-1. The disclosure is not limited thereto.

Figure 11:
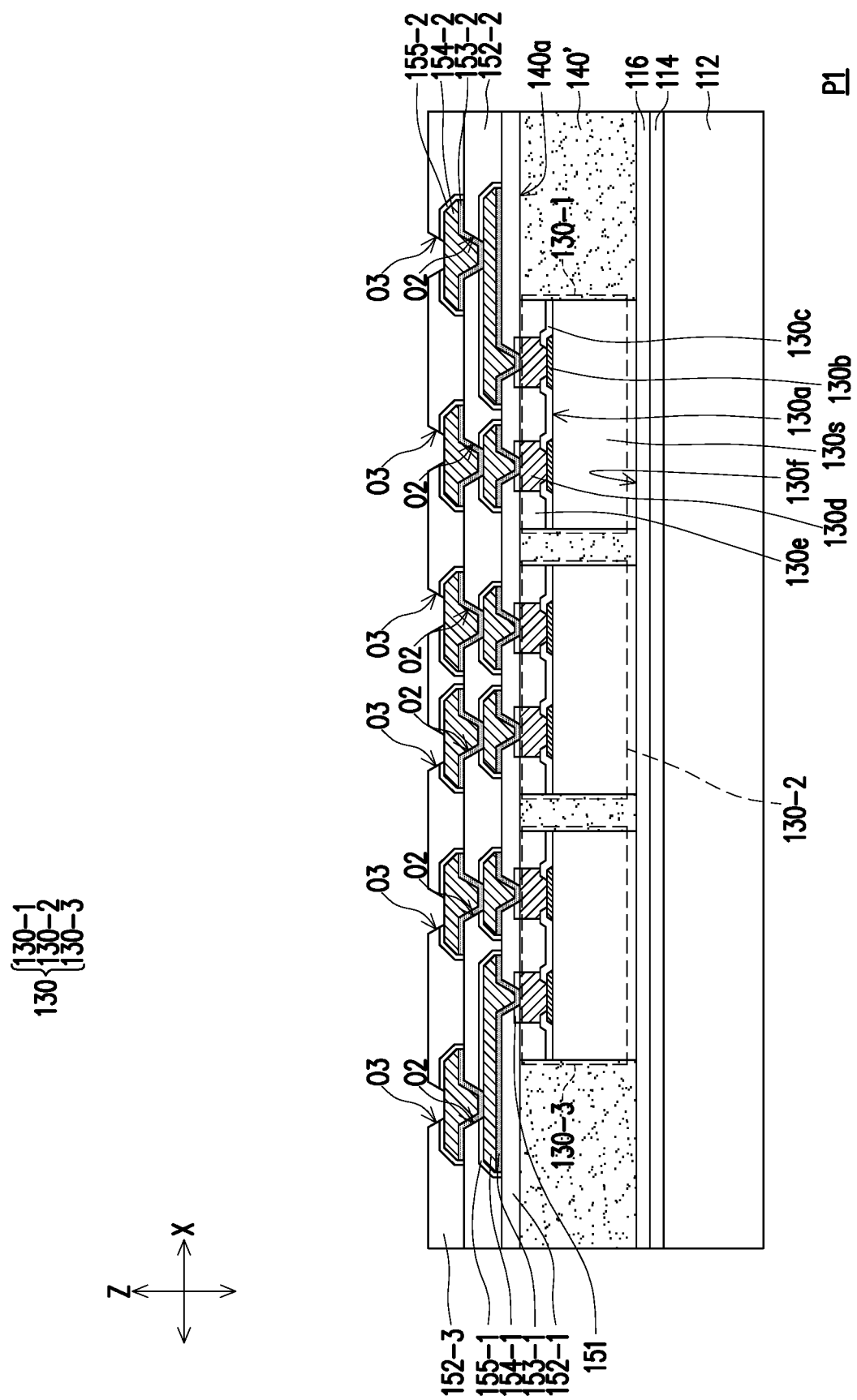

Referring to FIG. 11, in some embodiments, the seed layer 153-2, the patterned conductive layer 154-2, the inter-layer film 155-2, and the dielectric layer 152-3 are sequentially formed on the structure depicted on FIG. 10. The formation and material of the seed layer 153-2 are the same or similar to the process and material of forming the seed layer 153-1 described in FIG. 6 to FIG. 8, the formation and material of the patterned conductive layer 154-2 are the same or similar to the process and material of forming the patterned conductive layer 154-1 described in FIG. 7, the formation and material of the inter-layer film 155-2 are the same or similar to the process and material of forming inter-layer film 155-1 described in FIG. 9 and FIG. 10, and the formation and material of the dielectric layer 152-3 are the same or similar to the process and material of forming the dielectric layer 152-2 as described in FIG. 10, and thus are not repeated herein.

In some embodiments, the seed layer 153-2 is formed on the dielectric layer 152-2 and extends into openings O2 formed in the inter-layer film 155-1 and the dielectric layer 152-2 to physically contact the patterned conductive layer 154-1 exposed by the openings O2 in addition to portions of the inter-layer film 155-1 and portions of the dielectric layer 152-2 (exposed by the openings O2). In other words, the seed layer 153-2 penetrates through the dielectric layer 152-2 and the inter-layer film 155-1, and sidewalls of the openings O2 are completely covered by the seed layer 153-2. In some embodiments, the patterned conductive layer 154-2 is formed on (e.g. in physical contact with) the seed layer 153-2, where a projection area of the patterned conductive layer 154-2 is overlapped with a projection area of the seed layer 153-2, in the vertical projection on the insulating encapsulation 140' along the direction Z. For example, as shown in FIG. 11, the patterned conductive layer 154-2 is electrically connected to the patterned conductive layer 154-1 through the seed layer 153-2.

In some embodiments, the inter-layer film 155-2 and the dielectric layer 152-3 are formed on the patterned conductive layer 154-2, where the inter-layer film 155-2 is sandwiched between the patterned conductive layer 154-2 and the dielectric layer 152-3 and is sandwiched between the seed layer 153-2 and the dielectric layer 152-3. Due to the inter-layer film 155-2, the adhesive strength between the patterned conductive layer 154-2 and the dielectric layer 152-3 and between the seed layer 153-2 and the dielectric layer 152-3 is enhanced, and the delamination between the patterned conductive layer 154-2 and the dielectric layer 152-3 and between the seed layer 153-2 and the dielectric layer 152-3 is suppressed.

Figure 12:
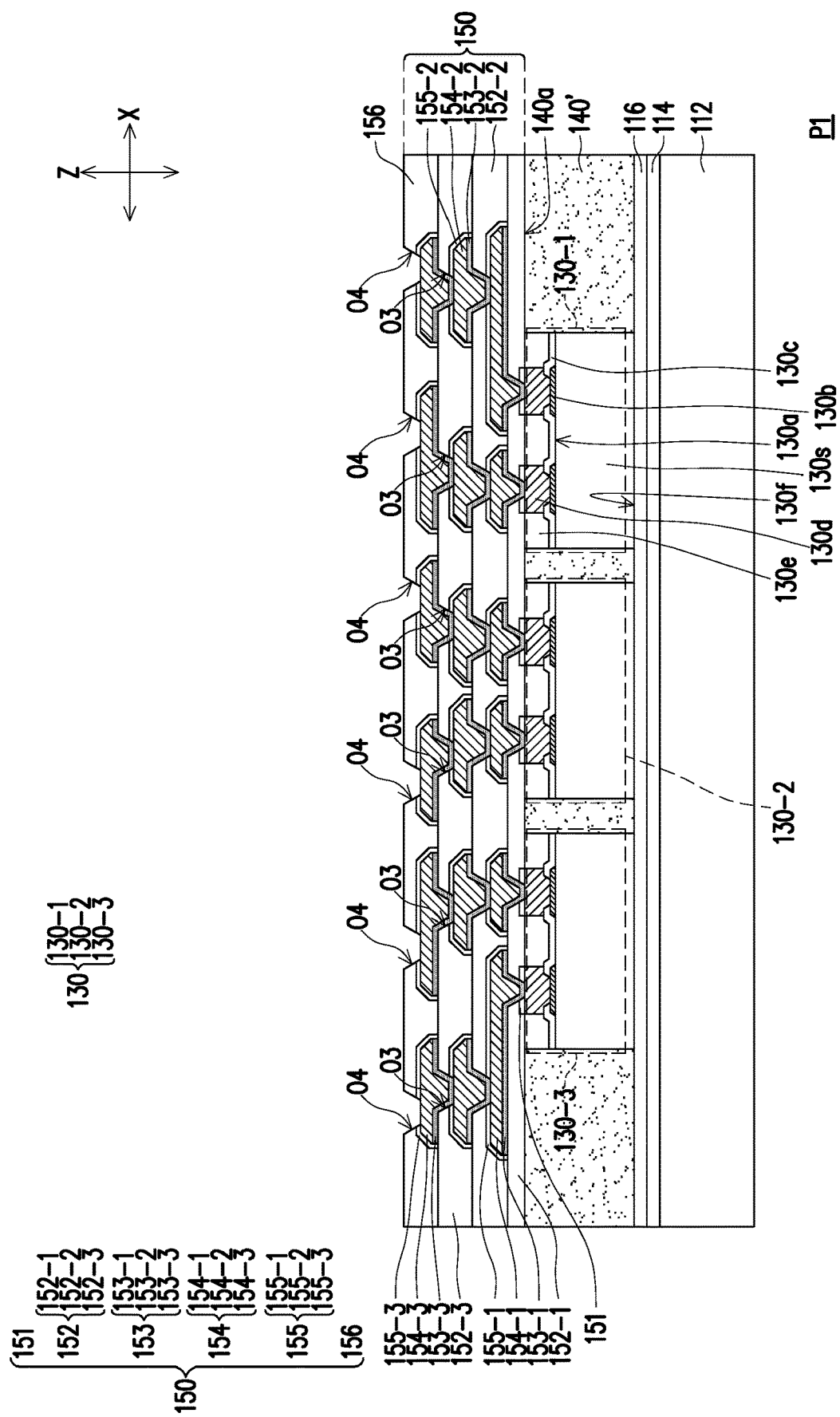

Referring to FIG. 12, in some embodiments, the seed layer 153-3, the patterned conductive layer 154-3, the inter-layer film 155-3, and the dielectric layer 156 are sequentially formed on the structure depicted on FIG. 11. The formation/material of the seed layer 153-3 is the same or similar to the process and material of forming the seed layer 153-1 described in FIG. 6 to FIG. 8, the formation/material of the patterned conductive layer 154-3 is the same or similar to the process and material of forming the patterned conductive layer 154-1 described in FIG. 7, the formation/material of the inter-layer film 155-3 is the same or similar to the process and material of forming inter-layer film 155-1 described in FIG. 9 and FIG. 10, and the formation/material of the dielectric layer 156 is the same or similar to the process and material of forming the dielectric layer 152-2 as described in FIG. 10, and thus are not repeated herein.

In some embodiments, the seed layer 153-3 is formed on the dielectric layer 152-3 and extends into openings O3 formed in the inter-layer film 155-2 and the dielectric layer 152-3 to physically contact the patterned conductive layer 154-2 exposed by the openings O3 in addition to portions of the inter-layer film 155-2 and portions of the dielectric layer 152-3 (exposed by the openings O3). In other words, the seed layer 153-3 penetrates through the dielectric layer 152-3 and the inter-layer film 155-2, and sidewalls of the openings O3 are completely covered by the seed layer 153-3. In some embodiments, the patterned conductive layer 154-3 is formed on (e.g. in physical contact with) the seed layer 153-3, where a projection area of the patterned conductive layer 154-3 is overlapped with a projection area of the seed layer 153-3, in the vertical projection on the insulating encapsulation 140' along the direction Z. For example, as shown in FIG. 12, the patterned conductive layer 154-3 is electrically connected to the patterned conductive layer 154-2 through the seed layer 153-3.

In some embodiments, the inter-layer film 155-3 and the dielectric layer 156 are formed on the patterned conductive layer 154-3, where the inter-layer film 155-3 is sandwiched between the patterned conductive layer 154-3 and the dielectric layer 156 and is sandwiched between the seed layer 153-3 and the dielectric layer 156. Due to the inter-layer film 155-3, the adhesive strength between the patterned conductive layer 154-3 and the dielectric layer 156 and between the seed layer 153-3 and the dielectric layer 156 is enhanced, and the delamination between the patterned conductive layer 154-3 and the dielectric layer 156 and between the seed layer 153-3 and the dielectric layer 156 is suppressed.

In some embodiments, as shown in FIG. 12, portions of the patterned conductive layer 154-3 are exposed by openings O4 formed in the dielectric layer 156 and the inter-layer film 155-3 for electrically connecting to later-formed connectors. Upon this, the redistribution circuit structure 150 of the package structure P1 is manufactured.

Referring to FIG. 10, FIG. 11 and FIG. 12 together, in some embodiments, the redistribution circuit structure 150 is formed on the semiconductor dies 130 and the insulating encapsulation 140', where the redistribution circuit structure 150 is electrically connected to the semiconductor dies 130 (e.g. the semiconductor dies 130-1, 130-2, 130-3). For example, the redistribution circuit structure 150 is formed on the top surfaces of the semiconductor dies 130 (e.g. the top surfaces of the conductive vias 130d and the protection layer 130e of the semiconductor dies 130) and the top surface 140a of the insulating encapsulation 140'. In some embodiments, the redistribution circuit structure 150 is electrically connected to the semiconductor dies 130 through the conductive vias 130d and the pads 130b. In some embodiments, the redistribution circuit structure 150 is referred to as a front-side redistribution layer of the semiconductor dies 130 for providing routing function. In some embodiments, the semiconductor dies 130 are located between the redistribution circuit structure 150 and the buffer layer 116, and the insulating encapsulation 140' are located between the redistribution circuit structure 150 and the buffer layer 116. As shown in FIG. 12, the semiconductor dies 130-1, 130-2, 130-3 are electrically communicated to each other through the redistribution circuit structure 150, for example.

In the disclosure, the layers (e.g. the seed layer 153-2, the patterned conductive layer 154-2, the inter-layer film 155-2, and the dielectric layer 152-3) formed in FIG. 11 and the layers (e.g. the seed layer 153-3, the patterned conductive layer 154-3, the inter-layer film 155-3, and the dielectric layer 156) formed in FIG. 12 may be individually referred to as one layer of a first build-up layer of a redistribution circuit structure 150. For illustration purpose, two first build-up layers are included in the redistribution circuit structure 150 of FIG. 12; however, the disclosure is not limited thereto. The number of the first build-up layer included in the redistribution circuit structure 150 is not limited in the disclosure. In one embodiment, the number of the first build-up layer included in the redistribution circuit structure 150 may be zero. For example, the first build-up layers respectively formed in FIG. 11 and FIG. 12 may be both optionally omitted from the redistribution circuit structure 150. In an alternative embodiment, the number of the first build-up layer included in the redistribution circuit structure 150 may be one or more than one.

Figure 13:
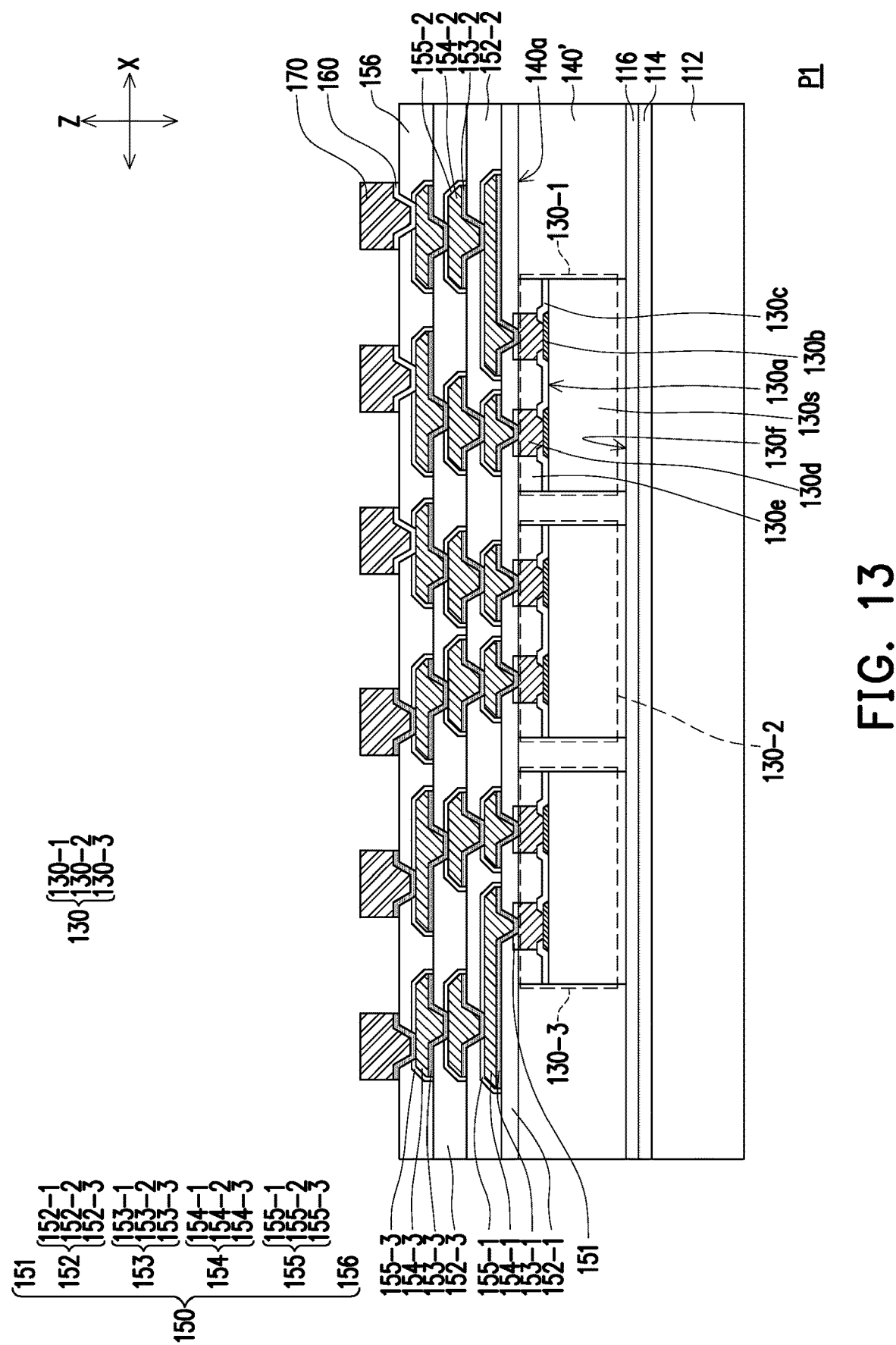

Referring to FIG. 13, in some embodiments, a plurality of seed-layer patterns 160 and a plurality of conductive elements 170 are formed over the redistribution circuit structure 150, in accordance with step S50 of FIG. 16. In some embodiments, as shown in FIG. 13, the seed-layer patterns 160 each are located between a respective one of the conductive elements 170 and the dielectric layer 156 of the redistribution circuit structure 150. Due to the seed-layer patterns 160, the adhesive strength between the conductive elements 170 and the dielectric layer 156 is enhanced. In some embodiments, the seed-layer patterns 160 are directly located on the portions of the patterned conductive layer 154-3 exposed by the openings O4 formed in the dielectric layer 156 and the inter-layer film 155-3. As shown in FIG. 13, in some embodiments, the seed-layer patterns 160 are electrically connected to the redistribution circuit structure 150, and the conductive elements 170 are electrically connected to the redistribution circuit structure 150 through the seed-layer patterns 160.

In some embodiments, the conductive elements 170 are electrically connected to the semiconductor die 130 through the redistribution circuit structure 150 and the seed-layer patterns 160. For example, some of the conductive elements 170 are electrically connected to the semiconductor die 130-1 through the redistribution circuit structure 150 and respective ones of the seed-layer patterns 160. For example, some of the conductive elements 170 are electrically connected to the semiconductor die 130-2 through the redistribution circuit structure 150 and respective ones of the seed-layer patterns 160. For example, some of the conductive elements 170 are electrically connected to the semiconductor die 130-3 through the redistribution circuit structure 150 and respective ones of the seed-layer patterns 160.

In some embodiments, the seed-layer patterns 160 are formed by, but not limited to, forming a blanket layer of a seed layer material (not shown) on the dielectric layers 156, forming the conductive elements 170 on the seed layer material blanket layer, patterning the seed layer material blanket layer by using the conductive elements 170 as a mask. In some embodiments, the seed layer material blanket layer is formed on the dielectric layers 156 and extends into the openings O4 formed in the dielectric layer 156 and the inter-layer film 155-3 to physically and electrically contact the patterned conductive layer 154-3 exposed by the openings O4, portions of the dielectric layer 156 and portions of the inter-layer film 155-3 (exposed by the openings O4). In other words, the seed layer material blanket layer penetrates through the dielectric layer 156 and the inter-layer film 155-3, and sidewalls of the openings O4 are completely covered by the seed layer material blanket layer. The formation and material of the seed layer material blanket layer are the same or similar to the formation and material of the seed layer 153a, and thus is not repeated herein.

In some embodiments, the formation of the conductive elements 170 may be formed by forming a patterned photoresist layer (not shown) having openings exposing portions of the seed layer 160a by photolithography, and immersing the whole structure including the patterned photoresist layer formed thereon into a plating solution so as to plate the conductive elements 170 on the seed layer material blanket layer corresponding in position to the portions of the seed layer material blanket layer exposed by the openings formed in the patterned photoresist layer. In one embodiment, the patterned photoresist layer may be formed by coating and photolithography processes or the like. In some embodiments, a material of patterned photoresist layer, for example, includes a positive resist material or a negative resist material, that is suitable for a patterning process such as a photolithography process with a mask or a mask-less photolithography process (for instance, an electron-beam (e-beam) writing or an ion-beam writing). Due to the patterned photoresist layer, the size and number of the conductive elements 170 can be easily modified by adjusting the size and number of the openings in the patterned photoresist layer. As shown in FIG. 13, the conductive elements 170, for example, includes copper pillars, copper vias, or the like; the disclosure is not limited thereto.

After the conductive elements 170 are formed, the patterned photoresist layer is removed to expose the seed layer material blanket layer not covered by the conductive elements 170. In one embodiment, the patterned photoresist layer is removed by acceptable ashing process and/or photoresist stripping process, such as using an oxygen plasma or the like, and the disclosure is not limited thereto.

In some embodiments, the seed layer material blanket layer is patterned by using the conductive elements 170 as an etching mask to form the seed-layer patterns 160. For example, the etching process may be a dry etching process, a wet etching process, or a combination thereof; the disclosure is not limited thereto. In other words, the seed layer material blanket layer not covered by the conductive elements 170 are removed to form the seed-layer patterns 160. In some embodiments, as shown in FIG. 13, sidewalls of the seed-layer patterns 160 are aligned with sidewalls of a respective one of the conductive elements 170.

Figure 14:
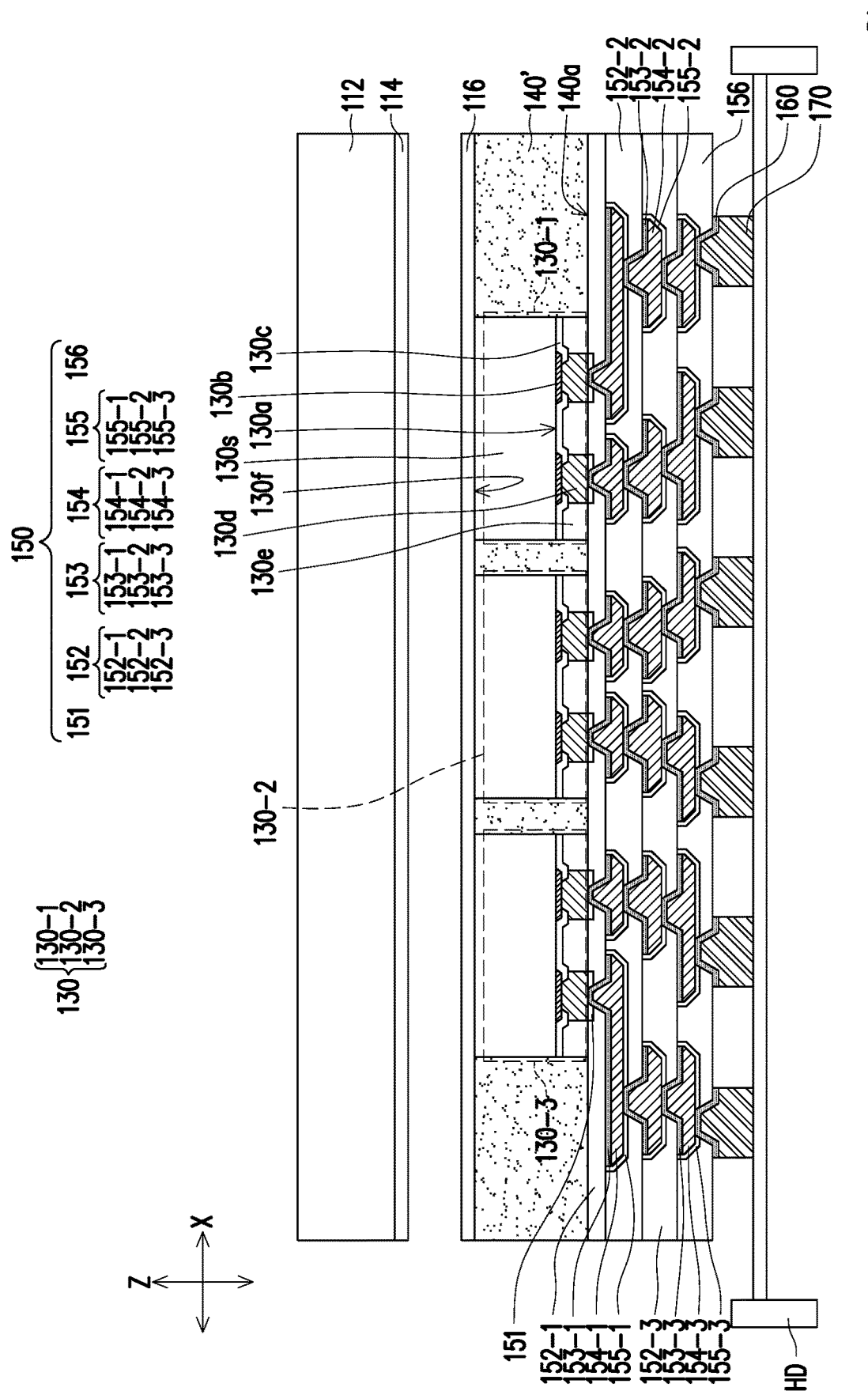

Referring to FIG. 14, in some embodiments, the whole structure depicted in FIG. 13 along with the carrier 112 is flipped (turned upside down), where the conductive elements 170 are placed to a holding device HD, and the carrier 112 is then debonded from the buffer layer 116, in accordance with step S60 of FIG. 16. In some embodiments, the holding device HD may be an adhesive tape, a carrier film or a suction pad. The disclosure is not limited thereto.

In some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 14. In one embodiment, the debonding process is a laser debonding process. During the debonding step, the holding device HD is used to secure the package structure P1 before debonding the carrier 112 and the debond layer 114.

Figure 15:
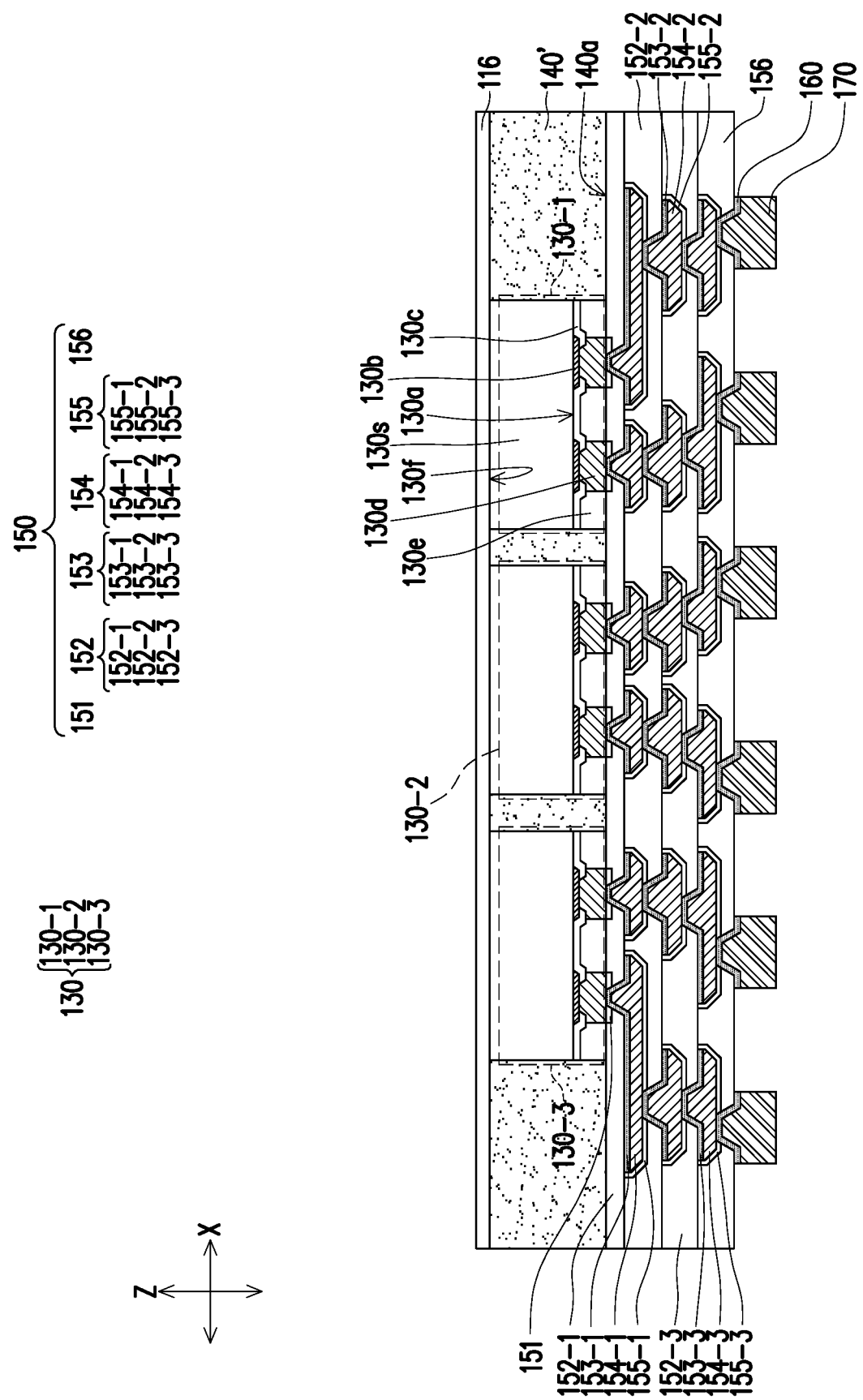

Referring to FIG. 15, in some embodiments, the conductive elements 170 are released from the holding device HD to form the package structure P1. In some embodiments, prior to releasing the conductive elements 170 from the holding device HD, a dicing (singulation) process is performed to cut a plurality of the package structure P1 interconnected therebetween into individual and separated package structure P1. In one embodiment, the dicing (singulation) process is a wafer dicing process including mechanical blade sawing or laser cutting. The disclosure is not limited thereto. Up to here, the manufacture of the package structure P1 is completed.

However, the disclosure is not limited thereto. In alternative embodiments, the conductive elements 170 may include solder balls or ball grid array (BGA) balls, see a package structure P2 depicted in FIG. 19. In other alternative embodiments, a plurality of conductive pillars CP may be further included in a package structure, see a package structure P3 depicted in FIG. 20.

Figure 19:
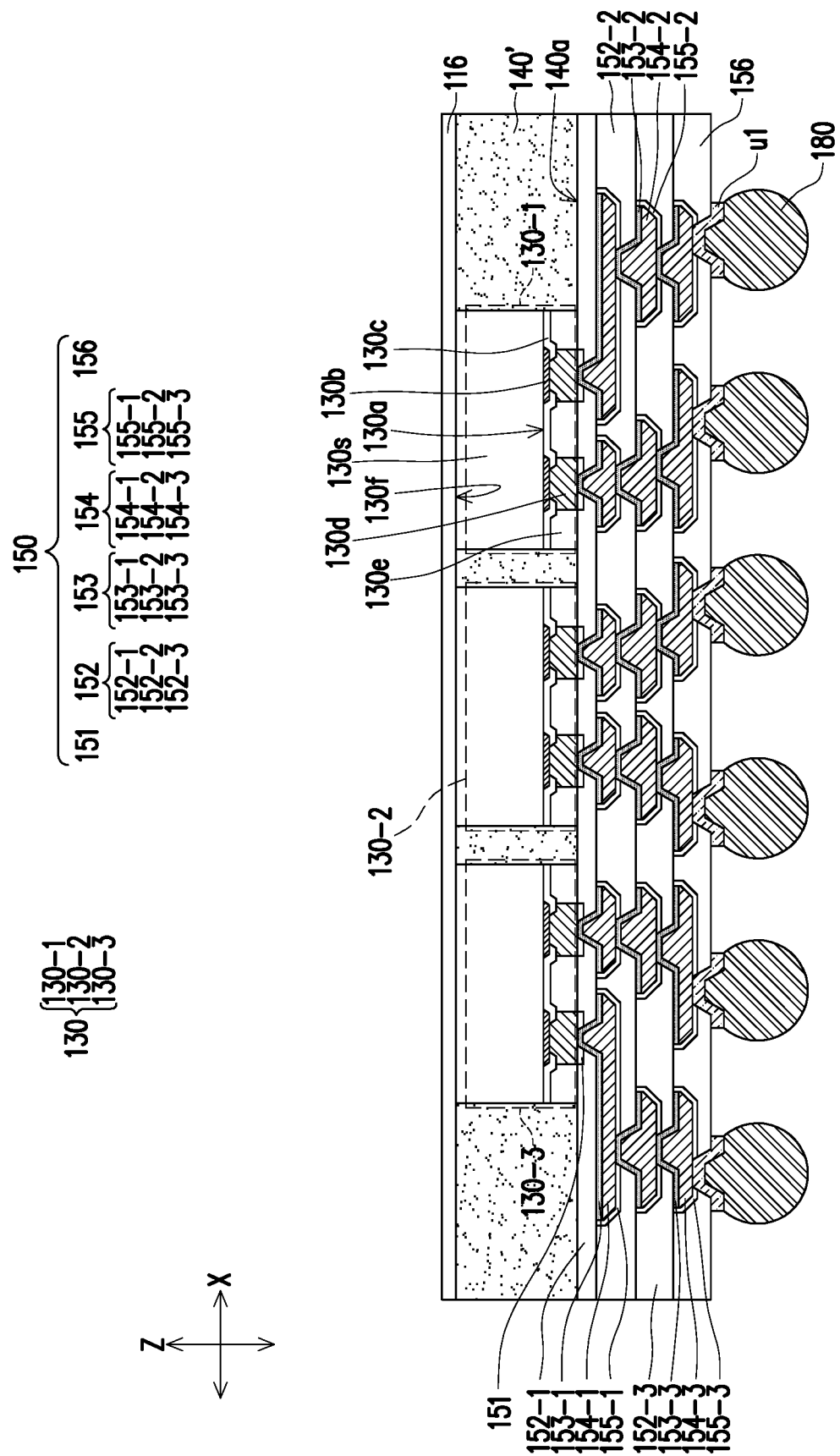
FIG. 19 is a schematic cross sectional view of a package structure in accordance with some exemplary embodiments of the present disclosure.

FIG. 19 is a schematic cross sectional view of a package structure according to some exemplary embodiments of the present disclosure. Referring to FIG. 15 and FIG. 19 together, the package structure P1 depicted in FIG. 15 and the package structure P2 depicted in FIG. 19 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. With such embodiment of which the conductive elements 170 are solder balls or BGA balls as shown in FIG. 19, the seed layer patterns 160 are replaced with under-ball metallurgy (UBM) patterns u1 to avoid the solder material diffusing from the conductive elements 170 to the redistribution circuit structure 150, thereby ensuring the performance of the package structure P2. In some embodiments, the materials of the UBM patterns u1 may include copper, nickel, titanium, tungsten, or alloys thereof or the like, and may be formed in a manner of a multi-layer (e.g. with different materials in any two adjacent layers in the UBM patterns u1) by an electroplating process, for example. The number of the UBM patterns u1 is not limited in this disclosure.

Figure 20:
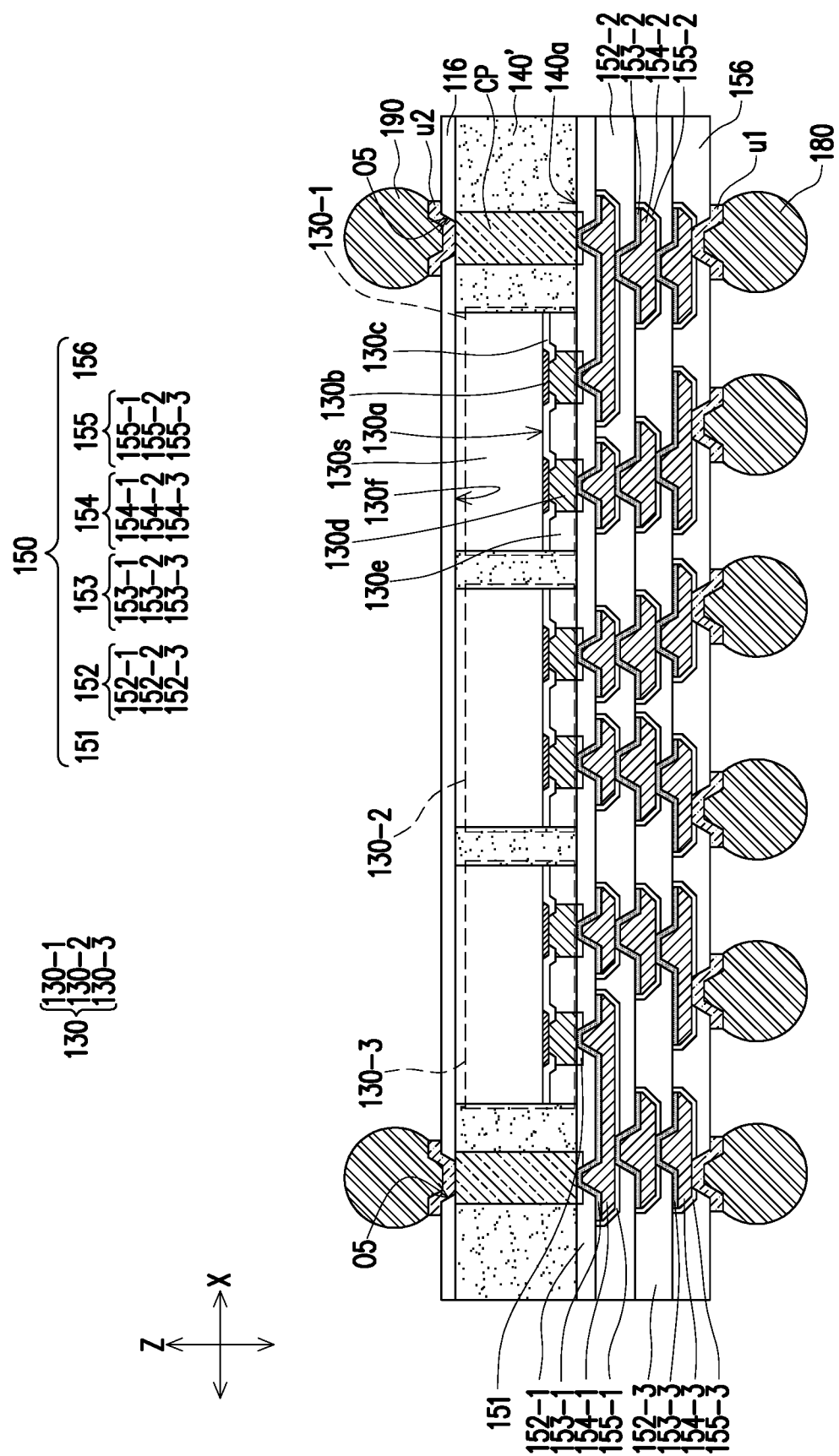
FIG. 20 is a schematic cross sectional view of a package structure in accordance with some exemplary embodiments of the present disclosure.

FIG. 20 is a schematic cross sectional view of a package structure according to some exemplary embodiments of the present disclosure. Referring to FIG. 19 and FIG. 20 together, the package structure P2 depicted in FIG. 19 and the package structure P3 depicted in FIG. 20 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. With such embodiment of which the conductive pillars CP are included as shown in FIG. 20, where the conductive pillars CP are arranged aside of the semiconductor dies 130 along the direction X and are embedded in the insulating encapsulation 140'. In some embodiments, the conductive pillars CP may be through vias, such as through integrated fan-out (InFO) vias. For simplification, only two conductive pillars CP are presented in FIG. 20 for illustrative purposes, however it should be noted that the number of the conductive pillars CP may be less than two or more than two; the disclosure is not limited thereto. The number of the conductive pillars CP to be formed can be selected based on the demand.

In some embodiments, two ends of each of the conductive pillars CP are exposed by the insulating encapsulation 140'. For example, the conductive pillars CP are sandwiched between the buffer layer 116 and the redistribution circuit structurer 150, where a first end of each of the conductive pillars CP is physically connected to the redistribution circuit structure 150, and the conductive pillars CP are electrically connected to the semiconductor dies 130 through the redistribution circuit structure 150. For example, the conductive pillars CP are formed on the buffer layer 116 by photolithography, plating, photoresist stripping processes or any other suitable method. In one embodiment, the conductive pillars CP may be formed by, but not limited to, forming a mask pattern (not shown) covering the buffer layer 116 with openings exposing portions of the buffer layer 116, forming a metallic material filling the openings to form the conductive pillars CP by electroplating or deposition, and then removing the mask pattern. For example, the material of the conductive pillars CP may include a metal material such as copper or copper alloys, or the like. However, the disclosure is not limited thereto.

Continued on FIG. 20, in some embodiments, a plurality of openings O5 are formed in the buffer layer 116 to exposing a second end of each of the conductive pillars CP. The number of the openings O5 is not limited in the disclosure, and may be designated based on the demand and design layout. In certain embodiments, a plurality of conductive elements 190 are respectively formed on the second end of each of the conductive pillars CP exposed by the openings O5, and a plurality of UBM patterns u2 are respectively formed to be located between one of the conductive pillars CP and a respective one of the conductive elements 190. However, the disclosure is not limited thereto, in alternative embodiments, the UBM patterns u2 may be omitted based on the design layout and demand. The formation and material of the conductive elements 190 are the same or similar to the formation and material of the conductive elements 180, and formation and material of the UBM patterns u2 are the same or similar to the formation and material of the UBM patterns u1, and thus are not repeated herein. As shown in FIG. 20, the conductive elements 190 are electrically connected to the semiconductor dies 130 through the UBM patterns u2, the conductive pillars CP, and the redistribution circuit structure 150. For example, after the conductive elements 190 are disposed on the conductive pillars CP, the package structure P3 having dual-side terminal is accomplished.

In further alternative embodiments, in addition to the conductive elements 170 in FIG. 13 and/or the conductive elements 180 in FIG. 19 to FIG. 20, an additional semiconductor element(s) (not shown) may be disposed on the redistribution circuit structure 150 through the seed layer patterns 160 and/or the UBM patterns u1, u2 for electrically connecting to at least one of the semiconductor dies 130. In some embodiments, the additional semiconductor element(s) may include a passive component or active component. The number of the additional semiconductor element(s) is not limited in the disclosure, and may be designated based on the demand and design layout.

Figure 30:
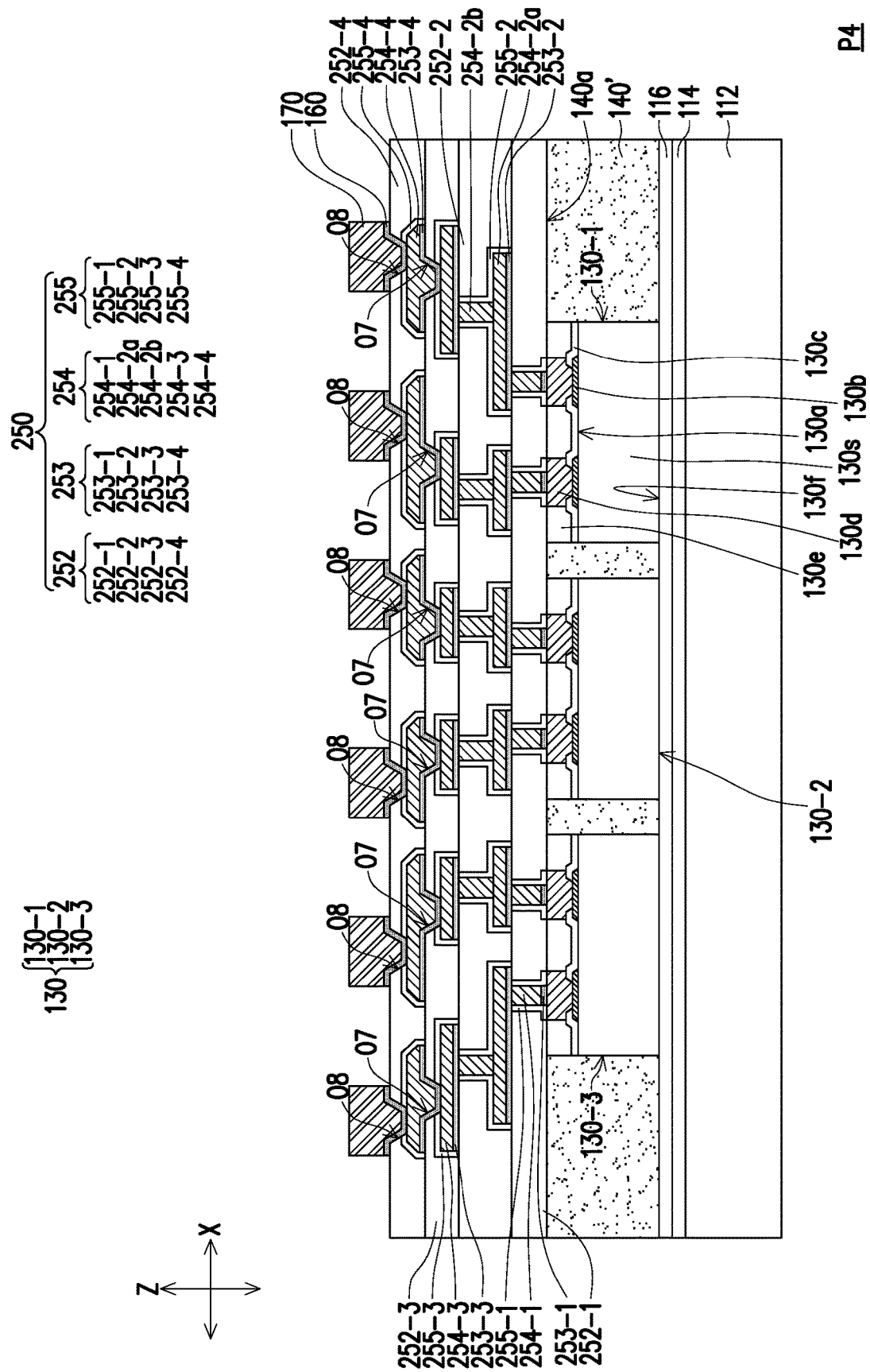
Figure 31:
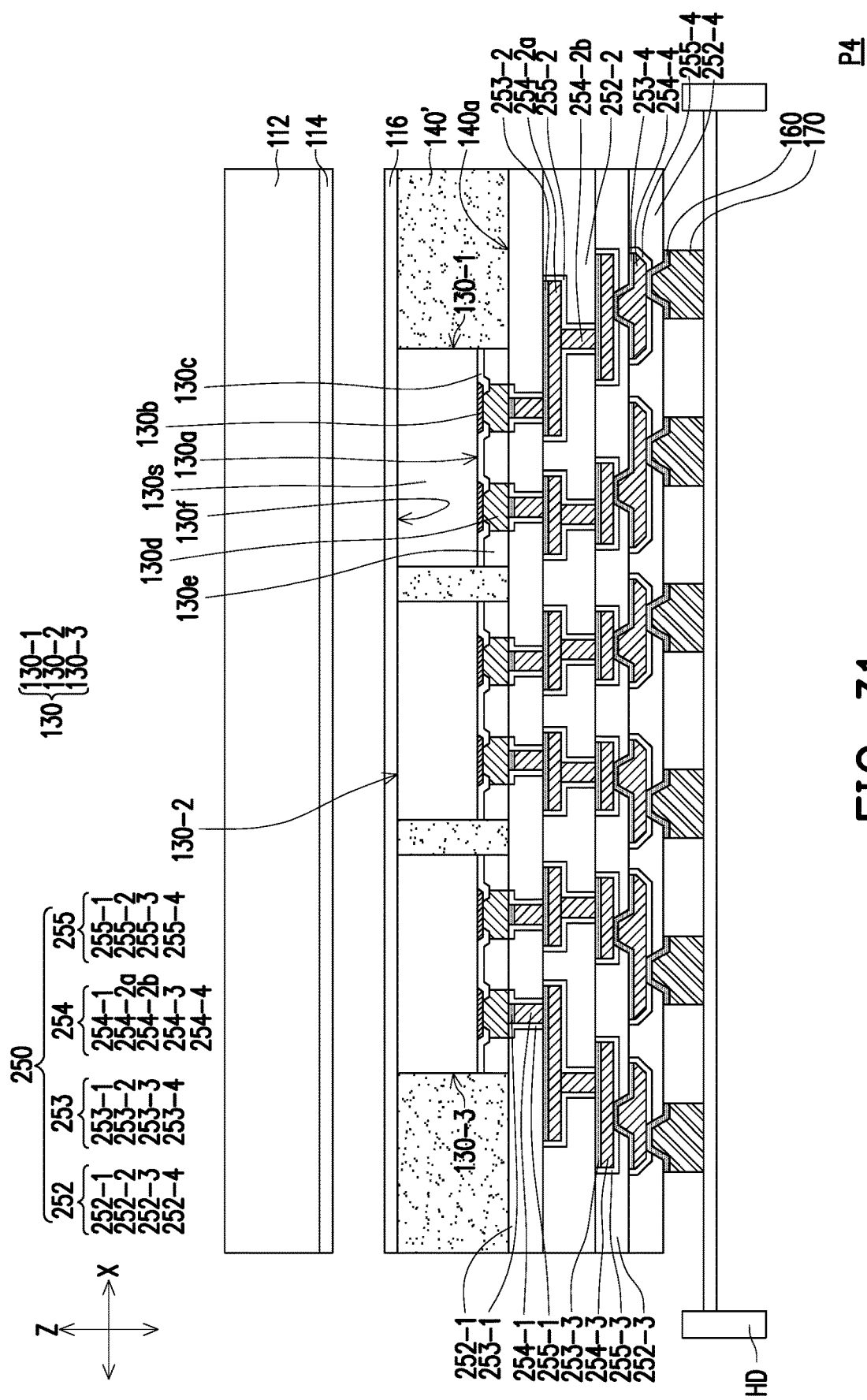
Figure 32:
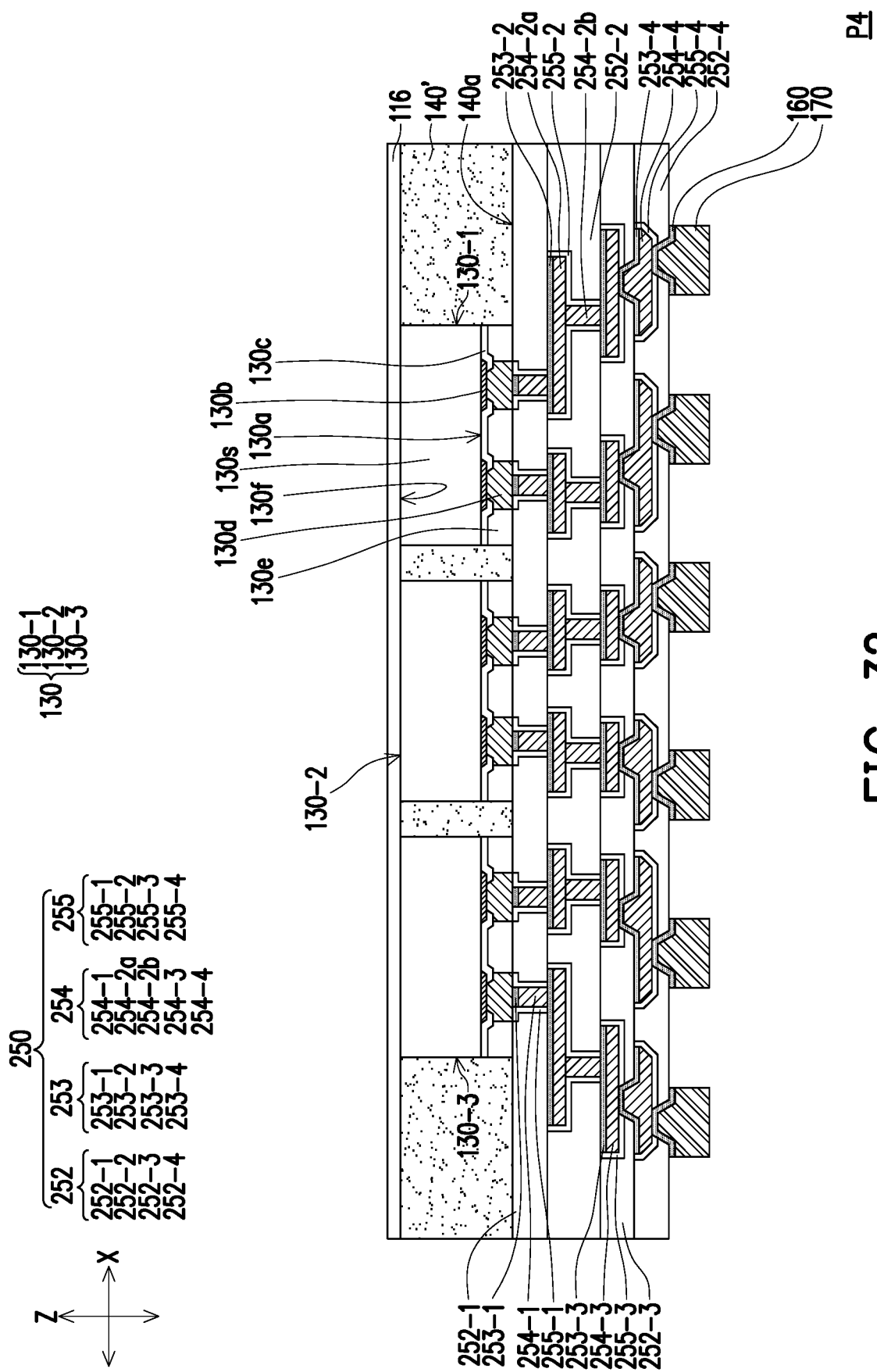
Figure 33:
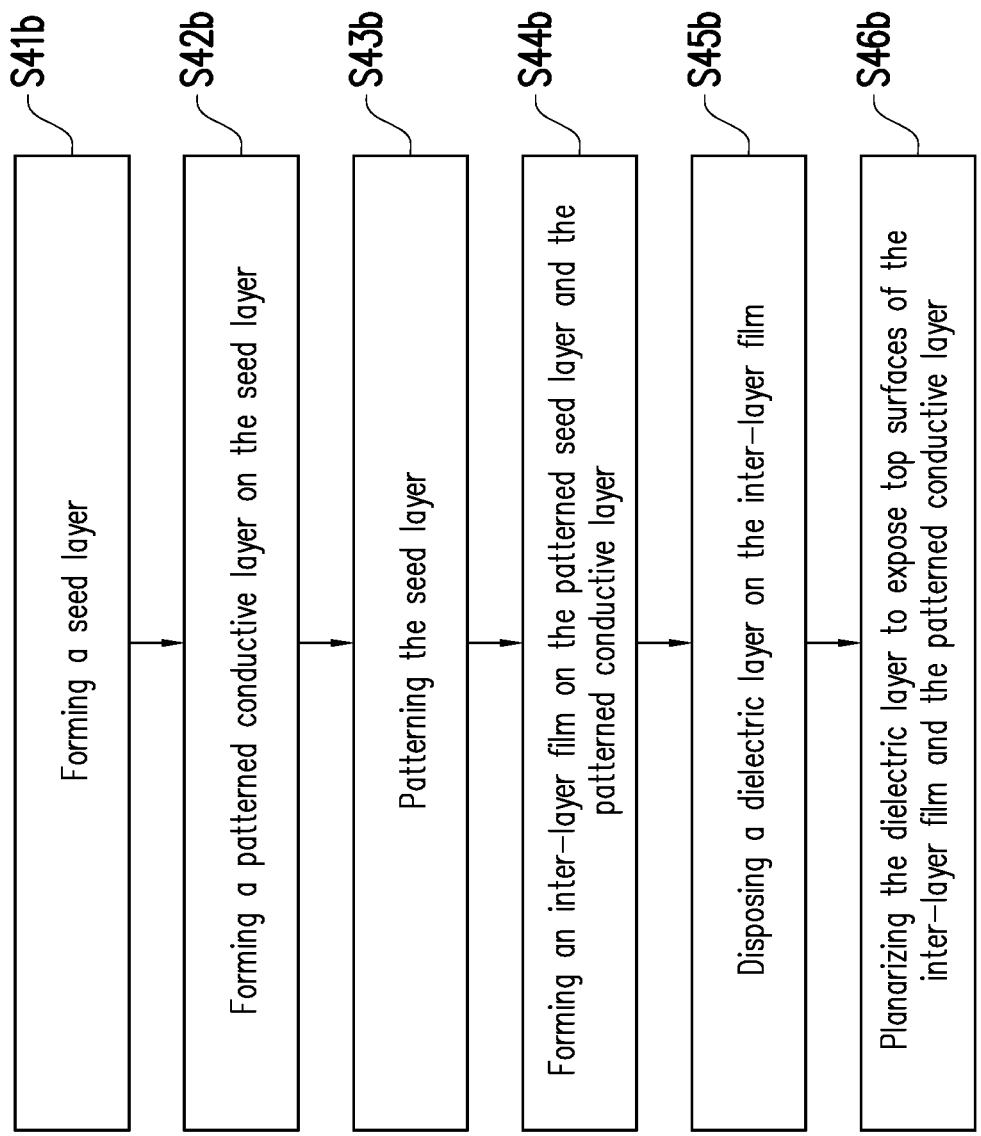
FIG. 33 is a flow chart illustrating a method of manufacturing a redistribution circuit structure/layer of a package structure in accordance with some embodiments of the disclosure.

FIG. 21 to FIG. 32 are schematic cross sectional views of various stages in a manufacturing method of a package structure in accordance with some embodiments of the disclosure. FIG. 33 is a flow chart illustrating a method of manufacturing a redistribution circuit structure/layer of a package structure in accordance with some embodiments of the disclosure. The elements similar to or substantially the same as the elements described previously will use the same reference numbers, and certain details or descriptions of the same elements would not be repeated herein. Referring to FIG. 15 and FIG. 32, a package structure P4 depicted in FIG. 32 is similar to the package structure P1 depicted in FIG. 15; the difference is that, in the package structure P4, the redistribution circuit structure 150 is replaced by a redistribution circuit structure 250.

In some embodiments, the redistribution circuit structure 250 is formed on the semiconductor dies 130 and the insulating encapsulation 140' with the processes described in FIG. 21 to FIG. 29. In some embodiments, as shown in FIG. 21 to FIG. 29, the redistribution circuit structure 250 includes a dielectric layer 252 (e.g. a dielectric layer 252-1, a dielectric layer 252-2, a dielectric layer 252-3, and a dielectric layer 252-4), a seed layer 253 (e.g. a seed layer 253-1, a seed layer 253-2, a seed layer 253-3, and a seed layer 253-4), a patterned conductive layer 254 (e.g. a patterned conductive layer 254-1, a patterned conductive layer 254-2a, a patterned conductive layer 254-2b, a patterned conductive layer 254-3, and a patterned conductive layer 254-4), and an inter-layer film 255 (e.g. an inter-layer film 255-1, an inter-layer film 255-2, and an inter-layer film 255-3, and an inter-layer film 255-4). However, in the disclosure, the numbers of layers of the dielectric layer 252, the seed layer 253, the patterned conductive layer 254, and the inter-layer film 255 are not limited to what is depicted in FIG. 21 to FIG. 29, where the numbers of the layers of the dielectric layer 252, the seed layer 253, the patterned conductive layer 254, and the inter-layer film 255 may be one or more than one. In some embodiments, the dielectric layer 252, the seed layer 253, the patterned conductive layer 254 and the inter-layer film 255 are formed on the insulating encapsulation 140' and are sequentially stacked.

Figure 21:
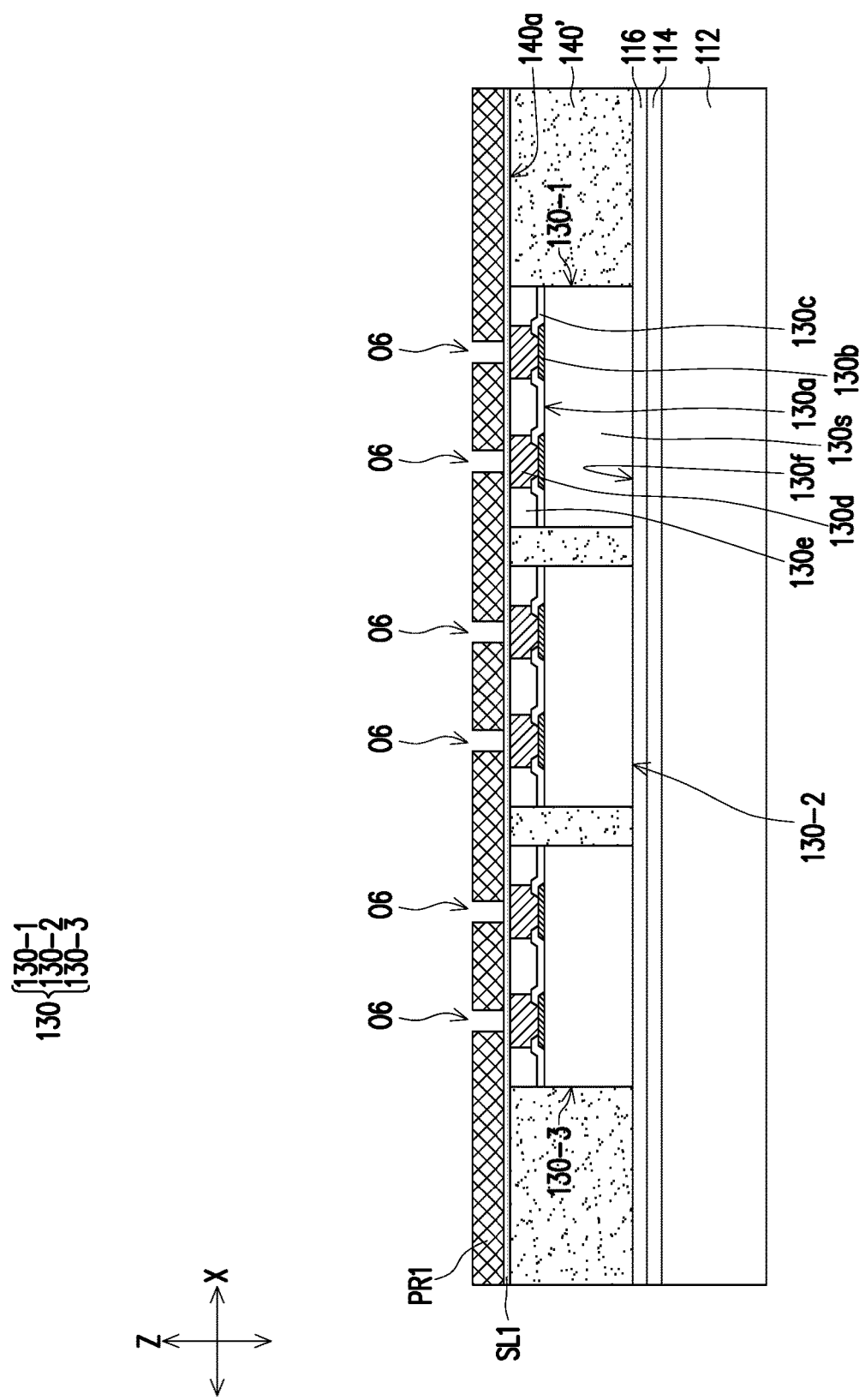
FIG. 21 to FIG. 32 are schematic cross sectional views of various stages in a manufacturing method of a package structure in accordance with some embodiments of the disclosure.

Referring to FIG. 21, in some embodiments, a seed layer SL1 is formed on the semiconductor dies 130 and the insulating encapsulation 140', in accordance with step S41b of FIG. 33, following the process as described in FIG. 3. For example, the seed layer SL1 is formed on the semiconductor dies 130 and the insulating encapsulation 140' in a form of a blanket layer made of metal or metal alloy materials, the disclosure is not limited thereto. In some embodiments, the seed layer SL1 is referred to as a metal layer, which may be a single layer or a composite layer comprising a plurality of sub-layers formed of different materials. In some embodiments, the seed layer SL1 may include titanium, copper, molybdenum, tungsten, titanium nitride, titanium tungsten, combinations thereof, or the like. For example, the seed layer SL1 may include a titanium layer and a copper layer over the titanium layer. The seed layer SL1 may be formed using, for example, sputtering, PVD, or the like. In some embodiments, the seed layer SL1 may be conformally formed on the semiconductor dies 130 and the insulating encapsulation 140' by sputtering. As shown in FIG. 21, in some embodiments, the seed layer SL1 is in physical contact with the conductive vias 130*d* of the semiconductor dies 130 and the top surface 140*a* of the insulating encapsulation 140'.

A patterned photoresist layer PR1 is formed on the seed layer SL1, where the patterned photoresist layer PR1 includes at least one opening O6, for example. In some embodiments, as shown in FIG. 21, a plurality of openings O6 are formed in the patterned photoresist layer PR1. In one embodiment, the patterned photoresist layer PR1 may be formed by coating and photolithography processes or the like. The number of the openings O6 may, for example, correspond to the number of later-formed conductive structure(s) (such as a conductive pillar or conductive via). However, the disclosure is not limited thereto. As shown in FIG. 21, portions of the seed layer SL1 are exposed by the openings O6 formed in the patterned photoresist layer PR1, respectively. In some embodiments, a material of the patterned photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing).

Figure 22:
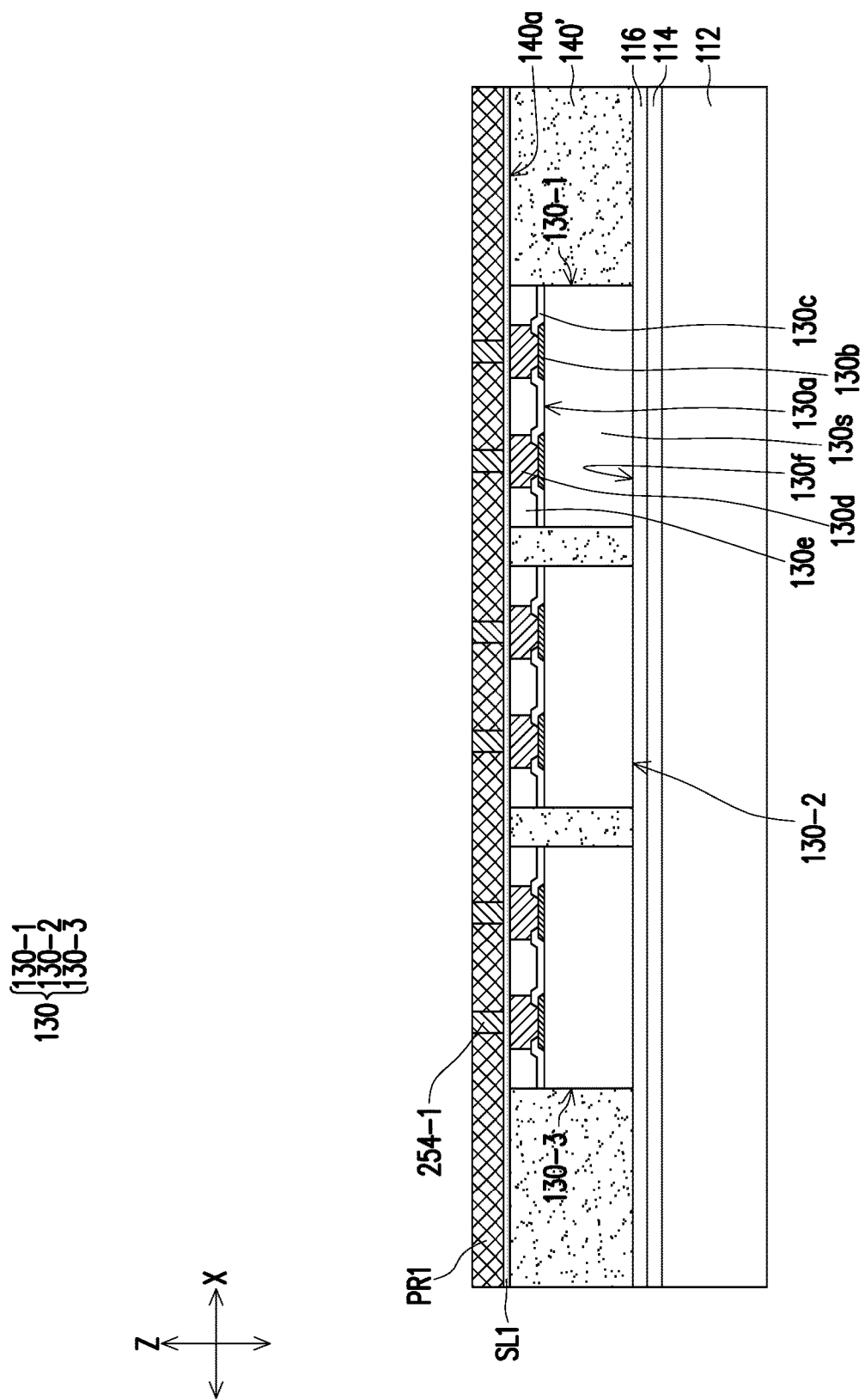

Referring to FIG. 22, in some embodiments, a patterned conductive layer 254-1 are respectively formed in the openings O6, in accordance with step S42*b* of FIG. 33. In some embodiments, the patterned conductive layer 254-1 are formed by plating process or any other suitable method, which the plating process may include electroplating or electroless plating, or the like. In one embodiment, the patterned conductive layer 254-1 may be formed by forming a metallic material filling the openings O6 to form the patterned conductive layer 254-1 by electroplating or deposition. In one embodiment, the material of the patterned conductive layer 254-1 may include a metal material such as copper or copper alloys, or the like. The number of the patterned conductive layer 254-1 can be selected based on the demand, and adjusted by changing the number of the openings O6. In some embodiments, the material of the patterned conductive layer 254-1 may be the same as the material of the patterned conductive layer 154-1. In other embodiments, the material of the patterned conductive layer 254-1 may be different from the material of the patterned conductive layer 154-1.

Continued on FIG. 22, for example, after the patterned conductive layer 254-1 are formed, the patterned photoresist layer PR1 is removed. In one embodiment, the patterned photoresist layer PR1 is removed by acceptable ashing process and/or photoresist stripping process, such as using an oxygen plasma or the like. The disclosure is not limited thereto.

Figure 23:
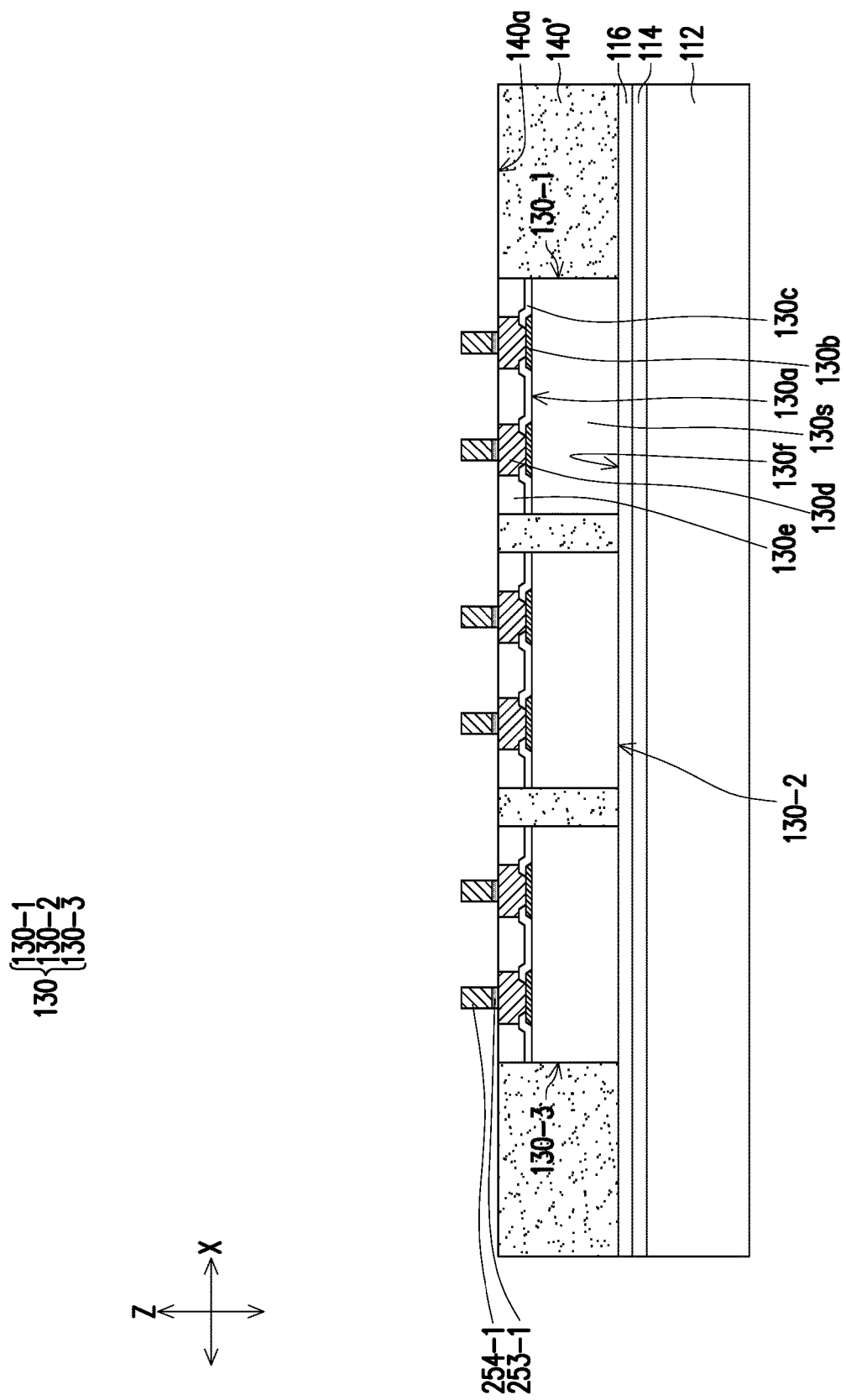

Referring to FIG. 23, in some embodiments, the seed layer SL1 is patterned to form a seed layer 253-1, in accordance with step S43*b* of FIG. 33. In certain embodiments, portions of the seed layer SL1 not covered by the patterned conductive layer 254-1 (depicted in FIG. 22) are removed to form the seed layer 253-1. In some embodiments, the seed layer SL1 is etched to form the seed layer 253-1 by using the patterned conductive layer 254-1 as an etching mask. For example, the etching process may include a dry etching process or a wet etching process. As shown in FIG. 23, the seed layer 253-1 includes one or more conductive segments which are mechanically and electrically isolated from one another, for example. In certain embodiments, the seed layer 253-1 are mechanically and electrically connected to a respective one of the patterned conductive layer 254-1, as shown in FIG. 23. In some embodiments, sidewalls of the seed layer 253-1 are aligned with sidewalls of a respective one of the patterned conductive layer 254-1. As shown in FIG. 23, the patterned conductive layer 254-1 are electrically connected to the semiconductor dies 130 through the seed layer 253-1. In some embodiments, the material of the seed layer 253-1 may be the same as the material of the seed layer 153-1. In other embodiments, the material of the seed layer 253-1 may be different from the material of the seed layer 153-1.

Figure 24:
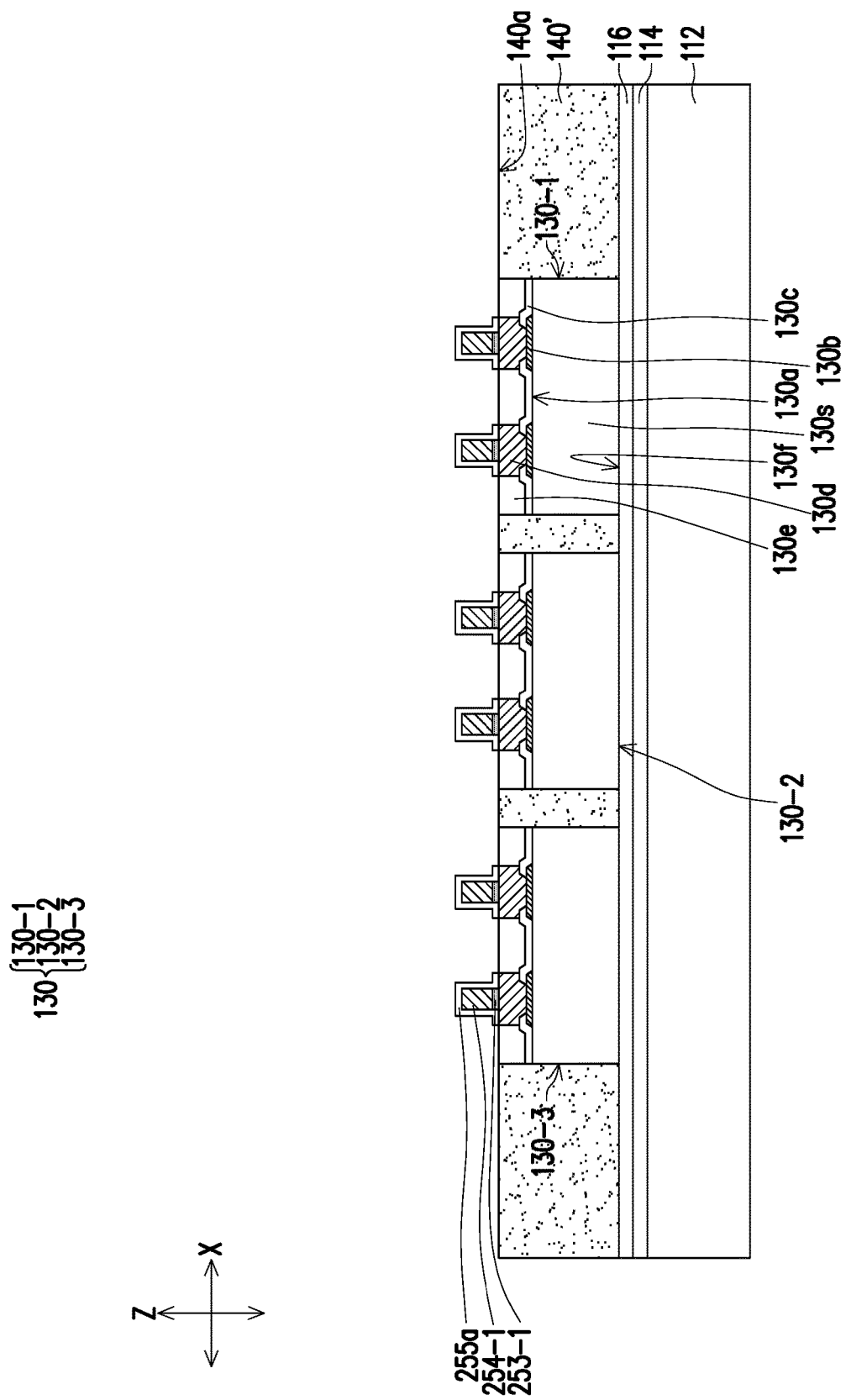

Referring to FIG. 24, in some embodiments, an inter-layer film 255*a* are formed to cover the seed layer 153-1 and the patterned conductive layer 254-1, in accordance with step S44*b* of FIG. 33. The formation and material of the inter-layer film 255*a* are the same or similar to process of forming the inter-layer film 151*a* as described in FIG. 4 and in accordance with the method of FIG. 18, and thus are not repeated herein. As shown in FIG. 24, for example, the patterned conductive layer 254-1 are wrapped around by the inter-layer film 255*a* and the seed layer 253-1.

Figure 25:
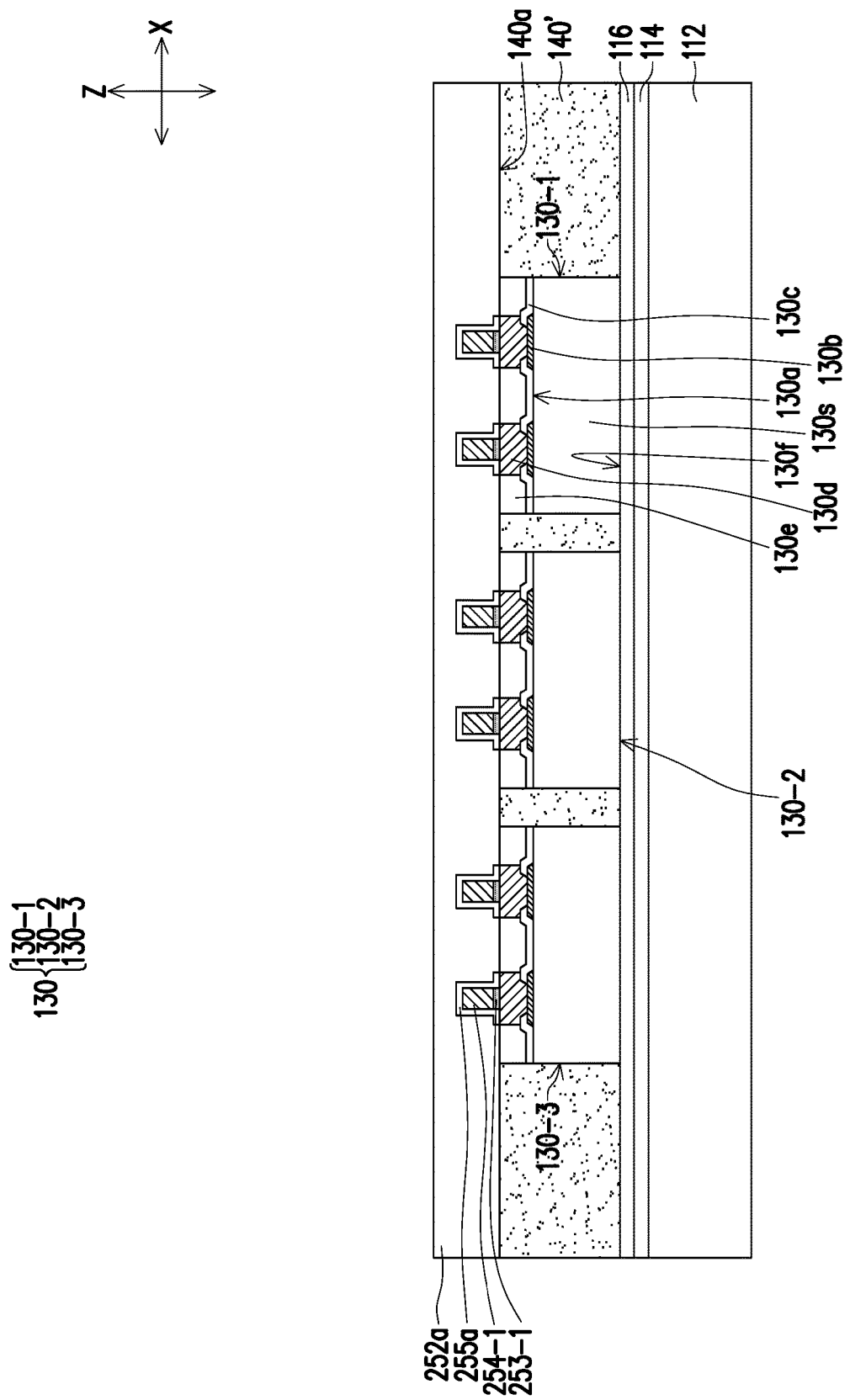

Referring to FIG. 25, in some embodiments, a dielectric layer 252*a* is formed on the inter-layer film 255*a*, in accordance with step S45*b* of FIG. 33. The dielectric layer 252*a* is formed by, but not limited to, forming a blanket layer of dielectric material over the structure depicted in FIG. 24 to completely cover the inter-layer film 155*a* and the semiconductor dies 130 and the insulating encapsulation 140' exposed by the inter-layer film 155*a*. In some embodiments, the material of the dielectric layers 252*a* may be polyimide, PBO, BCB, a nitride such as silicon nitride, an oxide such as silicon oxide, PSG, BSG, BPSG, a combination thereof or the like. In some embodiments, the dielectric layer 252*a* may be formed by suitable fabrication techniques such as spin-on coating, CVD (e.g. PECVD), or the like.

Figure 26:
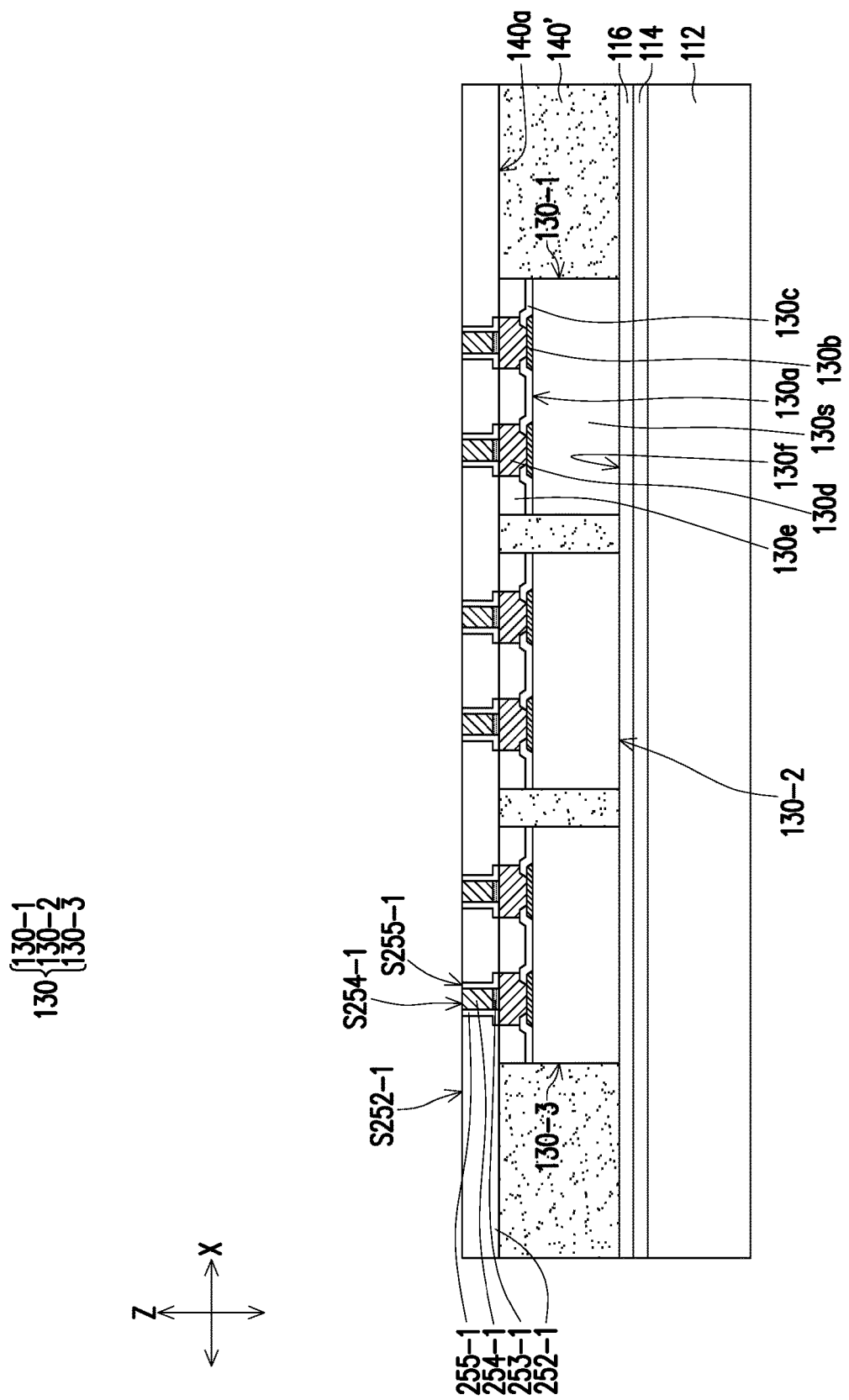

Referring to FIG. 26, in some embodiments, a planarizing step is performed on the dielectric layer 252*a* to form a dielectric layer 252-1, in accordance with step S46*b* of FIG. 33. The dielectric layer 252*a* may be planarized by mechanical grinding or CMP, for example. In some embodiments, the material of the dielectric layer 252*a* may be the same as the material of the dielectric layer 152-1. In other embodiments, the material of the dielectric layer 252*a* may be different from the material of the dielectric layer 152-1.

During planarizing the dielectric layer 252*a*, the inter-layer film 255*a* are also planarized to form an inter-layer film 255-1 exposing top surfaces S254-1 of the patterned conductive layer 254-1. As shown in FIG. 26, for example, sidewalls of the patterned conductive layer 254-1 and the seed layer 253-1 are wrapped around by the inter-layer film 255-1. In some embodiments, the material of the inter-layer film 255-1 may be the same as the material of the inter-layer film 155-1. In other embodiments, the material of the inter-layer film 255-1 may be different from the material of the inter-layer film 155-1. In certain embodiments, the planarizing step may be, for example, performed on the dielectric layer 252*a* to level a top surface S252-1 of the dielectric layer 252-1, the top surfaces S254-1 of the patterned conductive layer 254-1, and top surfaces S255-1 of the inter-layer films 255-1. The top surfaces S254-1 of the patterned conductive layer 254-1 and the top surfaces S255-1 of the inter-layer films 255-1 are accessibly revealed by the top surface S252-1 of the dielectric layer 252-1, for example.

During planarizing the dielectric layer 252*a* and the inter-layer film 255*a*, the patterned conductive layer 254-1 may be also planarized. After the planarizing step, a cleaning step may be optionally performed, for example to clean and remove the residue generated from the planarizing step.

However, the disclosure is not limited thereto, and the planarizing step may be performed through any other suitable method. Due to the inter-layer film 255-1, the adhesive strength between the patterned conductive layer 254-1 and the dielectric layer 252-1 and between the seed layer 253-1 and the dielectric layer 252-1 is enhanced, and the delamination between the patterned conductive layer 254-1 and the dielectric layer 252-1 and between the seed layer 253-1 and the dielectric layer 252-1 is suppressed. In the disclosure, the layers (e.g. the seed layer 253-1, the patterned conductive layer 254-1, the inter-layer film 255-1, and the dielectric layer 252-1) formed in FIG. 21 to FIG. 26 may be referred to as one layer of a second build-up layer of the redistribution circuit structure 250.

Figure 27:
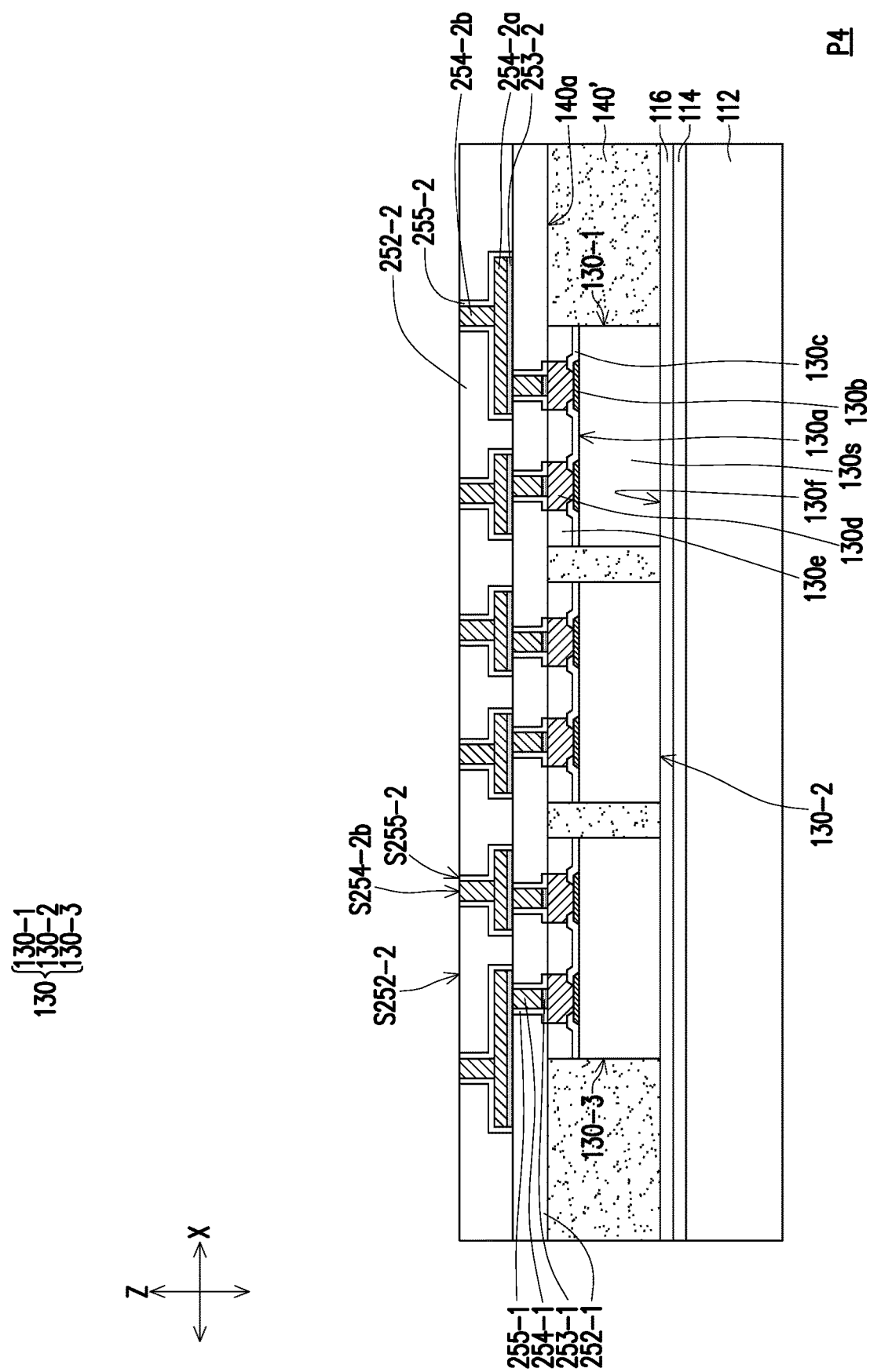

Referring to FIG. 27, in some embodiments, the seed layer 253-2, the patterned conductive layer 254-2a, the patterned conductive layer 254-2b, the inter-layer film 255-2, and the dielectric layer 252-2 are sequentially formed on the dielectric layer 252-1. In the disclosure, the layers (e.g. the seed layer 253-2, the patterned conductive layer 254-2a/254-2b, the inter-layer film 255-2, and the dielectric layer 252-2) formed in FIG. 27 may be referred to as one layer of a third build-up layer of the redistribution circuit structure 250. It is noted that, in the disclosure, the plating processes of the patterned conductive layer 254-2b shares the same seed layer (e.g. the seed layer 253-2) with the plating process of the patterned conductive layer 254-2a, where different patterned photoresist layers with different sizes of openings are used in the formations of the patterned conductive layers 254-2a and 254-2b. That is, the seed layer 253-2 may be utilized as a seed layer for plating both of the patterned conductive layers 254-2a and 254-2b. The materials and the formations of the above patterned photoresist layers with different sizes of openings are the same or similar to the material and the formation of the patterned photoresist layer PR1, and thus are not repeated herein.

In some embodiments, the seed layer 253-2 is directly located on the dielectric layer 252-1, the patterned conductive layer 254-1 and the inter-layer film 255-1. For example, the seed layer 253-2 is electrically connected to the patterned conductive layer 254-1. In some embodiments, the patterned conductive layer 254-2a is located on and electrically connected to the seed layer 253-2. In some embodiments, sidewalls of the seed layer 253-2 are aligned with sidewalls of a respective one of the patterned conductive layer 254-2a. As shown in FIG. 27, the seed layer 253-2 is sandwiched between the patterned conductive layer 254-2a and the patterned conductive layer 254-1, and the patterned conductive layer 254-2a is electrically connected to the patterned conductive layer 254-1 through the seed layer 253-2.

In some embodiments, the patterned conductive layer 254-2b is formed on the patterned conductive layer 254-2a. As shown in FIG. 27, for example, the patterned conductive layer 254-2b is directly located on and electrically connected to the patterned conductive layer 254-2a. In some embodiments, the patterned conductive layer 254-2a is sandwiched between the patterned conductive layer 254-2b and the seed layer 253-2, and the patterned conductive layer 254-2b is electrically connected to the seed layer 253-2 through the patterned conductive layer 254-2a.

The formation and material of the seed layers 253-2 are the same or similar to the formation and material of the seed layer 253-1, and thus are not repeated herein. The formation and material of each of the patterned conductive layers 254-2a/254-2b are the same or similar to the formation and material of the patterned conductive layer 254-1, and thus are not repeated herein.

In some embodiments, the inter-layer film 255-2 covers at least portions of the patterned conductive layer 254-2b, the patterned conductive layer 254-2a, and the seed layer 253-2. As shown in FIG. 27, for example, sidewalls of the patterned conductive layers 254-2a, 254-2b and the seed layers 253-2 are wrapped around by the inter-layer film 255-2, where top surfaces S254-2b of the patterned conductive layer 254-2b are exposed by top surfaces S255-2 of the inter-layer film 255-2. The formation and material of the inter-layer film 255-2 are the same or similar to the formation and material of the inter-layer film 255-1, and thus are not repeated herein.

In some embodiments, the dielectric layer 252-2 is located on the patterned conductive layer 254-2b, the patterned conductive layer 254-2a, the seed layer 253-2, the inter-layer film 255-2, and the dielectric layer 252-1. As shown in FIG. 27, the top surfaces S255-2 of the inter-layer film 255-2 and the top surfaces S254-2b of the patterned conductive layer 254-2b are accessibly revealed by a top surface S252-2 of the dielectric layer 252-2. The formation and material of the dielectric layer 252-2 are the same or similar to the formation and material of the dielectric layer 252-1, and thus are not repeated herein. Due to the inter-layer film 255-2, the adhesive strength between the patterned conductive layer 254-2 and the dielectric layer 252-2 and between the seed layer 253-2 and the dielectric layer 252-2 is enhanced, and the delamination between the patterned conductive layer 254-2 and the dielectric layer 252-2 and between the seed layer 253-2 and the dielectric layer 252-2 is suppressed.

Figure 28:
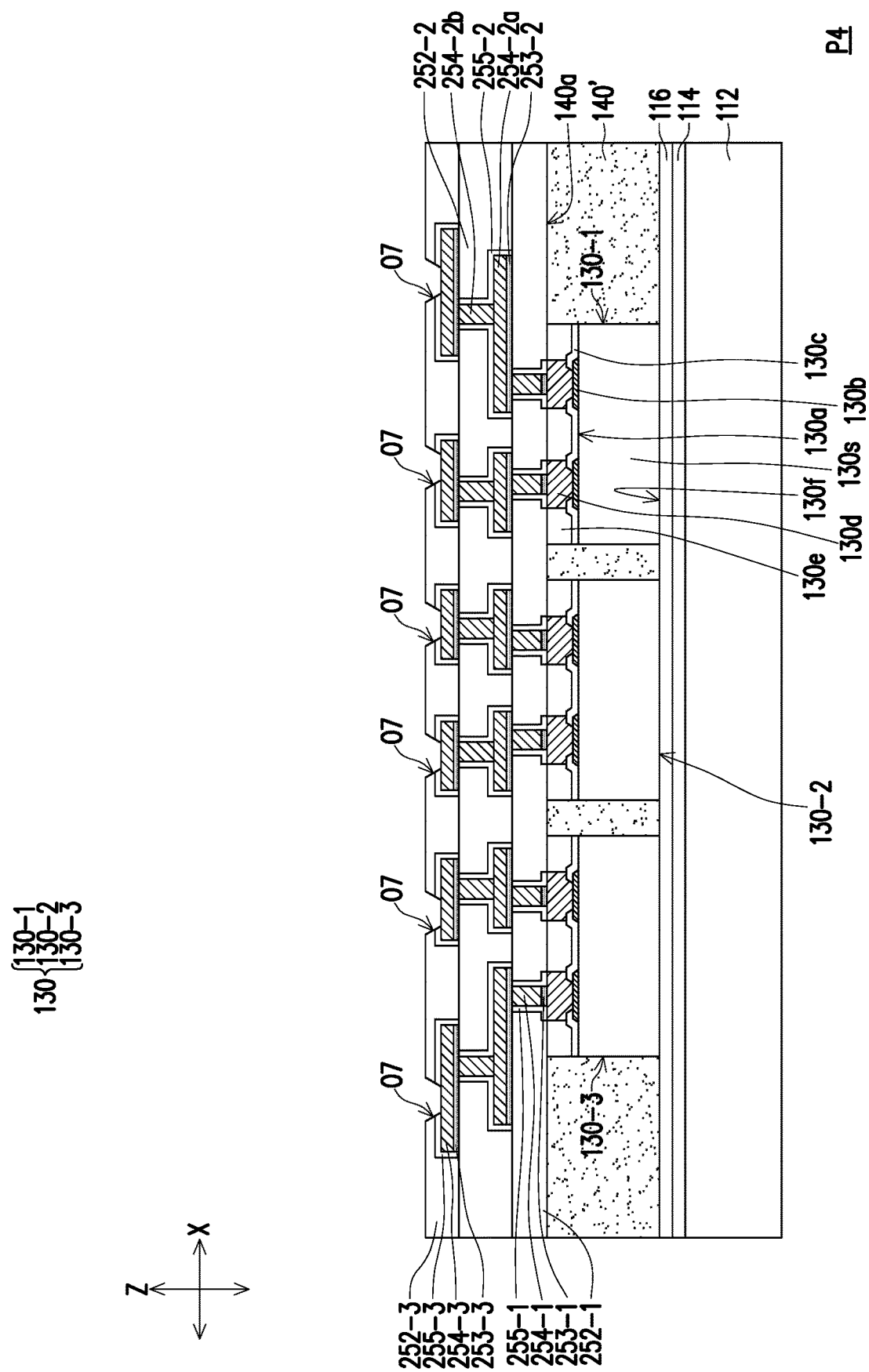

Referring to FIG. 28, in some embodiments, the seed layer 253-3, the patterned conductive layer 254-3, the inter-layer film 255-3, and the dielectric layer 252-3 are sequentially formed on the dielectric layer 252-2. In the disclosure, the layers (e.g. the seed layer 253-3, the patterned conductive layer 254-3, the inter-layer film 255-3, and the dielectric layer 252-3) formed in FIG. 28 may be referred to as one layer of a fourth build-up layer of the redistribution circuit structure 250.

In some embodiments, the seed layer 253-3 is directly located on the dielectric layer 252-2, the patterned conductive layer 254-2b and the inter-layer film 255-2. As shown in FIG. 28, the seed layer 253-3 is electrically connected to the patterned conductive layer 254-2b. In some embodiments, the patterned conductive layer 254-3 is located on and electrically connected to the seed layer 253-3. In some embodiments, sidewalls of the seed layer 253-3 are aligned with sidewalls of a respective one of the patterned conductive layer 254-3. As shown in FIG. 28, the seed layer 253-3 is sandwiched between the patterned conductive layer 254-3 and the patterned conductive layer 254-2b, and the patterned conductive layer 254-3 is electrically connected to the patterned conductive layer 254-2b through the seed layer 253-3. The formation and material of the seed layer 253-3 are the same or similar to the formation and material of the seed layer 253-1, and thus are not repeated herein. The formation and material of the patterned conductive layer 254-3 are the same or similar to the formation and material of the patterned conductive layer 254-1, and thus are not repeated herein.

In some embodiments, the inter-layer film 255-3 is formed to cover the patterned conductive layer 254-3, and the seed layer 253-3. As shown in FIG. 28, for example, sidewalls of the patterned conductive layer 254-3 and the seed layer 253-3 are wrapped around by the inter-layer film 255-3. The formation and material of the inter-layer film 255-3 are the same or similar to the formation and material of the inter-layer film 155-2, and thus are not repeated herein. In some embodiments, the dielectric layer 252-3 is formed on the inter-layer film 255-3, the patterned conductive layer 254-3, the seed layer 253-3, and the dielectric layer 252-2. As shown in FIG. 28, for example, a plurality of openings O7 are form in the dielectric layer 252-3 and the inter-layer film 255-3, where portions of the patterned conductive layer 254-3 are exposed by the openings O7. The formation and material of the dielectric layer 252-3 are the same or similar to the formation and material of the dielectric layer 152-2, and thus are not repeated herein. Due to the inter-layer film 255-3, the adhesive strength between the patterned conductive layer 254-3 and the dielectric layer 252-3 and between the seed layer 253-3 and the dielectric layer 252-3 is enhanced, and the delamination between the patterned conductive layer 254-3 and the dielectric layer 252-3 and between the seed layer 253-3 and the dielectric layer 252-3 is suppressed.

Figure 29:
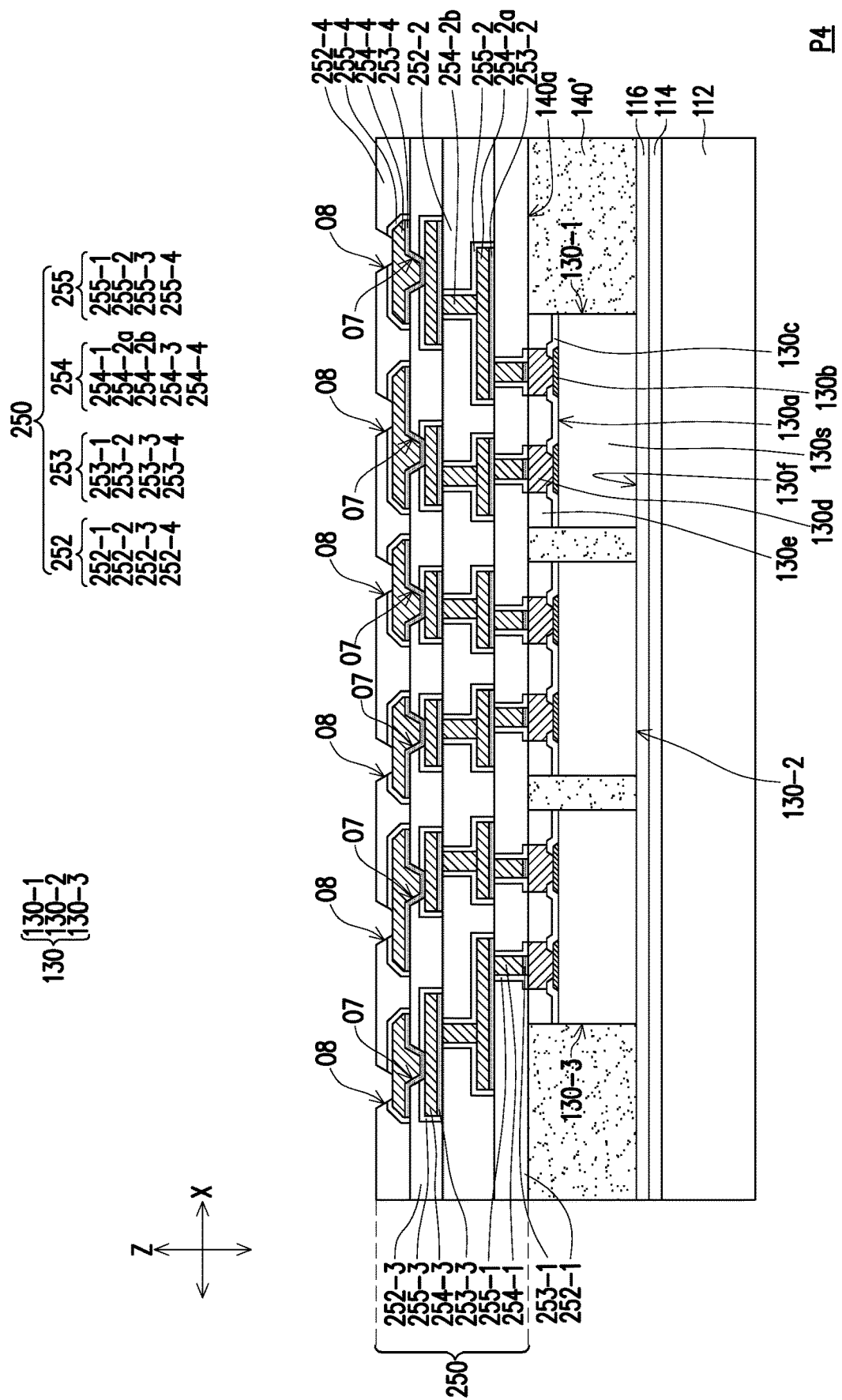

Referring to FIG. 29, in some embodiments, the seed layer 253-4, the patterned conductive layer 254-4, the inter-layer film 255-4, and the dielectric layer 252-4 are sequentially formed. The formations and materials of the seed layer 253-4, the patterned conductive layer 254-4, the inter-layer film 255-4, and the dielectric layer 252-4 are the same or similar to the formations and materials of the seed layer 153-3, the patterned conductive layer 154-3, the inter-layer film 155-3, and the dielectric layer 256, and thus may not be repeated herein. In the disclosure, the layers (e.g. the seed layer 253-4, the patterned conductive layer 254-4, the inter-layer film 255-4, and the dielectric layer 252-4) formed in FIG. 29 may be referred to as one layer of a first build-up layer of the redistribution circuit structure 250.

In some embodiments, the seed layer 253-4 is located on the dielectric layer 252-3 and extends into openings O7 formed in the inter-layer film 255-3 and the dielectric layer 252-3 to physically contact the patterned conductive layer 254-3 exposed by the openings O7. In other words, the seed layer 253-4 penetrates through the dielectric layer 252-3 and the inter-layer film 255-3, and is directly located on the patterned conductive layer 254-3 exposed by the openings O7. In some embodiments, sidewalls of the openings O7 are completely covered by the seed layer 253-4. In some embodiments, the patterned conductive layer 254-4 is located on (e.g. in physical contact with) the seed layer 253-4, where a projection area of the patterned conductive layer 254-4 is overlapped with a projection area of the seed layer 253-4, in the vertical projection on the insulating encapsulation 140' along the direction Z. For example, as shown in FIG. 29, the patterned conductive layer 254-4 is electrically connected to the patterned conductive layer 254-3 through the seed layer 253-4. In some embodiments, the inter-layer film 255-4 and the dielectric layer 252-4 are located on the patterned conductive layer 254-4 and the seed layer 253-4, where the inter-layer film 255-4 is sandwiched between the patterned conductive layer 254-4 and the dielectric layer 252-4 and is sandwiched between the seed layer 253-4 and the dielectric layer 252-4. Due to the inter-layer film 255-4, the adhesive strength between the patterned conductive layer 254-4 and the dielectric layer 252-4 and between the seed layer 253-4 and the dielectric layer 252-4 is enhanced, and the delamination between the patterned conductive layer 254-4 and the dielectric layer 252-4 and between the seed layer 253-4 and the dielectric layer 252-4 is suppressed.

As shown in FIG. 29, portions of the patterned conductive layer 254-4 are exposed by openings O8 formed in the dielectric layer 252-4 and the inter-layer film 255-4 for electrically connecting to later-formed connectors. Upon this, the redistribution circuit structure 250 of the package structure P4 is manufactured. In accordance with the method of FIG. 32 and the processes described in FIG. 21 to FIG. 26, FIG. 27, and/or FIG. 28 (e.g. the use of the second, third and fourth build-up layers), the redistribution circuit structure 250 further obtains a fine pitch structure for routing function. As shown in FIG. 29, the semiconductor dies 130-1, 130-2, 130-3 are electrically communicated to each other through the redistribution circuit structure 250, for example.

For illustration purpose, there are four build-up layers (e.g. one layer of each of the first, second, third, and fourth build-up layers) included in the redistribution circuit structure 250 of FIG. 29; however, the disclosure is not limited thereto. The numbers of the first, second, third, and fourth build-up layers included in the redistribution circuit structure 250 is not limited in the disclosure. For example, the number of the first, second, and third build-up layers included in the redistribution circuit structure 250 may be one or more than one, while the number of the fourth build-up layer included in the redistribution circuit structure 250 may be zero, one or more than one.

Referring to FIG. 30, in some embodiments, a plurality of seed-layer patterns 160 and a plurality of conductive elements 170 are sequentially formed over the redistribution circuit structure 250. Due to the seed-layer patterns 160, the adhesive strength between the conductive elements 170 and the dielectric layer 252-4 is enhanced. In some embodiments, the seed-layer patterns 160 are directly located on the portions of the patterned conductive layer 254-4 exposed by the openings O8 formed in the dielectric layer 252-4 and the inter-layer film 255-4.

In some embodiments, the seed-layer patterns 160 are electrically connected to the redistribution circuit structure 250, and the conductive elements 170 are electrically connected to the redistribution circuit structure 250 through the seed-layer patterns 160. As shown in FIG. 30, for example, the conductive elements 170 are electrically connected to the semiconductor dies 130 through the redistribution circuit structure 250 and respective ones of the seed-layer patterns 160. The formations and materials of the seed-layer patterns 160 and the conductive elements 170 have been described in the process of FIG. 13, and thus are not repeated herein.

Referring to FIG. 31, in some embodiments, the whole structure depicted in FIG. 30 along with the carrier 112 is flipped (turned upside down), where the conductive elements 170 are placed to a holding device HD, and the carrier 112 is then debonded from the buffer layer 116 due to the debond layer 114. During the debonding step, the holding device HD is used to secure the package structure P4 before debonding the carrier 112 and the debond layer 114.

Referring to FIG. 32, in some embodiments, the conductive elements 170 are released from the holding device HD to form the package structure P4. In some embodiments, prior to releasing the conductive elements 170 from the holding device HD, a dicing (singulation) process is performed to cut a plurality of the package structure P4 interconnected therebetween into individual and separated package structure P4. Up to here, the manufacture of the package structure P4 is completed.

In certain embodiments, the conductive elements 170 may include copper pillars, copper vias, or the like, see the package structure P4 depicted in FIG. 32. However, the disclosure is not limited thereto, in alternative embodiments, the conductive elements 170 may include solder balls or BGA balls while replacing the seed layer patterns 160 with the UBM patterns u1, see a package structure P5 depicted in FIG. 34. In other alternative embodiments, the conductive elements 170 may include solder balls or BGA balls while replacing the seed layer patterns 160 with the UBM patterns u1, and a plurality of conductive pillars CP may be further included with the presences of the conductive elements 190 and the UBM patterns u2, see a package structure P6 depicted in FIG. 35. However, the disclosure is not limited thereto, in alternative embodiments, the UBM patterns u2 may be omitted based on the design layout and demand.

Figure 34:
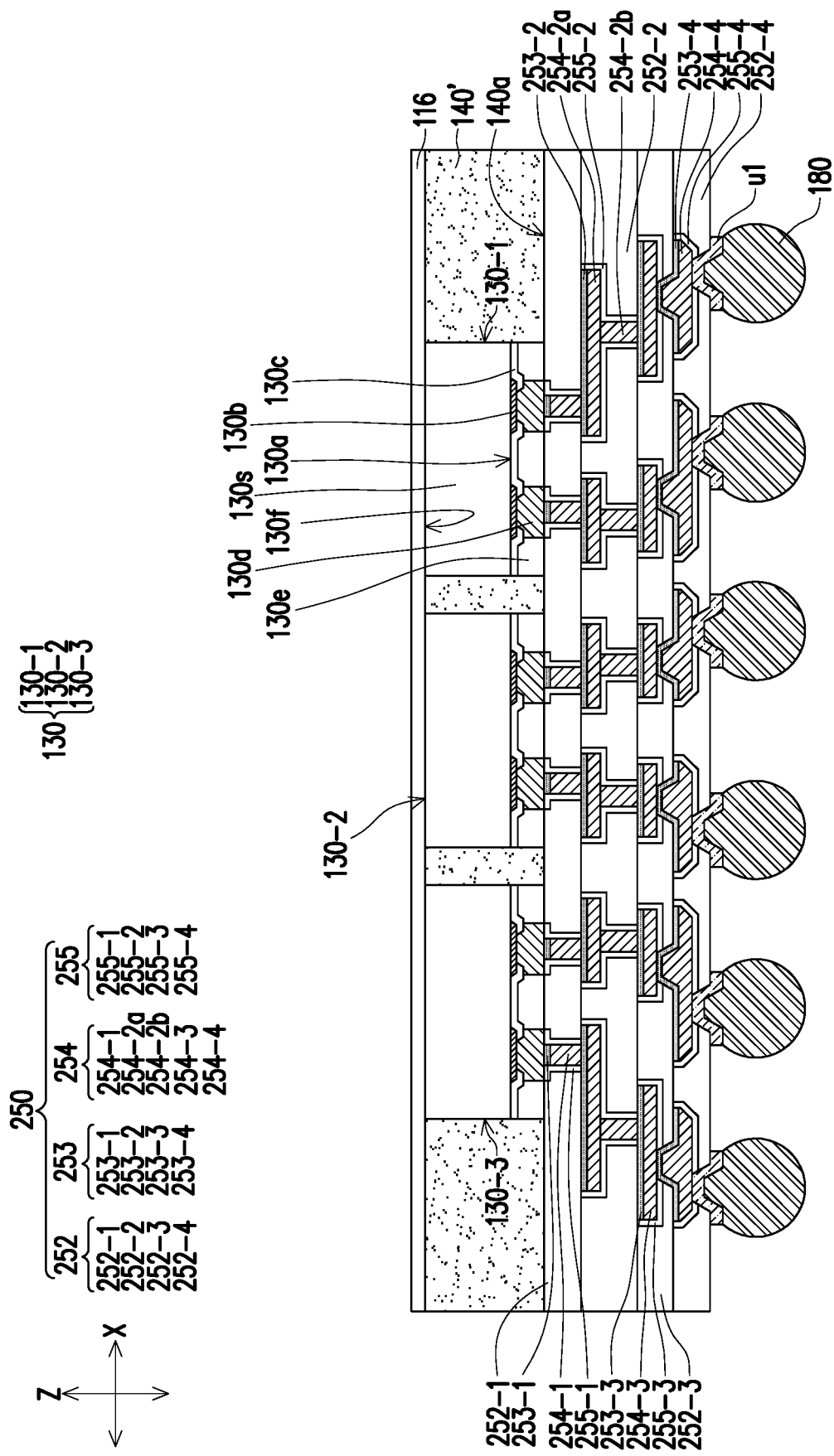
FIG. 34 is a schematic cross sectional view of a package structure in accordance with some exemplary embodiments of the present disclosure.
Figure 35:
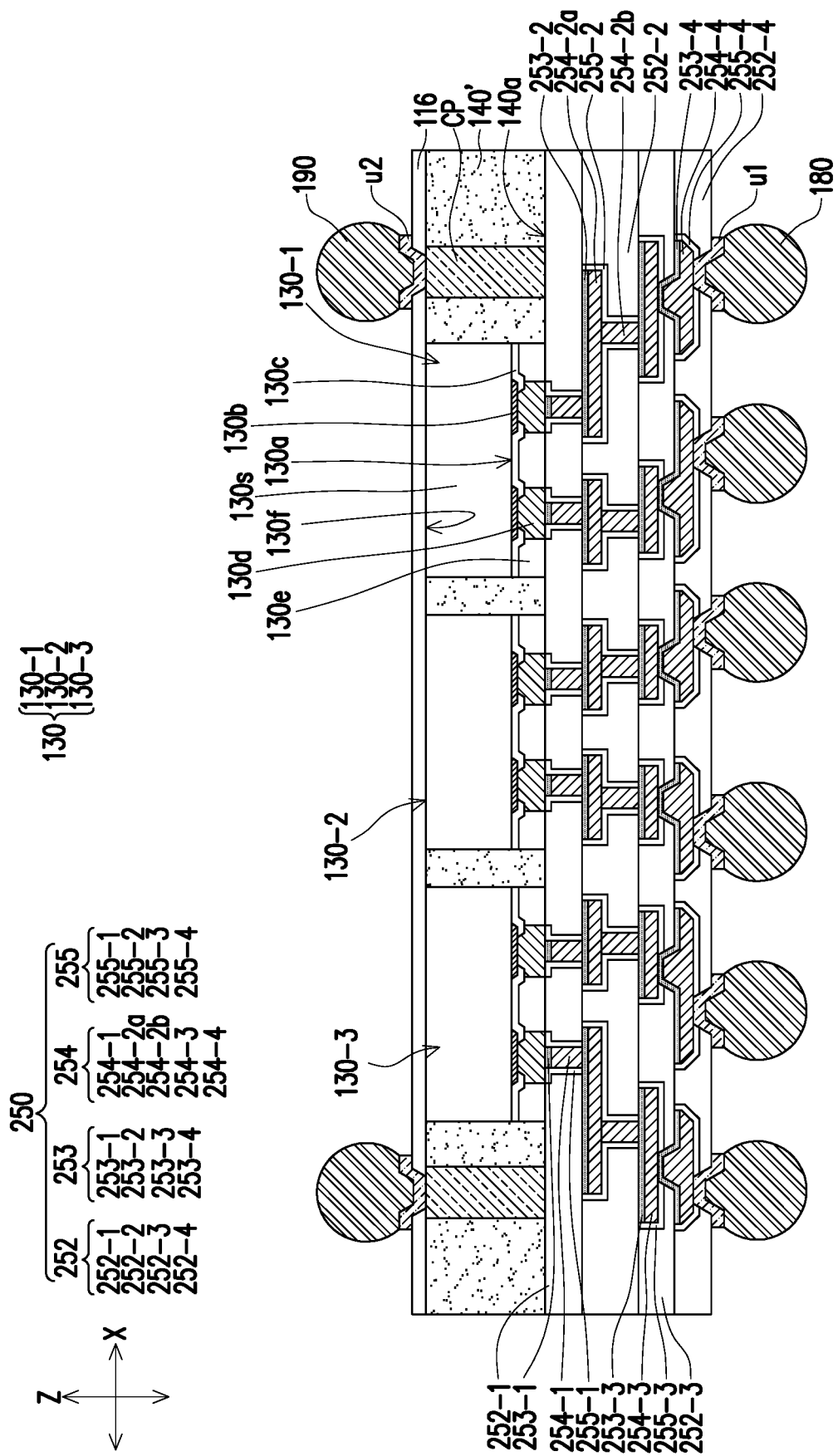
FIG. 35 is a schematic cross sectional view of a package structure in accordance with some exemplary embodiments of the present disclosure.

In further alternative embodiments, in addition to the conductive elements 170 in FIG. 32 and/or the conductive elements 180 in FIG. 34 to FIG. 35, an additional semiconductor element(s) (not shown) may be disposed on the redistribution circuit structure 250 through the seed layer patterns 160 and/or the UBM patterns u1, u2. The additional semiconductor element(s) may include a passive component or active component. The number of the additional semiconductor element(s) is not limited in the disclosure, and may be designated based on the demand and design layout.

As shown in the package structure P1 to the package structure P6, in the redistribution circuit structure 150/250, due to the inter-layer film (e.g. 151/155-1/155-2/155-3, 255-1/255-2/255-3/255-4) is located between the dielectric layer (e.g. 152-1/152-2/152-3/156, 252-1/252-2/252-3/252-4) and the patterned conductive layer (e.g. 154-1/154-2/154-3, 254-1/254-2a/254-2b/254-3/254-4), the dielectric layer (e.g. 152-1/152-2/152-3/156, 252-1/252-2/252-3/252-4) is separated from the patterned conductive layer (e.g. 154-1/154-3/154-3, 254-1/254-2a/254-2b/254-3/254-4) through the inter-layer film (e.g. 151/155-1/155-2/155-3, 255-1/255-2/255-3/255-4), and thus the voids generated therebetween is greatly reduced, thereby suppressing the delamination phenomenon. In addition, as shown in the package structure P1 to the package structure P6, in the redistribution circuit structure 150/250, due to the inter-layer film (e.g. 151, 255-1) is located between the conductive vias (e.g. 130d) and the dielectric layer (e.g. 152-1, 252-1), the dielectric layer (e.g. 152-1, 252-1) is separated from the conductive vias (e.g. 130d) through the inter-layer film (e.g. 151, 255-1), and thus the voids generated therebetween is also reduced, thereby suppressing the delamination phenomenon. In the disclosure, a thickness of each of the inter-layer films 151-1, 155-1 to 155-3, 255-1 to 255-3 is greater than or substantially equal to 50 nm and is less than or substantially equal to 350 nm, as measured along the direction Z. Owing to such configuration, the adhesion strength between one of said patterned conductive layers and a respective one dielectric layer thereof is enhanced, and thus better yield and reliability of the package structure P1 to the package structure P6 is achieved.

Figure 40:
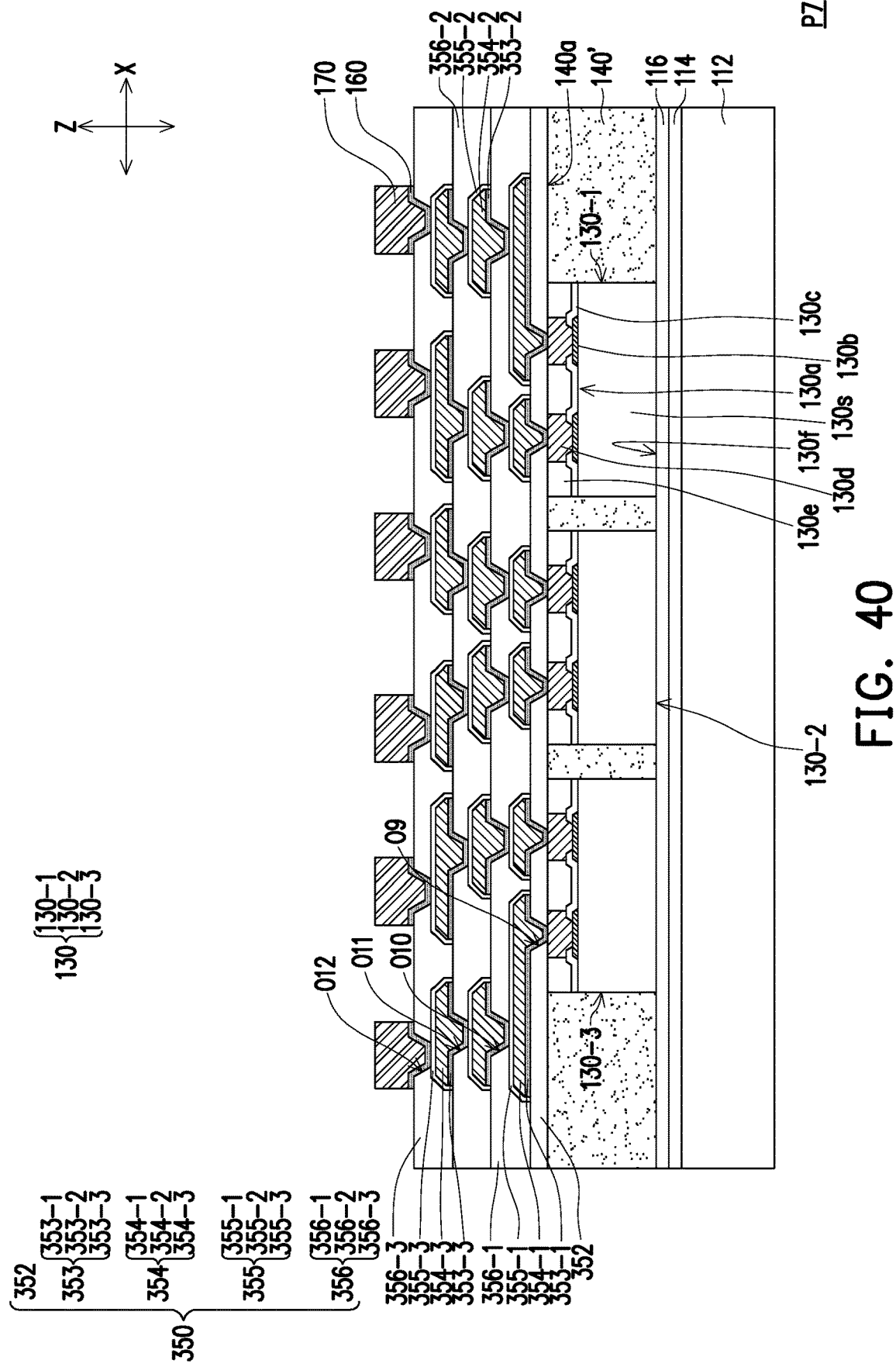
Figure 41:
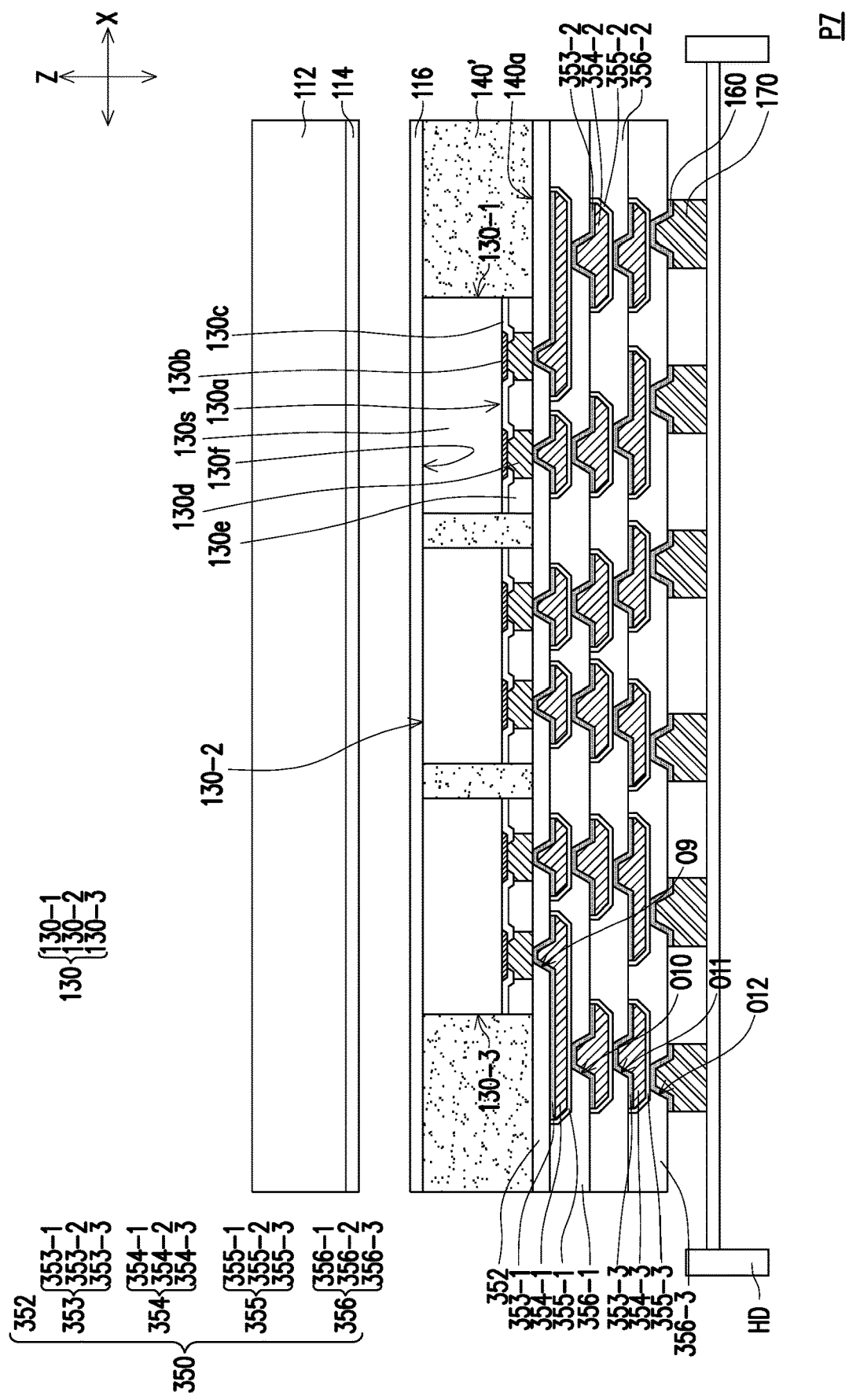
Figure 42:
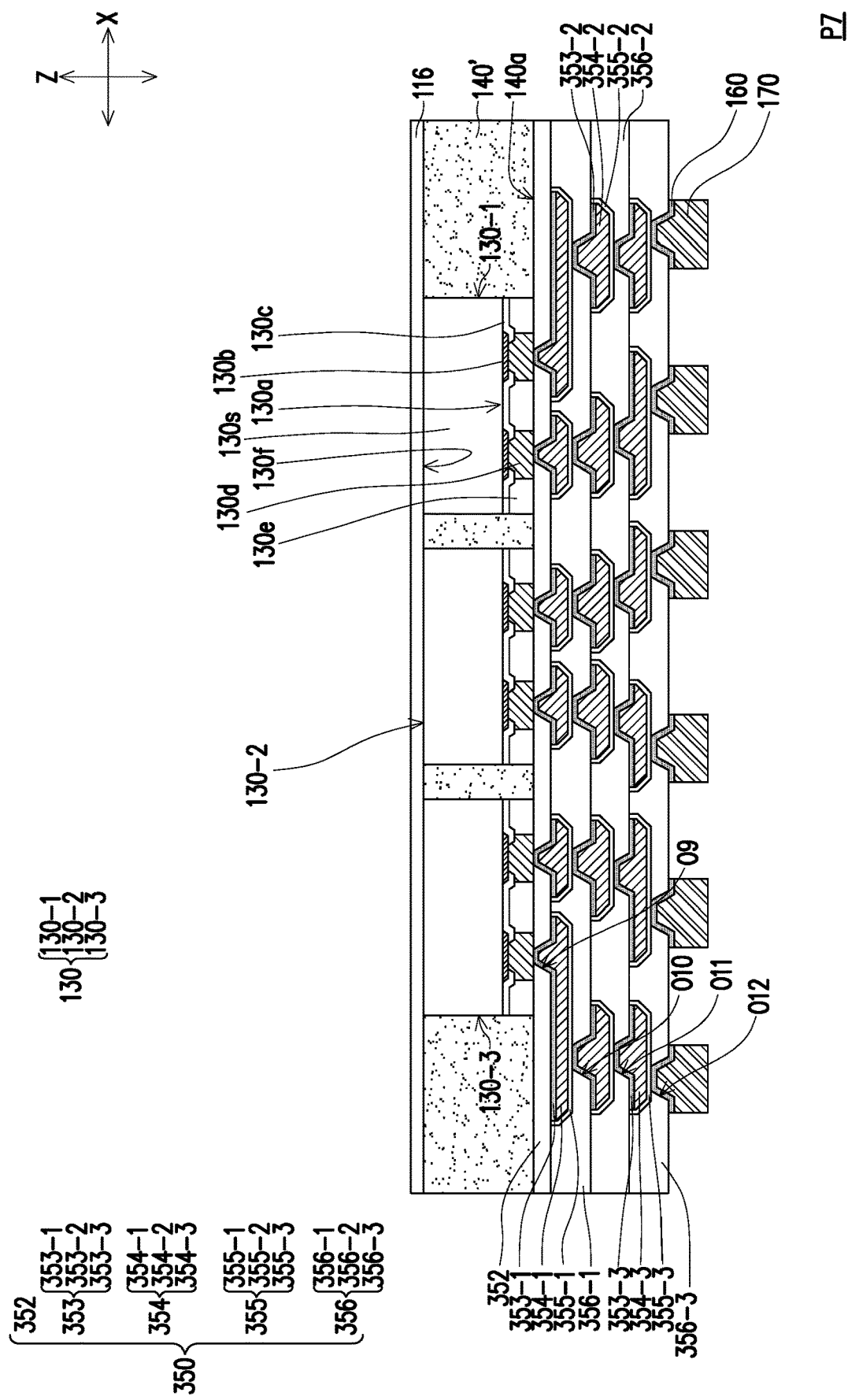
Figure 43:
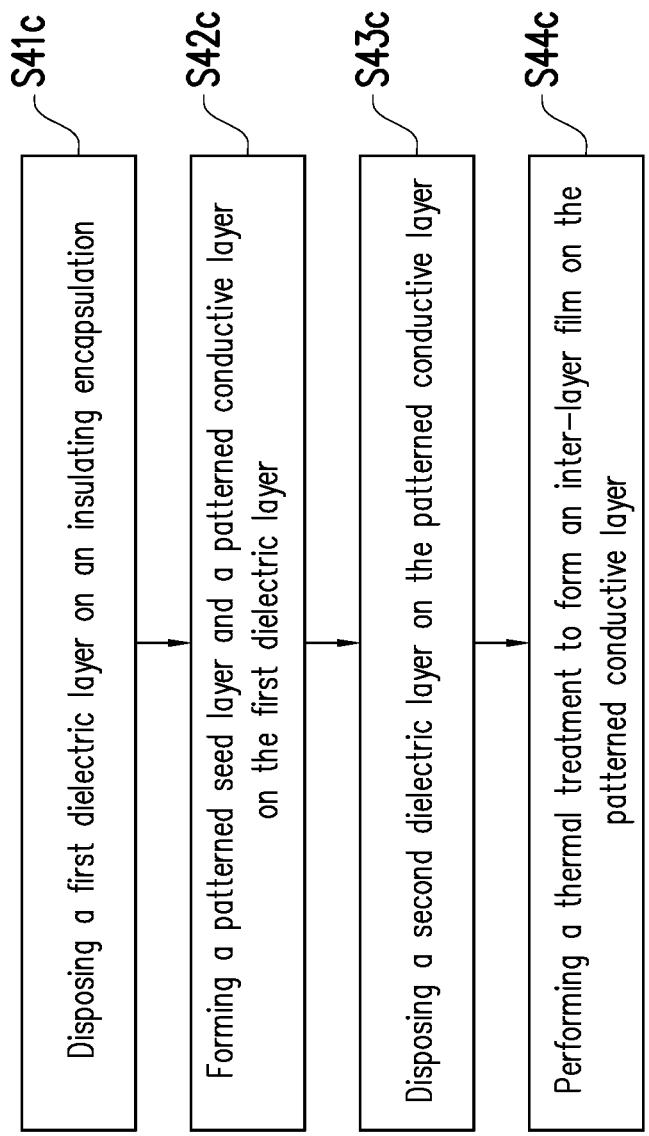
FIG. 43 is a flow chart illustrating a method of manufacturing a redistribution circuit structure/layer of a package structure in accordance with some embodiments of the disclosure.

FIG. 36 to FIG. 42 are schematic cross sectional views of various stages in a manufacturing method of a package structure in accordance with some embodiments of the disclosure. FIG. 43 is a flow chart illustrating a method of manufacturing a redistribution circuit structure/layer of a package structure in accordance with some embodiments of the disclosure. The elements similar to or substantially the same as the elements described previously will use the same reference numbers, and certain details or descriptions of the same elements would not be repeated herein. Referring to FIG. 15 and FIG. 42, a package structure P7 depicted in FIG. 42 is similar to the package structure P1 depicted in FIG. 15; the difference is that, in the package structure P7, the redistribution circuit structure 150 is replaced by a redistribution circuit structure 350.

In some embodiments, the redistribution circuit structure 350 is formed and disposed on the semiconductor dies 130 and the insulating encapsulation 140' with the processes described in FIG. 36 to FIG. 39. In some embodiments, as shown in FIG. 36 to FIG. 39, the redistribution circuit structure 350 includes a dielectric layer 352, a seed layer 353 (e.g. a seed layer 353-1, a seed layer 353-2, and a seed layer 353-3), a patterned conductive layer 354 (e.g. a patterned conductive layer 354-1, a patterned conductive layer 354-2 and a patterned conductive layer 354-3), and an inter-layer film 355 (e.g. an inter-layer film 355-1, an inter-layer film 355-2, and an inter-layer film 255-3), and a dielectric layer 356 (e.g. a dielectric layer 356-1, a dielectric layer 356-2, and a dielectric layer 356-3). However, in the disclosure, the numbers of layers of the seed layer 353, the patterned conductive layer 354, the inter-layer film 355, and the dielectric layer 356 are not limited to what is depicted in FIG. 31 to FIG. 39. The numbers of the layers of the seed layer 253, the patterned conductive layer 254, the inter-layer film 355, and the dielectric layer 356 may be one or more than one. In some embodiments, the seed layer 253, the patterned conductive layer 254, the inter-layer film 355, and the dielectric layer 356 are formed on the dielectric layer 252 and are sequentially stacked.

Figure 36:
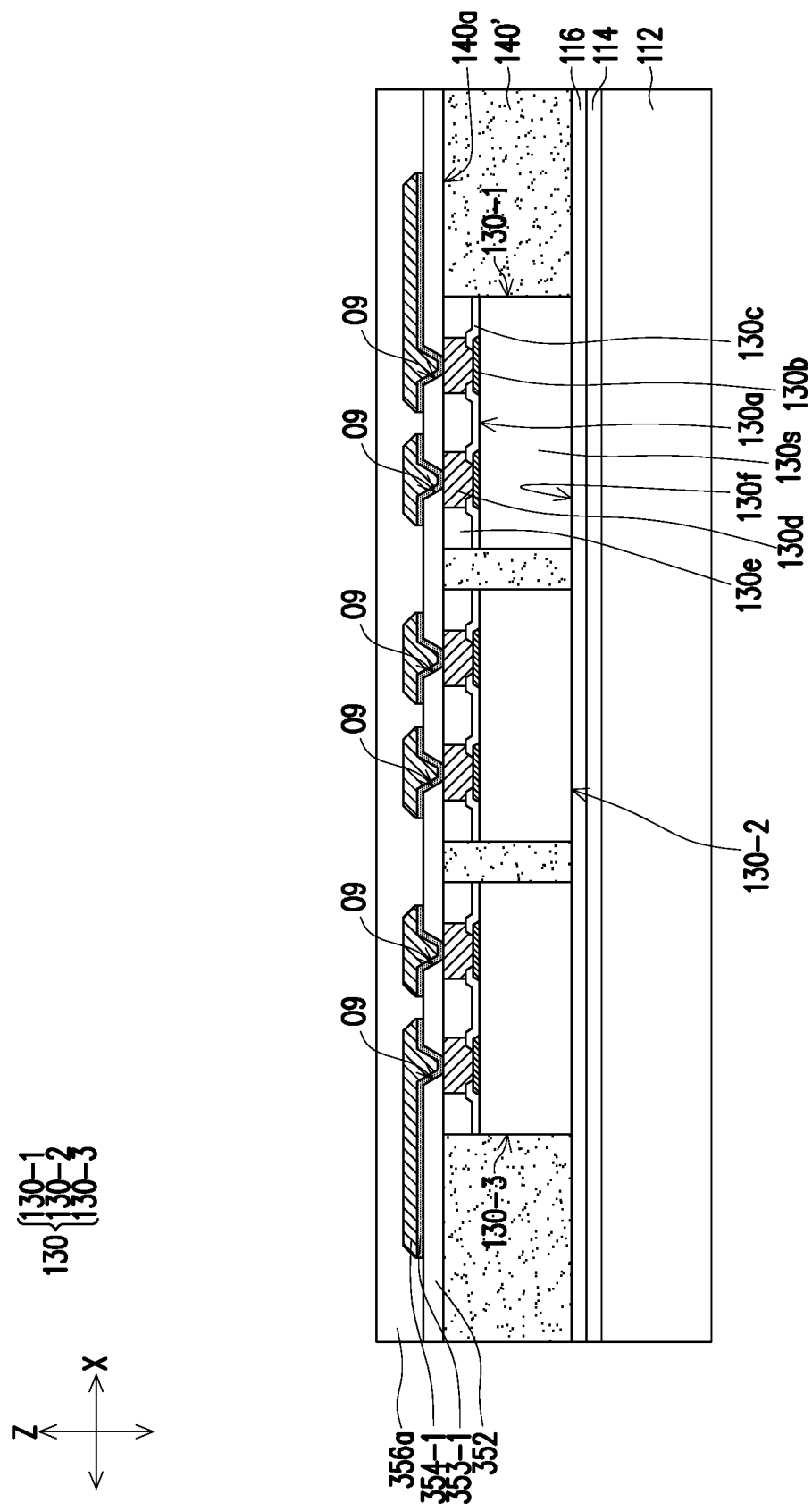
FIG. 36 to FIG. 42 are schematic cross sectional views of various stages in a manufacturing method of a package structure in accordance with some embodiments of the disclosure.

Referring to FIG. 36, in some embodiments, the dielectric layer 352 is formed on the semiconductor dies 130 and the insulating encapsulation 140', in accordance with step S41c of FIG. 43, following the process as described in FIG. 3. The formation and material of the dielectric layer 352 are the same or similar to the formation and material of the dielectric layer 152-1, and thus are not repeated herein. As shown in FIG. 36, for example, the conductive vias 130d of the semiconductor dies 130 are exposed by openings O9 formed in the dielectric layer 352. In other words, the conductive vias 130d of the semiconductor dies 130 are accessibly revealed by the openings O9 formed in the dielectric layer 352.

In some embodiments, the seed layer 353-1 is formed to be directly located on the dielectric layer 352, and the patterned conductive layer 354-1 is formed to be disposed on the seed layer 353-1, in accordance with step S42c of FIG. 43. The formations and materials of the seed layer 353-1 and the patterned conductive layer 354-1 are respectively the same or similar to the formations and materials of the seed layer 153-1 and the patterned conductive layer 154-1, and thus are not repeated herein. For example, as shown in FIG. 36, the seed layer 351-1 penetrates through the dielectric layer 352, where the seed layer 351-1 extends into the openings O9 to physically connect to the conductive vias 130d of the semiconductor dies 130 exposed by the openings O9. In some embodiments, sidewalls of the openings O9 are completely covered by the seed layer 353-1. In some embodiments, the patterned conductive layer 354-1 is located on (e.g. in physical contact with) the seed layer 353-1, where a projection area of the patterned conductive layer 354-1 is overlapped with a projection area of the seed layer 353-1, in the vertical projection on the insulating encapsulation 140' along the direction Z. For example, as shown in FIG. 36, the patterned conductive layer 354-1 is electrically connected to the conductive vias 130d of the semiconductor dies 130 through the seed layer 353-1.

Continued on FIG. 36, in some embodiments, the dielectric layer 356a is disposed on the patterned conductive layer 354-1, in accordance with step S43c of FIG. 43. For example, the dielectric layer 356a is coated on the seed layer 353-1, the patterned conductive layer 354-1, and the insulating encapsulation 140' exposed by the seed layer 353-1 and the patterned conductive layer 354-1. In other words, the seed layer 353-1 and the patterned conductive layer 354-1 are embedded in the dielectric layer 356a, where the insulating encapsulation 140' exposed by the seed layer 353-1 and the patterned conductive layer 354-1 is covered by the dielectric layer 356a. For example, the dielectric layer 356a is coated on the seed layer 353-1, the patterned conductive layer 354-1, and the insulating encapsulation 140' exposed by the seed layer 353-1 and the patterned conductive layer 354-1 by, but not limited to, forming a blanket layer of dielectric material mixture over the seed layer 353-1, the patterned conductive layer 354-1, and the insulating encapsulation 140' exposed by the seed layer 353-1 and the patterned conductive layer 354-1 to completely cover the seed layer 353-1, the patterned conductive layer 354-1, and the insulating encapsulation 140' exposed by the seed layer 353-1 and the patterned conductive layer 354-1. In some embodiments, the dielectric layer 356a may be formed by suitable fabrication techniques such as spin-on coating or the like.

In some embodiments, the dielectric material mixture includes a dielectric material and an additive. For example, the dielectric material may include polyimide, PBO, BCB, a nitride such as silicon nitride, an oxide such as silicon oxide, PSG, BSG, BPSG, acrylate resin, combinations thereof, or the like. For example, the additive may include small molecules with an average weight of the molecule weight less than 1000 g/mol (such as a silane-based small molecule) or oligomers with an average weight of the molecule weight about 1000 g/mol to about 10000 g/mol (such as a polyethylene glycol based oligomer, an acrylate-based oligomer, or the like). In some embodiments, based on a total amount of the dielectric material mixture, an amount of the dielectric material is about 95 wt % to about 99 wt % and an amount of the additive is about 1 wt % to about 5 wt %. In an alternative embodiment, a solvent may be optionally added into the dielectric material mixture for facilitating the mixing between the additive and the dielectric material, the aforesaid solvent refers to a solvent capable of allowing the additive and dielectric material evenly mixed therein, but does not react therewith. In some embodiments, the solvent may include n-methylpyrrolidone (NMP) or a nitrogen-containing solvent.

Figure 37:
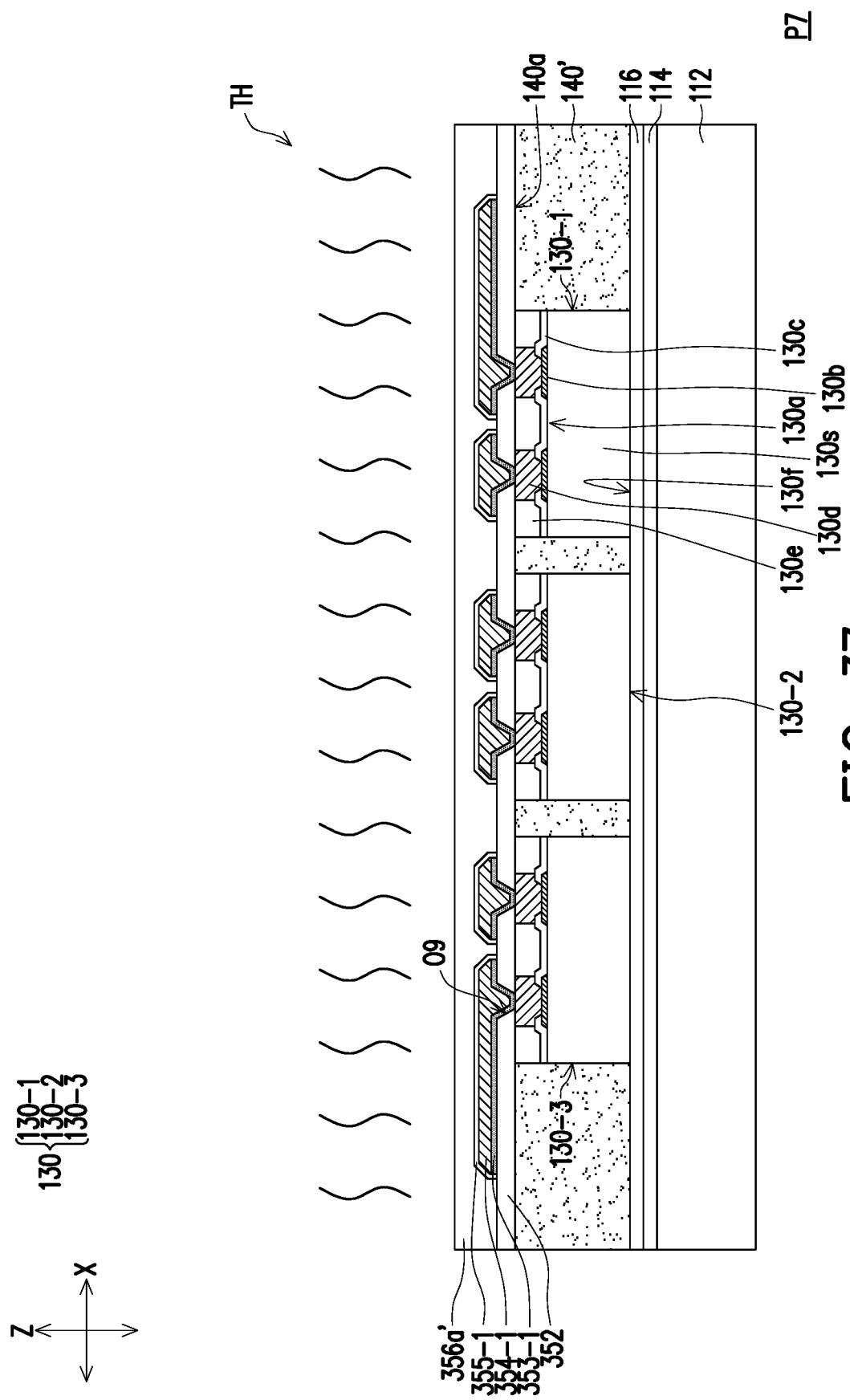

Referring to FIG. 37, in some embodiments, a thermal treatment TH is performed on the structure depicted on FIG. 36 to form an inter-layer film 355-1 on the patterned conductive layer 354-1, in accordance with step S44c of FIG. 43. For example, the thermal treatment TH is performed on the dielectric layer 356a to form a fully cured dielectric layer 356a' and the inter-layer film 355-1, where the inter-layer film 355-1 is located between the fully cured dielectric layer 356a' and the patterned conductive layer 354-1. In some embodiments, a thickness of the inter-layer film 355-1 is greater than or substantially equal to 5 nm and is less than or substantially equal to 250 nm. As shown in FIG. 37, for example, the inter-layer film 355-1 is directly located on the patterned conductive layer 354-1, where the dielectric layer 356a' is separated from the patterned conductive layer 354-1 through the inter-layer film 355-1.

In some embodiments, during the thermal treatment TH, the dielectric layer 356a is fully cured while the additive included in the dielectric layer 356a interacts with the copper (Cu) atoms of the patterned conductive layer 254-1 to form the inter-layer film 355-1, where additional oxygen (O) atoms (such as, coming from outer atmosphere) are also provided during the thermal treatment TH to further perform an oxidation treatment, such that the inter-layer film 355-1 is formed with a nanostructure of copper oxide with grain size of 200 nm or more. In some embodiments, the inter-layer film 355-1 includes a nanostructure layer of polycrystalline copper oxide ($Cu_2O$). In the disclosure, the inter-layer film 355-1 is electrically conductive, and the inter-layer film 355-1 is electrically connected to the patterned conductive layer 354-1. During performing the thermal treatment TH, based on the demand and design layout, the parameters (e.g. oxidation rate, crystal orientation, and layer density for the copper atoms) in the formation of the inter-layer film 355-1 is controllable by adjusting the addition (types and/or amount) of the additive included in the dielectric material mixture for forming the dielectric layer 356a. Due to the additive included in the dielectric material mixture, a curing temperature of the dielectric layer 356a is significantly decreased. In one embodiment, the thermal process TH is performed at a workable temperature of about 170° C. to about 320° C. and a workable pressure of about 50 torr to about 100 torr. For example, the addition oxygen atoms may be provided by, but not limited to, providing pure oxygen gas.

Figure 38:
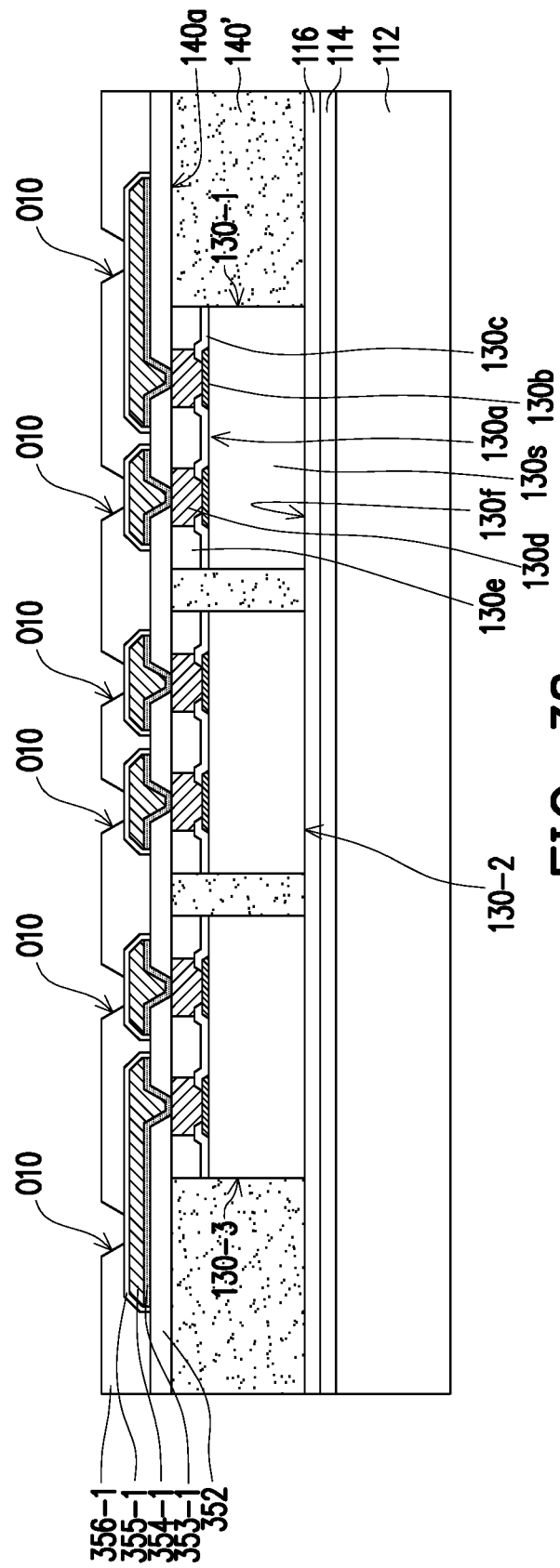

In some embodiments, the dielectric layer 356a' is patterned to form a dielectric layer 356-1 having a plurality of openings O10, where the openings O10 expose portions of the inter-layer film 355-1, as shown in FIG. 38. The number of the openings O10 is not limited to what is depicted in FIG. 38, and may be designated based on the demand and design layout.

Continued on FIG. 38, in some embodiments, the patterned conductive layer 354-1 is completely wrapped around by the seed layer 353-1 and the inter-layer film 355-1. In certain embodiments, the inter-layer film 355-1 is located between the patterned conductive layer 354-1 and the dielectric layer 356-1 and between the seed layer 353-1 and the dielectric layer 356-1, where the patterned conductive layer 354-1 and the seed layer 353-1 are independently separated from the dielectric layer 356-1 through the inter-layer film 355-1. As the inter-layer film 355-1 is sandwiched between the patterned conductive layer 354-1 and the dielectric layer 356-1 and between the seed layer 353-1 and the dielectric layer 356-1, the inter-layer film 355-1 with the grain size of 200 nm or more serves as a copper diffusion barrier between a conductive layer and a dielectric layer (e.g. the patterned conductive layer 354-1 and the dielectric layer 356-1, and the seed layer 353-1 and the dielectric layer 356-1), and thus the phenomenon of copper diffusion is greatly suppressed due to the copper atom diffusing rate from the conductive layer (e.g. a copper layer) to the dielectric layer is reduced by the inter-layer film 355-1. In detail, the number of grain boundaries in a given area is decreased as the grain sizes increase, such that the voids generated between the conductive layer and the dielectric layer (which are caused by the diffusion of copper atoms diffusing from the conductive layer to the dielectric layer along with the grain boundaries of the grains in the conductive layer) are significantly decreased. Therefore, owing to the presence of the inter-layer film 355-1, the adhesive strength between the patterned conductive layer 354-1 and the dielectric layer 356-1 and between the seed layer 353-1 and the dielectric layer 356-1 is enhanced, and the delamination between the patterned conductive layer 354-1 and the dielectric layer 356-1 and between the seed layer 353-1 and the dielectric layer 356-1 is suppressed. Due to the inter-layer film 355-1, the adhesive strength between the patterned conductive layer 354-1 and the dielectric layer 356-1 and between the seed layer 353-1 and the dielectric layer 356-1 is enhanced, and the delamination between the patterned conductive layer 354-1 and the dielectric layer 356-1 and between the seed layer 353-1 and the dielectric layer 356-1 is suppressed.

Figure 39:
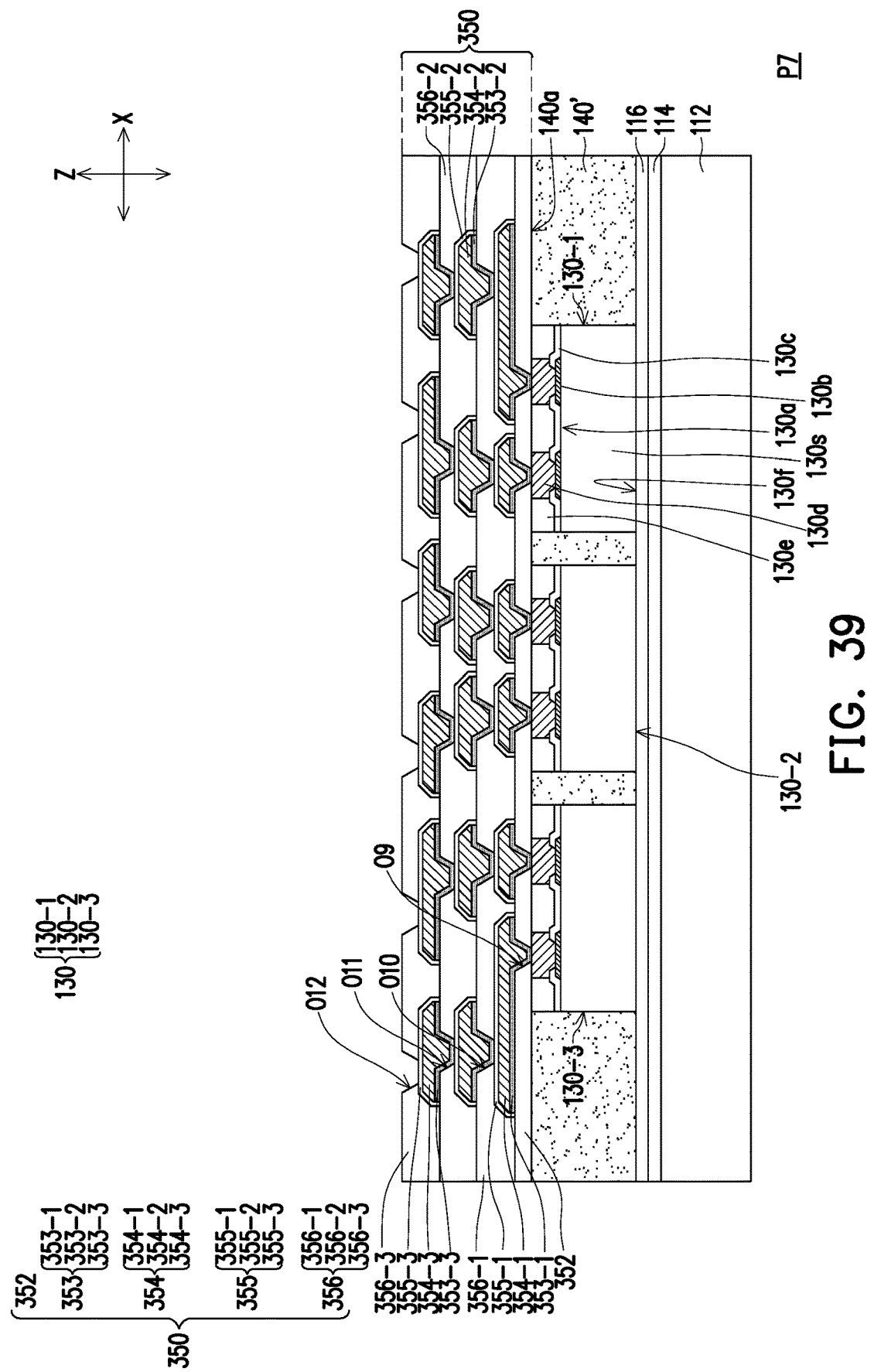

Referring to FIG. 39, in some embodiments, the seed layer 353-2, the patterned conductive layer 354-2, the inter-layer film 355-2, and the dielectric layer 356-2 are sequentially formed on the dielectric layer 356-1, and the seed layer 353-3, the patterned conductive layer 354-3, the inter-layer film 355-3, and the dielectric layer 356-3 are sequentially formed on the dielectric layer 356-2. The formations and materials of the seed layers 353-2, 353-3 are the same or similar to the formations and materials of the seed layer 353-1, the formations and materials of the patterned conductive layer 354-2, 354-3 are the same or similar to the formations and materials of the patterned conductive layer 354-1, the formations and materials of the inter-layer film 355-2, 355-3 are the same or similar to the formations and materials of the inter-layer film 355-1, and the formations and materials of the dielectric layer 356-2, 356-3 are the same or similar to the formations and materials of the dielectric layer 356-1, and thus are not repeated herein.

In some embodiments, the seed layer 353-2 is located on the dielectric layer 356-1 and extends into the openings O10 formed in the dielectric layer 356-1 to physically contact the portions of the inter-layer film 355-1 exposed by the openings O10. In other words, the seed layer 353-2 penetrates through the dielectric layer 356-1, and sidewalls of the openings O10 are completely covered by the seed layer 353-2. As shown in FIG. 39, for example, the seed layer 353-2 is electrically connected to the patterned conductive layer 354-1 through the inter-layer film 355-1. In some embodiments, the patterned conductive layer 354-2 is located on (e.g. in physical contact with) the seed layer 353-2, where a projection area of the patterned conductive layer 354-2 is overlapped with a projection area of the seed layer 353-2, in the vertical projection on the insulating encapsulation 140' along the direction Z. For example, as shown in FIG. 39, the patterned conductive layer 354-2 is electrically connected to the patterned conductive layer 354-1 through the seed layer 353-2 and the inter-layer film 355-1. In some embodiments, the inter-layer film 355-2 is located on (e.g. in physical contact with) the patterned conductive layer 354-2, where surfaces of the patterned conductive layer 354-2 not in contact with the seed layer 353-2 and sidewalls of the seed layer 353-2 are covered by the inter-layer film 355-2. As shown in FIG. 39, for example, the inter-layer film 355-2 is electrically connected to the patterned conductive layer 354-2 and the seed layer 353-2. In some embodiments, the dielectric layer 356-2 are located on the inter-layer film 355-2, where the inter-layer film 355-2 is sandwiched between the patterned conductive layer 354-2 and the dielectric layer 356-2 and is sandwiched between the seed layer 353-2 and the dielectric layer 356-2. Due to the inter-layer film 355-2, the adhesive strength between the patterned conductive layer 354-2 and the dielectric layer 356-2 and between the seed layer 353-2 and the dielectric layer 356-2 is enhanced, and the delamination between the patterned conductive layer 354-2 and the dielectric layer 356-2 and between the seed layer 353-2 and the dielectric layer 356-2 is suppressed. In some embodiments, as shown in FIG. 39, portions of the inter-layer film 355-2 are exposed by openings O11 formed in the dielectric layer 356-2 for electrically connecting to later-formed connectors.

In some embodiments, the seed layer 353-3 is located on the dielectric layer 356-2 and extends into the openings O11 formed in the dielectric layer 356-2 to physically contact the portions of the inter-layer film 355-2 exposed by the openings O11. In other words, the seed layer 353-3 penetrates through the dielectric layer 356-2, and sidewalls of the openings O11 are completely covered by the seed layer 353-3. As shown in FIG. 39, for example, the seed layer 353-3 is electrically connected to the patterned conductive layer 354-2 through the inter-layer film 355-2. In some embodiments, the patterned conductive layer 354-3 is located on (e.g. in physical contact with) the seed layer 353-3, where a projection area of the patterned conductive layer 354-3 is overlapped with a projection area of the seed layer 353-3, in the vertical projection on the insulating encapsulation 140' along the direction Z. For example, as shown in FIG. 39, the patterned conductive layer 354-3 is electrically connected to the patterned conductive layer 354-2 through the seed layer 353-3 and the inter-layer film 355-2. In some embodiments, the inter-layer film 355-3 is located on (e.g. in physical contact with) the patterned conductive layer 354-3, where surfaces of the patterned conductive layer 354-3 not in contact with the seed layer 353-3 and sidewalls of the seed layer 353-3 are covered by the inter-layer film 355-3. As shown in FIG. 39, for example, the inter-layer film 355-3 is electrically connected to the patterned conductive layer 354-2 and the seed layer 353-3. In some embodiments, the dielectric layer 356-3 are located on the inter-layer film 355-3, where the inter-layer film 355-3 is sandwiched between the patterned conductive layer 354-3 and the dielectric layer 356-3 and is sandwiched between the seed layer 353-3 and the dielectric layer 356-3. Due to the inter-layer film 355-3, the adhesive strength between the patterned conductive layer 354-3 and the dielectric layer 356-3 and between the seed layer 353-3 and the dielectric layer 356-3 is enhanced, and the delamination between the patterned conductive layer 354-3 and the dielectric layer 356-3 and between the seed layer 353-3 and the dielectric layer 356-3 is suppressed. In some embodiments, as shown in FIG. 39, portions of the inter-layer film 355-3 are exposed by openings O12 formed in the dielectric layer 356-3 for electrically connecting to later-formed connectors. Upon this, the redistribution circuit structure 350 of the package structure P7 is manufactured. As shown in FIG. 39, the semiconductor dies 130-1, 130-2, 130-3 are electrically communicated to each other through the redistribution circuit structure 350, for example.

In the disclosure, the seed layer 353-2, the patterned conductive layer 354-2, the inter-layer film 355-2, and the dielectric layer 356-2 formed in FIG. 39 and the seed layer 353-3, the patterned conductive layer 354-3, the inter-layer film 355-3, and the dielectric layer 356-3 formed in FIG. 39 may be respectively referred to as one layer of a fifth build-up layer of the redistribution circuit structure 350. The number of the fifth build-up layer included in the redistribution circuit structure 350 is not limited in the disclosure. In one embodiment, the number of the fifth build-up layer included in the redistribution circuit structure 350 may be zero. For example, the two fifth build-up layers formed in FIG. 39 may be both optionally omitted from the redistribution circuit structure 350. In an alternative embodiment, the number of the fifth build-up layer included in the redistribution circuit structure 350 may be one or more than one.

Referring to FIG. 40, in some embodiments, a plurality of seed-layer patterns 160 and a plurality of conductive elements 170 are sequentially formed over the redistribution circuit structure 350. Due to the seed-layer patterns 160, the adhesive strength between the conductive elements 170 and the dielectric layer 356-3 is enhanced. In some embodiments, the seed-layer patterns 160 are directly located on the portions of the inter-layer film 355-3 exposed by the openings O12 formed in the dielectric layer 356-3, and the seed-layer patterns 160 are electrically connected to the patterned conductive layer 354-3 through the inter-layer film 355-3.

In some embodiments, the seed-layer patterns 160 are electrically connected to the redistribution circuit structure 350, and the conductive elements 170 are electrically connected to the redistribution circuit structure 350 through the seed-layer patterns 160. As shown in FIG. 40, for example, some of the conductive elements 170 are electrically connected to the semiconductor dies 130 through the redistribution circuit structure 350 and respective ones of the seed-layer patterns 160. The formations and materials of the seed-layer patterns 160 and the conductive elements 170 have been described in the process of FIG. 13, and thus are not repeated herein.

Referring to FIG. 41, in some embodiments, the whole structure depicted in FIG. 40 along with the carrier 112 is flipped (turned upside down), where the conductive elements 170 are placed to a holding device HD, and the carrier 112 is then debonded from the buffer layer 116 due to the debond layer 114. During the debonding step, the holding device HD is used to secure the package structure P7 before debonding the carrier 112 and the debond layer 114.

Referring to FIG. 42, in some embodiments, the conductive elements 170 are released from the holding device HD to form the package structure P7. In some embodiments, prior to releasing the conductive elements 170 from the holding device HD, a dicing (singulation) process is performed to cut a plurality of the package structure P7 interconnected therebetween into individual and separated package structure P7. Up to here, the manufacture of the package structure P7 is completed.

In certain embodiments, the conductive elements 170 may include copper pillars, copper vias, or the like, see the package structure P7 depicted in FIG. 42. However, the disclosure is not limited thereto, in alternative embodiments, the conductive elements 170 may include solder balls or BGA balls while replacing the seed layer patterns 160 with the UBM patterns u1, see a package structure P8 depicted in FIG. 44. In other alternative embodiments, the conductive elements 170 may include solder balls or BGA balls while replacing the seed layer patterns 160 with the UBM patterns u1, and a plurality of conductive pillars CP may be further included with the presences of the conductive elements 190 and the UBM patterns u2, see a package structure P9 depicted in FIG. 45. However, the disclosure is not limited thereto, in alternative embodiments, the UBM patterns u2 may be omitted based on the design layout and demand.

Figure 44:
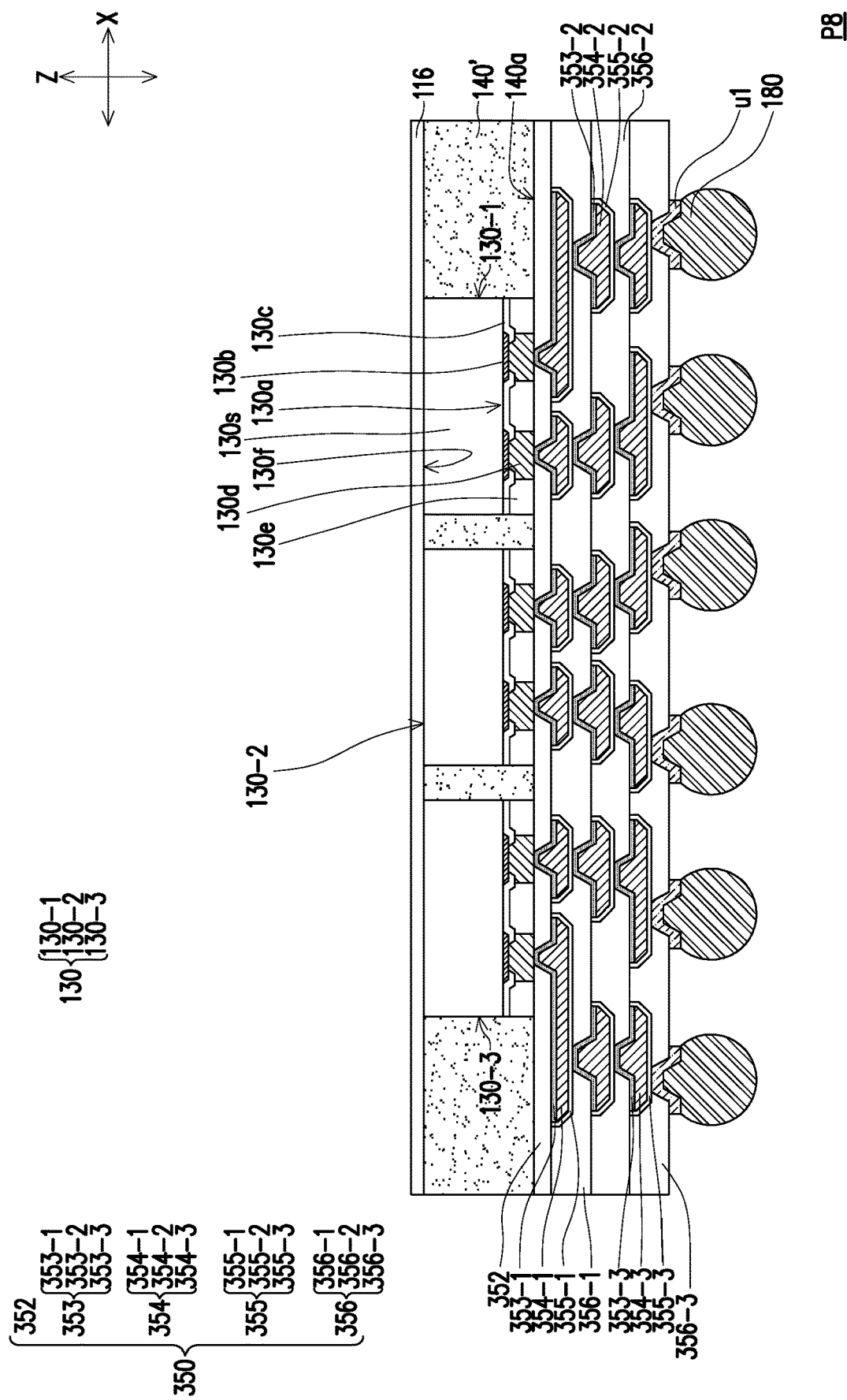
FIG. 44 is a schematic cross sectional view of a package structure in accordance with some exemplary embodiments of the present disclosure.
Figure 45:
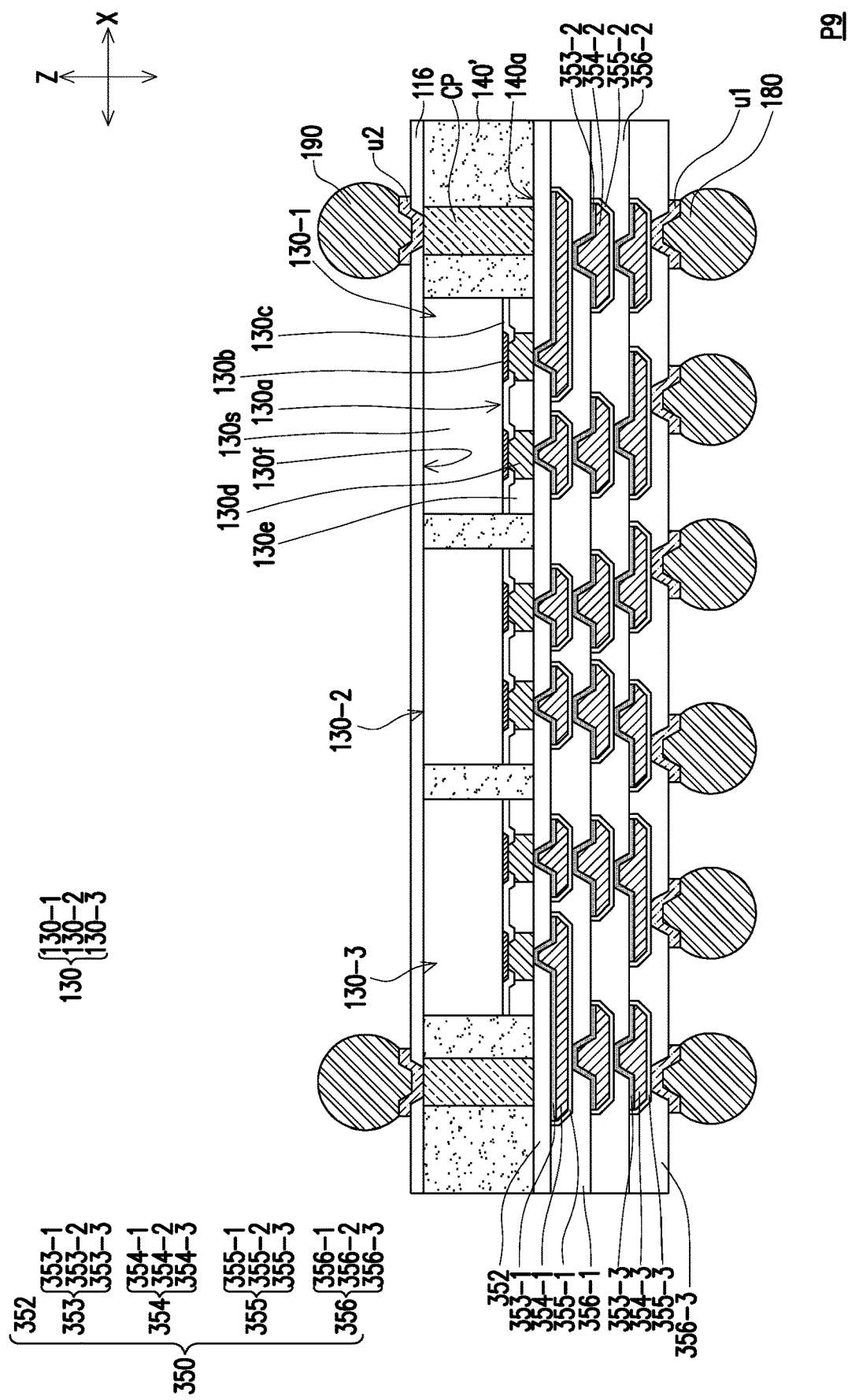
FIG. 45 is a schematic cross sectional view of a package structure in accordance with some exemplary embodiments of the present disclosure.

In further alternative embodiments, in addition to the conductive elements 170 in FIG. 42 and/or the conductive elements 180 in FIG. 44 to FIG. 45, an additional semiconductor element(s) (not shown) may be disposed on the redistribution circuit structure 350 through the seed layer patterns 160 and/or the UBM patterns u1, u2. The additional semiconductor element(s) may include a passive component or active component. The number of the additional semiconductor element(s) is not limited in the disclosure, and may be designated based on the demand and design layout.

Figure 46:
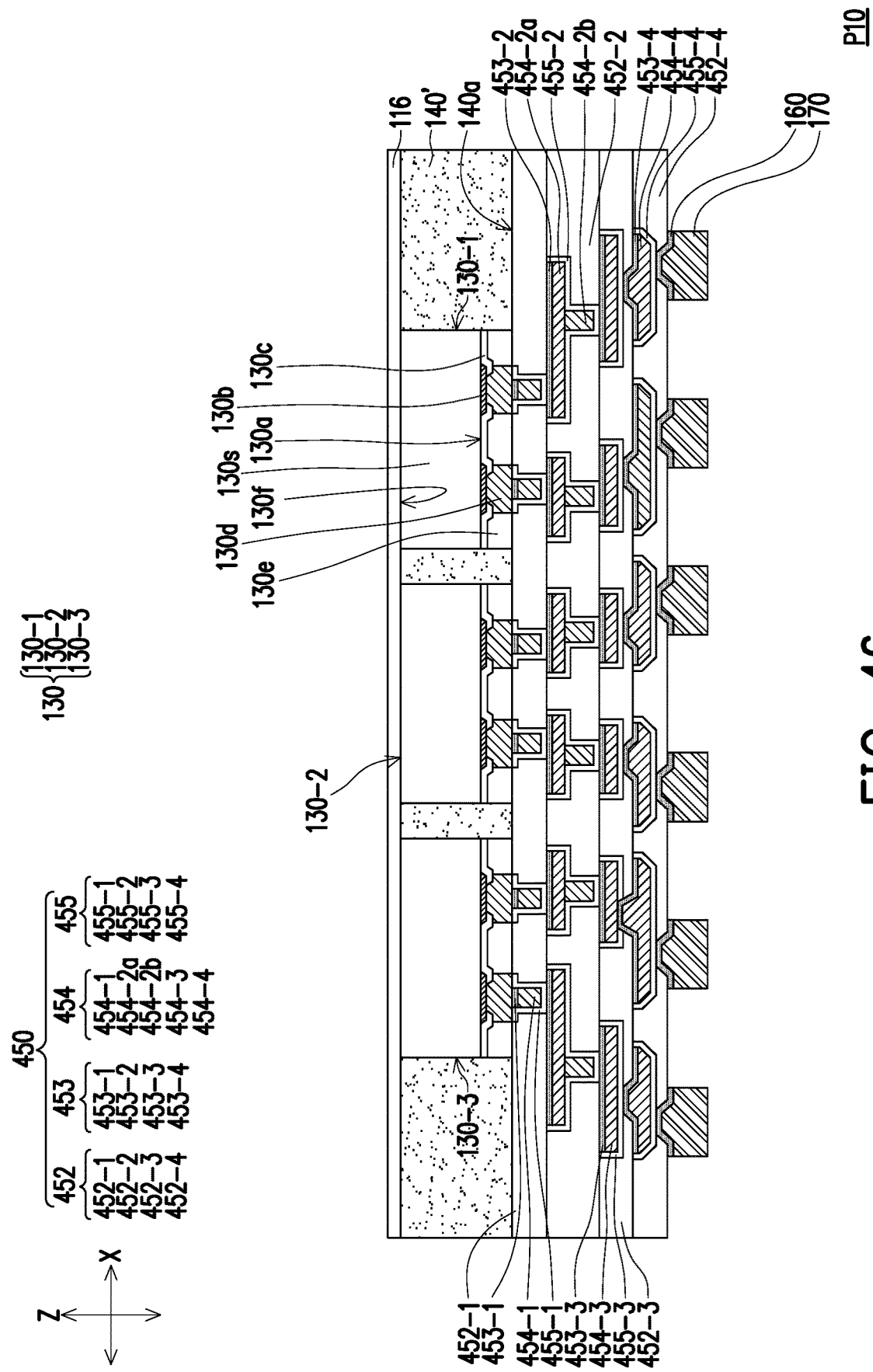
FIG. 46 is a schematic cross sectional view of a package structure in accordance with some exemplary embodiments of the present disclosure.
Figure 47:
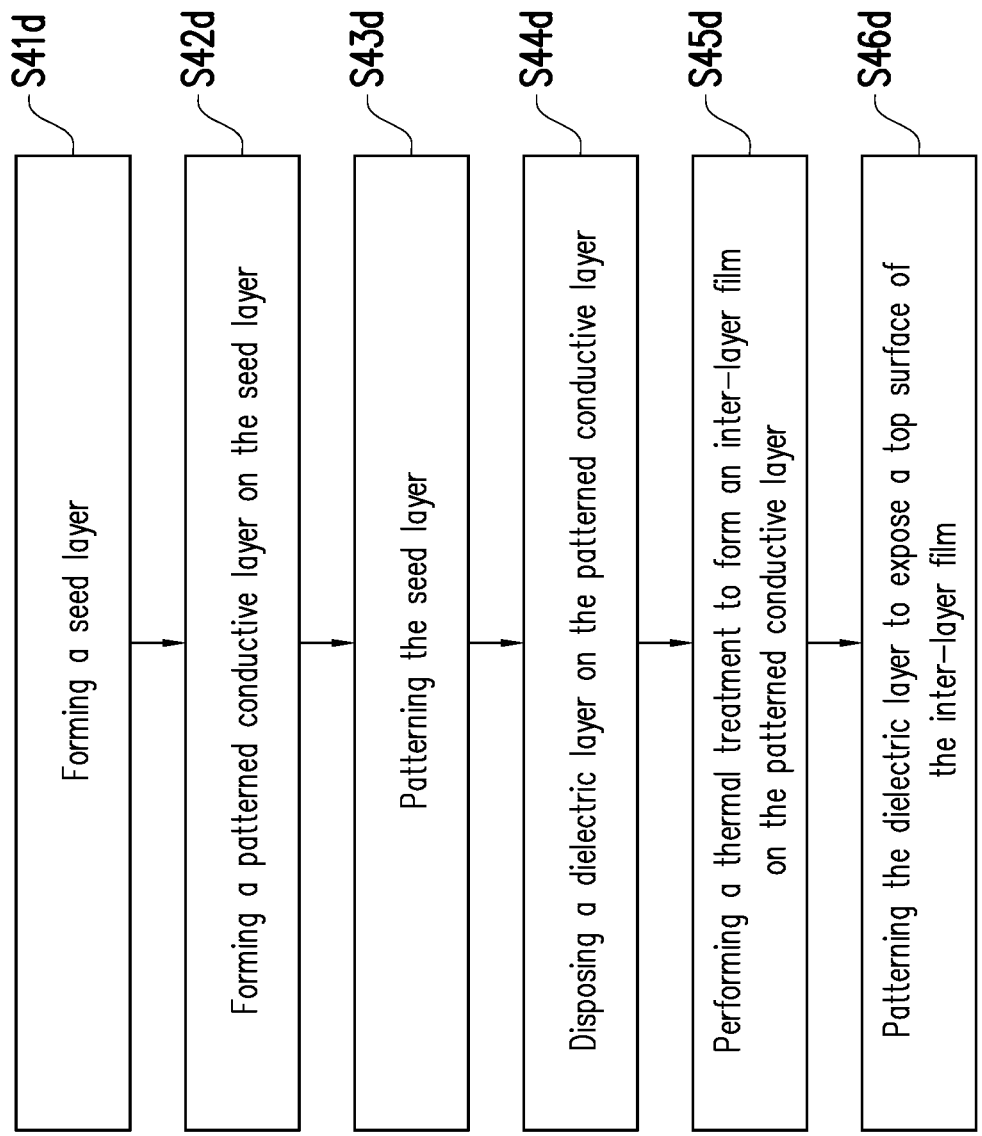
FIG. 47 is a flow chart illustrating a method of manufacturing a redistribution circuit structure/layer of a package structure in accordance with some embodiments of the disclosure.

FIG. 46 is a schematic cross sectional view of a package structure according to some exemplary embodiments of the present disclosure. FIG. 47 is a flow chart illustrating a method of manufacturing a redistribution circuit structure/ layer of a package structure in accordance with some embodiments of the disclosure. The elements similar to or substantially the same as the elements described previously will use the same reference numbers, and certain details or descriptions of the same elements would not be repeated herein. Referring to FIG. 15 and FIG. 46, a package structure P10 depicted in FIG. 46 is similar to the package structure P1 depicted in FIG. 15; the difference is that, in the package structure P10, the redistribution circuit structure 150 is replaced by a redistribution circuit structure 450.

In some embodiments, the redistribution circuit structure 450 is formed and disposed on the semiconductor dies 130 and the insulating encapsulation 140' with the steps (processes) described in FIG. 47. In some embodiments, as shown in FIG. 46, the redistribution circuit structure 450 includes a dielectric layer 452 (e.g. a dielectric layer 452-1, a dielectric layer 452-2, a dielectric layer 452-3, and a dielectric layer 452-4), a seed layer 453 (e.g. a seed layer 453-1, a seed layer 453-2, a seed layer 453-3, and a seed layer 453-4), a patterned conductive layer 454 (e.g. a patterned conductive layer 454-1, a patterned conductive layer 454-2a, a patterned conductive layer 454-2b, a patterned conductive layer 454-3, and a patterned conductive layer 454-4), and an inter-layer film 455 (e.g. an inter-layer film 455-1, an inter-layer film 455-2, and an inter-layer film 455-3, and an inter-layer film 455-4). However, in the disclosure, the numbers of layers of the dielectric layer 452, the seed layer 453, the patterned conductive layer 454, and the inter-layer film 455 are not limited to what is depicted in FIG. 46, where the numbers of the layers of the dielectric layer 452, the seed layer 453, the patterned conductive layer 454, and the inter-layer film 455 may be one or more than one. In some embodiments, the dielectric layer 452, the seed layer 453, the patterned conductive layer 454 and the inter-layer film 455 are formed on the insulating encapsulation 140' and are sequentially stacked. In the disclosure, the inter-layer films 455-1 to 455-4 independently are formed with a nanostructure of copper oxide with grain size of 200 nm or more. In some embodiments, the inter-layer films 455-1 to 455-4 include a nanostructure layer of polycrystalline copper oxide ($Cu_2O$). In the disclosure, the inter-layer film 355-1 is electrically conductive.

As shown in FIG. 46, in some embodiments, the patterned conductive layer 454-1 is completely wrapped (covered) around by the seed layer 453-1 and the inter-layer film 455-1. For example, the inter-layer film 455-1 is located between the patterned conductive layer 454-1 and the dielectric layer 456-1 and between the seed layer 453-1 and the dielectric layer 456-1, where the patterned conductive layer 454-1 and the seed layer 453-1 are independently and physically separated from the dielectric layer 456-1 through the inter-layer film 455-1. Due to the inter-layer film 455-1, the adhesive strength between the patterned conductive layer 454-1 and the dielectric layer 456-1 and between the seed layer 453-1 and the dielectric layer 456-1 is enhanced, and the delamination between the patterned conductive layer 454-1 and the dielectric layer 456-1 and between the seed layer 453-1 and the dielectric layer 456-1 is suppressed. As shown in FIG. 46, the conductive layer 454-1 is electrically connected to the conductive vias 130d through the seed layer 453-1, and is electrically connected to the inter-layer film 455-1 by direct contact.

In some embodiments, the patterned conductive layer 454-2a and the patterned conductive layer 454-2b disposed thereon are completely wrapped (covered) around by the seed layer 453-2 and the inter-layer film 455-2. For example, the inter-layer film 455-2 is located between the patterned conductive layers 454-2a, 454-2b and the dielectric layer

456-2 and between the seed layer 453-2 and the dielectric layer 456-2, where the patterned conductive layers 454-2a, 454-2b and the seed layer 453-2 are independently and physically separated from the dielectric layer 456-2 through the inter-layer film 455-2. Due to the inter-layer film 455-2, the adhesive strength between the patterned conductive layers 454-2a, 4542b and the dielectric layer 456-2 and between the seed layer 453-2 and the dielectric layer 456-2 is enhanced, and the delamination between the patterned conductive layers 454-2a, 454-2b and the dielectric layer 456-2 and between the seed layer 453-2 and the dielectric layer 456-2 is suppressed. As shown in FIG. 46, the patterned conductive layer 454-2a is electrically connected to the patterned conductive layer 454-1 through the seed layer 453-2 and the inter-layer film 455-1, and is electrically connected to the inter-layer film 455-2 by direct contact while the patterned conductive layer 454-2b is electrically connected to the patterned conductive layer 454-2a and the inter-layer film 455-2 by direct contact.

In some embodiments, the patterned conductive layer 454-3 is completely wrapped (covered) around by the seed layer 453-3 and the inter-layer film 455-3. For example, the inter-layer film 455-3 is located between the patterned conductive layer 454-3 and the dielectric layer 456-3 and between the seed layer 453-3 and the dielectric layer 456-3, where the patterned conductive layer 454-3 and the seed layer 453-3 are independently and physically separated from the dielectric layer 456-3 through the inter-layer film 455-3. Due to the inter-layer film 455-3, the adhesive strength between the patterned conductive layer 454-3 and the dielectric layer 456-3 and between the seed layer 453-3 and the dielectric layer 456-3 is enhanced, and the delamination between the patterned conductive layer 454-3 and the dielectric layer 456-3 and between the seed layer 453-3 and the dielectric layer 456-3 is suppressed. As shown in FIG. 46, the conductive layer 454-3 is electrically connected to the conductive layer 454-2a through the seed layer 453-3 and the inter-layer film 455-2.

In some embodiments, the patterned conductive layer 454-4 is completely wrapped (covered) around by the seed layer 453-4 and the inter-layer film 455-4. For example, the inter-layer film 455-1 is located between the patterned conductive layer 454-1 and the dielectric layer 456-1 and between the seed layer 453-1 and the dielectric layer 456-1, where the patterned conductive layer 454-1 and the seed layer 453-1 are independently and physically separated from the dielectric layer 456-1 through the inter-layer film 455-1. Due to the inter-layer film 455-1, the adhesive strength between the patterned conductive layer 454-1 and the dielectric layer 456-1 and between the seed layer 453-1 and the dielectric layer 456-1 is enhanced, and the delamination between the patterned conductive layer 454-1 and the dielectric layer 456-1 and between the seed layer 453-1 and the dielectric layer 456-1 is suppressed. As shown in FIG. 46, the conductive layer 454-4 is electrically connected to the conductive layer 454-3 through the seed layer 453-4 and the inter-layer film 455-3.

For example, the formation of the redistribution circuit structure 450 may be performed by the processing steps S41d to S46d of FIG. 47 described below for illustrate purpose. The disclosure is not limited thereto.

In certain embodiments, a seed layer (not shown) is formed on the semiconductor dies 130 and the insulating encapsulation 140', in accordance with step S41d of FIG. 47, following the process as described in FIG. 3. For example, the formation and materials of the seed layer are similar to or substantially the same as the formation and materials of the seed layer SL1 depicted in FIG. 21, and thus are not repeated herein. In certain embodiments, the patterned conductive layer 454-1 is formed on the seed layer, in accordance with step S42d of FIG. 47. For example, the formation and materials of the patterned conductive layer 454-1 is similar to or substantially the same as the formation and materials of the patterned conductive layer 254-1 depicted in FIG. 22, and thus are not repeated herein. In certain embodiments, the seed layer is patterned to form the seed layer 453-1 with using the patterning conductive layer 454-1 as an etching mask, in accordance with step S43d of FIG. 47. For example, the formation and materials of the seed layer 453-1 is similar to or substantially the same as the formation and materials of the seed layer 253-1 depicted in FIG. 23, and thus are not repeated herein. In certain embodiments, the dielectric layer (not shown) is disposed on the patterned conductive layer 454-1, in accordance with step S44d of FIG. 47. For example, the formation and materials of the dielectric layer is similar to or substantially the same as the formation and materials of the dielectric layer 356a depicted in FIG. 36, and thus are not repeated herein. In certain embodiments, a thermal treatment is then performed to form an inter-layer film 455-1 on the patterned conductive layer 454-1, in accordance with step S45d of FIG. 47. For example, the process of the thermal treatment is similar to or substantially the same as the process of the thermal treatment described in FIG. 37, and thus are not repeated herein. In certain embodiments, a patterning step is performed on the dielectric layer to form a dielectric layer 452-1 and expose the inter-layer film 455-1, in accordance with step S46d of FIG. 47. For example, the process of the patterning step is similar to or substantially the same as the process of the planarizing step described in FIG. 26, and thus are not repeated herein.

In addition, the formation and materials of the dielectric layers 452-2 to 452-4, the seed layers 453-2 to 453-4, the patterned conductive layers 454-2a, 454-2b, 454-3, 454-4, and the inter-layer films 455-2 to 455-4 are similar to or substantially the same as the dielectric layer 452-1, the seed layer 453-1, the patterned conductive layer 454-1, and the inter-layer film 455-1 described in FIG. 47 or the seed layer 353-1, the patterned conductive layer 354-1, the inter-layer film 355-1, and the dielectric layer 356-1 described in FIG. 36 to FIG. 38, and thus are not repeated herein for simplicity. In the disclosure, in the redistribution circuit structure 450, the layers (e.g. the seed layer 453-1, the patterned conductive layer 454-1, the inter-layer film 455-1, and the dielectric layer 452-1) may be referred to as one layer of a sixth build-up layer, the layers (e.g. the seed layer 453-2, the patterned conductive layers 454-2a, 454-2b, the inter-layer film 455-2, and the dielectric layer 452-2) may be referred to as one layer of a seventh build-up layer, the layers (e.g. the seed layer 453-3, the patterned conductive layer 454-3, the inter-layer film 455-3, and the dielectric layer 452-3) may be referred to as one layer of a eighth build-up layer, and the layers (e.g. the seed layer 453-4, the patterned conductive layer 454-4, the inter-layer film 455-4, and the dielectric layer 452-4) may be referred to as one layer of the fifth build-up layer. For illustration purpose, there are four build-up layers (e.g. one layer of each of the fifth, sixth, seventh, and eight build-up layers) included in the redistribution circuit structure 450 of FIG. 46; however, the disclosure is not limited thereto. The numbers of the fifth, sixth, seventh, and eight build-up layers included in the redistribution circuit structure 450 is not limited in the disclosure. For example, the number of the fifth, sixth, and seventh build-up layers included in the redistribution circuit structure 450 may be one or more than one, while the number of the eighth build-up layer included in the redistribution circuit structure 450 may be zero, one or more than one.

Continued on FIG. 46, a plurality of seed-layer patterns 160 and a plurality of conductive elements 170 are sequentially formed over the redistribution circuit structure 450, and then the carrier 112 is then debonded from the buffer layer 116 due to the debond layer 114. The formation and materials of the seed-layer patterns 160 and the conductive elements 170 have been described in the process of FIG. 13, and thus are not repeated herein. In some embodiments, the conductive elements 170 are electrically connected to the redistribution circuit structures 450 through the see-layer patterns 160. In some embodiments, some of the conductive elements 170 are electrically connected to the semiconductor dies 130 through the redistribution circuit structure 450 and respective ones of the seed-layer patterns 160. During the debonding step, the holding device HD is used to secure the package structure P10 before debonding the carrier 112 and the debond layer 114. In some embodiments, the conductive elements 170 are released from the holding device HD to form the package structure P10. In some embodiments, prior to releasing the conductive elements 170 from the holding device HD, a dicing (singulation) process is performed to cut a plurality of the package structure P10 interconnected therebetween into individual and separated package structure P10. Up to here, the manufacture of the package structure P10 is completed.

In certain embodiments, the conductive elements 170 may include copper pillars, copper vias, or the like, see the package structure P10 depicted in FIG. 46. However, the disclosure is not limited thereto, in alternative embodiments, the conductive elements 170 may include solder balls or BGA balls while replacing the seed layer patterns 160 with the UBM patterns u1, see a package structure P11 depicted in FIG. 48. In other alternative embodiments, the conductive elements 170 may include solder balls or BGA balls while replacing the seed layer patterns 160 with the UBM patterns u1, and a plurality of conductive pillars CP may be further included with the presences of the conductive elements 190 and the UBM patterns u2, see a package structure P12 depicted in FIG. 49. However, the disclosure is not limited thereto, in alternative embodiments, the UBM patterns u2 may be omitted based on the design layout and demand.

Figure 48:
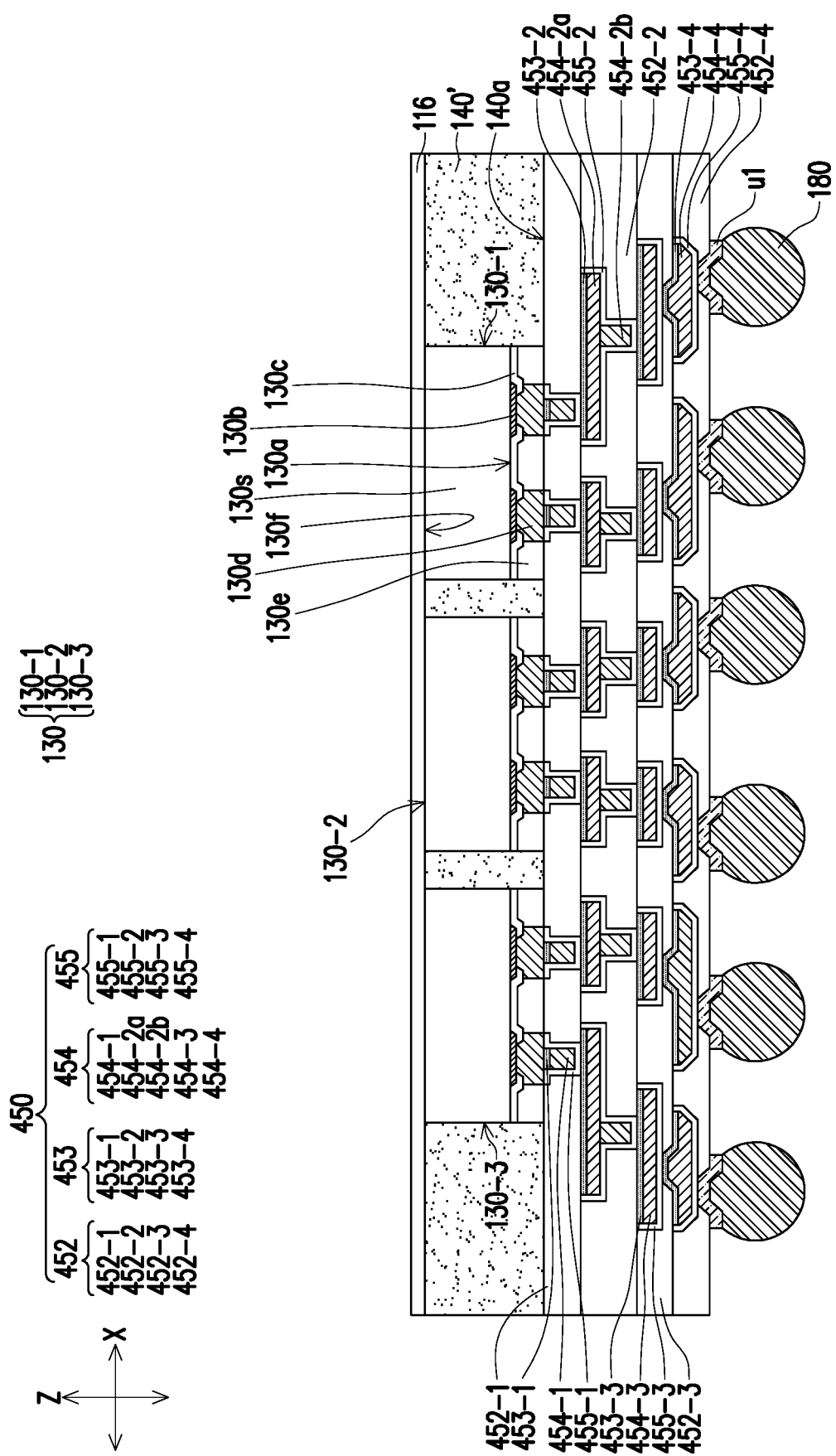
FIG. 48 is a schematic cross sectional view of a package structure in accordance with some exemplary embodiments of the present disclosure.
Figure 49:
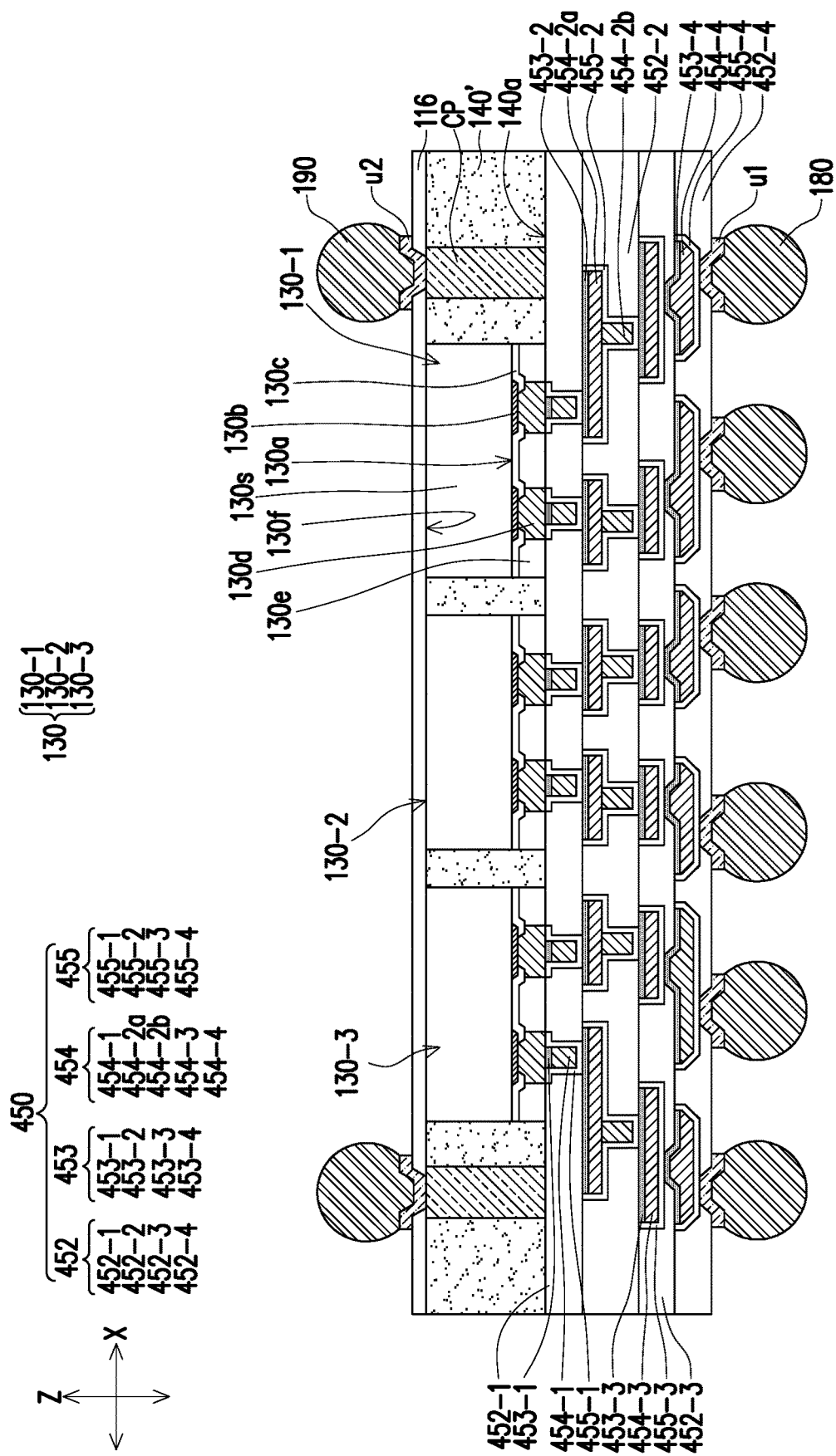
FIG. 49 is a schematic cross sectional view of a package structure in accordance with some exemplary embodiments of the present disclosure.

In further alternative embodiments, in addition to the conductive elements 170 in FIG. 46 and/or the conductive elements 180 in FIG. 48 to FIG. 49, an additional semiconductor element(s) (not shown) may be disposed on the redistribution circuit structure 450 through the seed layer patterns 160 and/or the UBM patterns u1, u2. The additional semiconductor element(s) may include a passive component or active component. The number of the additional semiconductor element(s) is not limited in the disclosure, and may be designated based on the demand and design layout.

As shown in the package structure P7 to the package structure P12, in the redistribution circuit structure 350/450, due to the inter-layer film (e.g. 355-1/355-2/355-3, 455-1/455-2/455-3/455-4) is located between the dielectric layer (e.g. 356-1/356-2/356-3, 452-1/452-2/452-3/452-4) and the patterned conductive layer (e.g. 354-1/354-2/354-3, 454-1/454-2a/454-2b/454-3/454-4), the dielectric layer (e.g. 356-1/356-2/356-3, 452-1/452-2/452-3/452-4) is separated from the patterned conductive layer (e.g. 354-1/354-2/354-3, 454-1/454-2a/454-2b/454-3/454-4) through the inter-layer film (e.g. 355-1/355-2/355-3, 455-1/455-2/455-3/455-4), and thus the voids generated therebetween is greatly reduced, thereby suppressing the delamination phenomenon. In the disclosure, a thickness of each of the inter-layer films 355-1/355-2/355-3, 455-1/455-2/455-3/455-4 is greater than or substantially equal to 5 nm and is less than or substantially equal to 250 nm. Owing to such configuration, the adhesion strength between one of said patterned conductive layers and a respective one dielectric layer thereof is enhanced, and thus better yield and reliability of the package structure P7 to the package structure P12 is achieved. In addition, due to the formation of said inter-layer films (e.g. the addition of the additive), the temperature of forming the redistribution circuit structure 350 (e.g. the curing temperature of said dielectric layers) is decreased.

In some embodiments, the package structures P1-P12 may be further mounted with an additional package, chips/dies, other electronic devices, or a suitable substrate (e.g. an organic substrate) to form a stacked package structure, the disclosure is not limited thereto.

In accordance with some embodiments, a package structure includes a semiconductor die and a redistribution circuit structure. The redistribution circuit structure is disposed on and electrically connected to the semiconductor die and includes a patterned conductive layer, a dielectric layer, and an inter-layer film. The dielectric layer is disposed on the patterned conductive layer. The inter-layer film is sandwiched between the dielectric layer and the patterned conductive layer, and the patterned conductive layer is separated from the dielectric layer through the inter-layer film.

In accordance with some embodiments, a method of manufacturing package structure includes the following steps, providing a semiconductor die having conductive terminals; forming a redistribution circuit structure on the semiconductor die, wherein the redistribution circuit structure is electrically connected to the semiconductor die, and forming the redistribution circuit structure comprises: depositing a first dielectric layer on the semiconductor die, the first dielectric layer exposing portions of the conductive terminals, forming a patterned conductive layer on the first dielectric layer and connecting the patterned conductive layer to the portions of the conductive terminals exposed by the first dielectric layer, forming a first inter-layer film on the patterned conductive layer, and the first inter-layer film conformally covering the patterned conductive layer, and depositing a second dielectric layer on the first inter-layer film, wherein the patterned conductive layer is separated from the second dielectric layer through the first inter-layer film; and forming conductive elements on the redistribution circuit structure to electrically connect the conductive elements to the redistribution circuit structure.

In accordance with some embodiments, a method of manufacturing package structure includes the following steps, providing a semiconductor die; encapsulating the semiconductor die in an insulating encapsulation; forming a redistribution circuit structure on the insulating encapsulation, wherein the redistribution circuit structure is electrically connected to the semiconductor die, and forming the redistribution circuit structure comprises: forming a patterned conductive layer on the semiconductor die, the patterned conductive layer electrically connecting the semiconductor die, and depositing a dielectric layer on the patterned conductive layer and forming a nanostructure conductive layer between the dielectric layer and the patterned conductive layer; and forming conductive elements on the redistribution circuit structure to electrically connect the redistribution circuit structure and the conductive elements.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a semiconductor die; and
a redistribution circuit structure, disposed on and electrically connected to the semiconductor die, and comprising:
a patterned conductive layer;
a dielectric layer, disposed on the patterned conductive layer; and
an inter-layer film, sandwiched between the dielectric layer and the patterned conductive layer, wherein the inter-layer film comprises a nanostructure layer of poly-crystalline copper oxide, and the patterned conductive layer is separated from the dielectric layer through the inter-layer film.

2. The package structure of claim 1, further comprising:
a seed layer, wherein the patterned conductive layer is disposed on the seed layer, and the patterned conductive layer is wrapped by the seed layer and the inter-layer film.

3. The package structure of claim 2, wherein the patterned conductive layer is enclosed by the seed layer and the inter-layer film.

4. The package structure of claim 1, wherein a first surface of the inter-layer film is in physical contact with the patterned conductive layer, a second surface of the inter-layer film is in physical contact with the dielectric layer, and the first surface is opposite to the second surface.

5. The package structure of claim 1, wherein a thickness of the nanostructure layer is greater than or substantially equal to 5 nm and is less than or substantially equal to 250 nm.

6. The package structure of claim 1, further comprising:
an insulating encapsulation, encapsulating the semiconductor die, wherein a surface of the insulating encapsulation is substantially coplanar to a surface of the semiconductor die, and the redistribution circuit structure is disposed on the surface of the insulating encapsulation substantially coplanar to the surface of the semiconductor die; and
conductive elements, located on and electrically connected to the redistribution circuit structure, wherein the redistribution circuit structure is located between the insulating encapsulation and the conductive elements.

7. The package structure of claim 1, further comprising:
through vias, arranged aside of the semiconductor die and electrically connected to the redistribution circuit structure, wherein the through vias are electrically connected to the semiconductor die through the redistribution circuit structure;
an insulating encapsulation, encapsulating the semiconductor die and the through vias, wherein a surface of the insulating encapsulation is substantially coplanar to a surface of the semiconductor die and surfaces of the through vias, and the redistribution circuit structure is disposed on the surface of the insulating encapsulation substantially coplanar to the surface of the semiconductor die and the surfaces of the through via; and
conductive elements, located on and electrically connected to the redistribution circuit structure, wherein the redistribution circuit structure is located between the insulating encapsulation and the conductive elements.

8. The package structure of claim 1, further comprising:
one or more than one semiconductor device, disposed on and electrically connected to the redistribution circuit structure, wherein the one or more than one semiconductor device is electrically communicated to the semiconductor die through the redistribution circuit structure.

9. The package structure of claim 1, wherein the inter-layer film is electrically conductive.

10. The package structure of claim 1, wherein the inter-layer film is electrically connected to the patterned conductive layer.

11. A method of manufacturing a package structure, comprising:
providing a semiconductor die having conductive terminals;
forming a redistribution circuit structure on the semiconductor die, wherein the redistribution circuit structure is electrically connected to the semiconductor die, and forming the redistribution circuit structure comprises:
depositing a first dielectric layer on the semiconductor die, the first dielectric layer exposing portions of the conductive terminals;
forming a patterned conductive layer on the first dielectric layer and electrically connecting the patterned conductive layer to the portions of the conductive terminals exposed by the first dielectric layer;
forming a inter-layer film on the patterned conductive layer, the inter-layer film comprising a nanostructure layer of poly-crystalline copper oxide, and the inter-layer film conformally covering the patterned conductive layer; and
depositing a second dielectric layer on the inter-layer film, wherein the patterned conductive layer is separated from the second dielectric layer through the inter-layer film; and
forming conductive elements on the redistribution circuit structure to electrically connect the conductive elements to the redistribution circuit structure.

12. The method of claim 11, prior to forming the redistribution circuit structure, further comprising:
encapsulating the semiconductor die in an insulating encapsulation.

13. The method of claim 12, prior to encapsulating the semiconductor die, further comprising:
forming through vias arranged aside of the semiconductor die, wherein the through vias are electrically connected to the semiconductor die through the redistribution circuit structure,
wherein encapsulating the semiconductor die further comprises encapsulating the through vias in the insulating encapsulation.

14. The method of claim 11, after forming the redistribution circuit structure, further comprising:
disposing one or more than one semiconductor device on and electrically connected to the redistribution circuit structure.

15. The method of claim 11, wherein forming the redistribution circuit structure further comprises:

forming a seed layer on the semiconductor die prior to forming the patterned conductive layer, the patterned conductive layer completely wrapped by the seed layer and the inter-layer film, wherein the patterned conductive layer is formed on the seed layer and is electrically connected to the semiconductor die through the seed layer.

16. A method of manufacturing a package structure, comprising:

providing a semiconductor die;

encapsulating the semiconductor die in an insulating encapsulation;

forming a redistribution circuit structure on the insulating encapsulation, wherein the redistribution circuit structure is electrically connected to the semiconductor die, and forming the redistribution circuit structure comprises:

forming a patterned conductive layer on the semiconductor die, the patterned conductive layer electrically connecting the semiconductor die; and depositing a dielectric layer on the patterned conductive layer and forming a nanostructure layer of poly-crystalline copper oxide between the dielectric layer and the patterned conductive layer; and forming conductive elements on the redistribution circuit structure to electrically connect the redistribution circuit structure and the conductive elements.

17. The method of claim 16, wherein depositing the dielectric layer on the patterned conductive layer comprises mixing a dielectric material and an additive comprising small molecules or oligomers to form a dielectric material mixture and coating the dielectric material mixture on the patterned conductive layer to form the dielectric layer, and forming the nanostructure layer of poly-crystalline copper oxide between the dielectric layer and the patterned conductive layer comprises subjecting the dielectric layer and the patterned conductive layer through a thermal treatment to form the nanostructure layer of poly-crystalline copper oxide between the dielectric layer and the patterned conductive-layer, wherein the additive comprised in the dielectric layer interacts with the patterned conductive layer in the thermal treatment to form the nanostructure layer of poly-crystalline copper oxide.

18. The method of claim 16, prior to encapsulating the semiconductor die, further comprising:

forming through vias arranged aside of the semiconductor die, wherein the through vias are electrically connected to the semiconductor die through the redistribution circuit structure, wherein encapsulating the semiconductor die further comprises encapsulating the through vias in the insulating encapsulation.

19. The method of claim 16, after forming the redistribution circuit structure, further comprising:

disposing one or more than one semiconductor device on and electrically connected to the redistribution circuit structure.

20. The method of claim 16, wherein forming the redistribution circuit structure further comprises:

forming a seed layer on the semiconductor die prior to forming the patterned conductive layer, the patterned conductive layer completely wrapped by the seed layer and the nanostructure layer of poly-crystalline copper oxide, wherein the patterned conductive layer is formed on the seed layer and is electrically connected to the semiconductor die through the seed layer.

* * * * *